(12) United States Patent
Tsukamoto et al.

(10) Patent No.: US 8,415,756 B2
(45) Date of Patent: Apr. 9, 2013

(54) SEMICONDUCTOR DEVICE AND METHOD OF MANUFACTURING THE SAME

(75) Inventors: Keisuke Tsukamoto, Kanagawa (JP); Shinya Hirano, Kanagawa (JP); Yuichiro Fujiyama, Kanagawa (JP); Tatsunori Murata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 263 days.

(21) Appl. No.: 12/870,486

(22) Filed: Aug. 27, 2010

(65) Prior Publication Data
US 2011/0049657 A1    Mar. 3, 2011

(30) Foreign Application Priority Data

Aug. 28, 2009 (JP) .................................. 2009-198181

(51) Int. Cl.
*H01L 29/82* (2006.01)
(52) U.S. Cl.
USPC .... 257/421; 257/422; 257/427; 257/E29.323; 438/3; 365/157; 360/324.2
(58) Field of Classification Search ............... 257/20, 257/414, 421–427, E29.323; 438/3; 360/324–326; 365/157–158, 171–173
See application file for complete search history.

(56) References Cited

U.S. PATENT DOCUMENTS

| | | | |
|---|---|---|---|
| 6,165,803 | A | 12/2000 | Chen et al. |
| 6,236,590 | B1 | 5/2001 | Bhattacharyya et al. |
| 2011/0156182 | A1* | 6/2011 | Takeuchi et al. ............. 257/421 |

FOREIGN PATENT DOCUMENTS

| | | |
|---|---|---|
| JP | 6-169066 | 6/1994 |
| JP | 2000-353791 | 12/2000 |
| JP | 2002-118239 | 4/2002 |

* cited by examiner

*Primary Examiner* — Jami M Valentine
(74) *Attorney, Agent, or Firm* — McDermott Will & Emery LLP

(57) ABSTRACT

There are provided a semiconductor device in which short circuit failures in magnetic resistor elements and the like are reduced, and a method of manufacturing the same. An interlayer insulating film in which memory cells are formed is formed such that the upper surface of the portion of the interlayer insulating film located in a memory cell region where the magnetic resistor elements are formed is at a position lower than that of the upper surface of the portion of the interlayer insulating film located in a peripheral region. Another interlayer insulating film is formed so as to cover the magnetic resistor elements. In the another interlayer insulating film, formed are bit lines electrically coupled to the magnetic resistor elements. Immediately below the magnetic resistor elements, formed are digit lines.

13 Claims, 48 Drawing Sheets

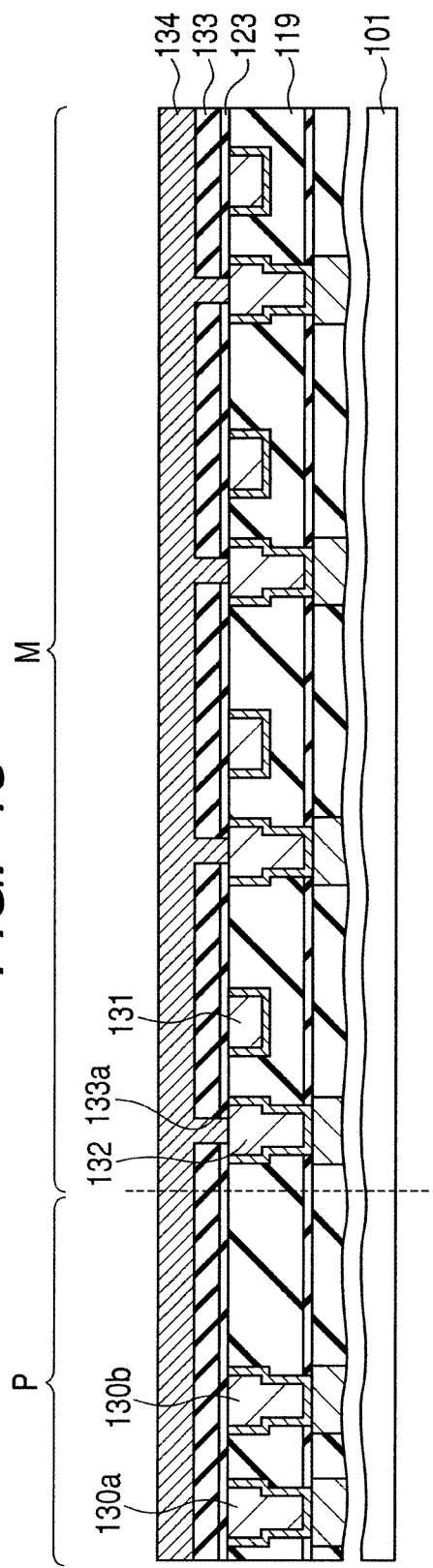
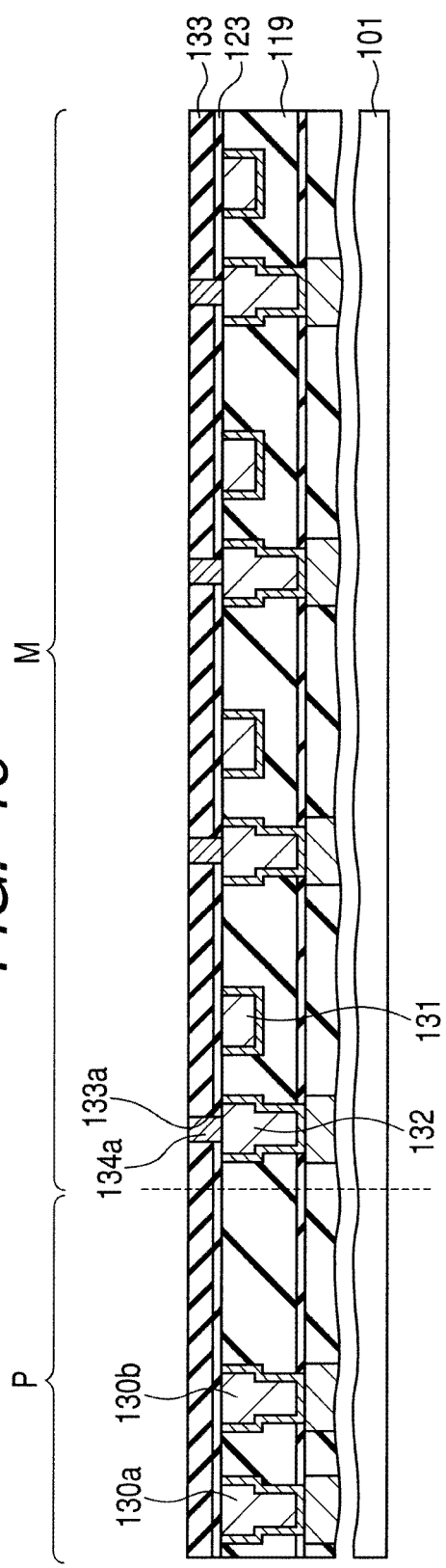

SEMICONDUCTOR DEVICE AND METHOD OF MANUFACTURING THE SAME

CROSS-REFERENCE TO RELATED APPLICATIONS

The disclosure of Japanese Patent Application No. 2009-198181 filed on Aug. 28, 2009 including the specification, drawings and abstract is incorporated herein by reference in its entirety.

BACKGROUND OF THE INVENTION

The present invention relates to a semiconductor device and a method of manufacturing the same, and particularly to a semiconductor device including a magnetic resistor element and a method of manufacturing the same.

As a form of a semiconductor device, there is a Magnetic Random Access Memory (MRAM) to which a magnetic resistor element called a Magnetic Tunnel Junction (MTJ) is applied. In the MRAM, the magnetic resistor elements are formed in an array configuration. In each of the magnetic resistor elements, two magnetic layers are stacked with a tunnel insulating film interposed therebetween. According to whether magnetizations in the two magnetic layers are oriented into the same directions or into opposite directions, the resistance value of the magnetic resistor element varies. In the MRAM, the difference in resistance value is used as information. That is, magnetization orientations in the two magnetic layers serve as information corresponding to "0" and "1".

A description will be given to the outline of a method of manufacturing the MRAM. A conductive layer and digit lines are formed, and an interlayer insulating film is formed so as to cover the conductive layer and the digit lines. Then, via holes are formed in the interlayer insulating film to expose the conductive layer, and plugs are formed in the respective via holes. Then, a layer serving as lead-out electrodes is formed over the interlayer insulating film, and predetermined layers each forming magnetic resistor elements are formed thereover. Then, predetermined photoengraving and etching are performed to form the lead-out electrodes and the magnetic resistor elements which are electrically coupled to the conductive layer.

Then, an interlayer insulating film is formed so as to cover the magnetic resistor elements. The interlayer insulating film is subjected to a polishing process, and thereby planarized. Then, predetermined wire grooves are formed in the interlayer insulating film so as to expose the surfaces of the magnetic resistor elements. Then, bit lines are formed in the wire grooves. In this manner, the main portion of the semiconductor device including the magnetic resistor elements electrically coupled to the bit lines and to the conductive layer is formed. The magnetization orientation in each of the magnetic resistor elements is changed by a magnetic field produced by allowing predetermined currents to flow in the corresponding bit line and the corresponding digit line. Examples of a document disclosing such a semiconductor device including magnetic resistor elements include Patent Document 1 and Patent Document 2.

PRIOR ART DOCUMENTS

Patent Documents

[Patent Document 1]
Japanese Unexamined Patent Publication No. 2000-353791
[Patent Document 2]
Japanese Unexamined Patent Publication No. 2002-118239

SUMMARY OF THE INVENTION

However, it has been found that the conventional MRAM has the following problem. That is, the present inventors have proved for the first time that short circuit failures in the magnetic resistor elements and the like occur in those of memory cells located in the vicinity of the boundary between a memory cell region and a peripheral circuit region other than the memory cell region. It is considered that such short circuit failures in the magnetic resistor elements and the like result from etching performed when the wire grooves are formed in the interlayer insulating film, from a membrane stress in each of the layers forming the magnetic resistor elements, or from a mechanical stress occurring when the interlayer insulating film is subjected to the polishing process.

The present invention has been achieved in order to solve such a problem. An object of the present invention is to provide a semiconductor device in which short circuit failures in magnetic resistor elements and the like are reduced, and another object thereof is to provide a method of manufacturing such a semiconductor device.

According to an embodiment of the present invention, a semiconductor device includes a first region, a second region, a first insulating film, a plurality of lead-out electrodes, a plurality of magnetic resistor elements, a second insulating film, and first wires. The first and second regions are defined in a main surface of a semiconductor substrate in such a configuration as to be electrically isolated from each other. The first insulating film is formed over the semiconductor substrate so as to cover the first region and the second region. The lead-out electrodes are formed so as to come in contact with a surface of a first portion of the first insulating film located in the first region. The magnetic resistor elements are formed at the respective lead-out electrodes. The second insulating film is formed over the first insulating film so as to fill a gap between the magnetic resistor elements adjacent to each other, and has first wire grooves. The first wires are formed in the first wire grooves, and each electrically coupled to a predetermined one of the magnetic resistor elements. A surface of the first portion of the first insulating film is at a position lower than that of a surface of a second portion of the first insulating film located in the second region.

According to the embodiment of the present invention, a method of manufacturing the semiconductor device includes the following steps of defining a first region and a second region in a main surface of a semiconductor substrate in such a configuration that the first region and the second region are electrically isolated from each other, forming a first insulating film over the semiconductor substrate so as to cover the first region and the second region therewith, setting a surface of a first portion of the first insulating film located in the first region at a position lower than that of a surface of a second portion of the first insulating film located in the second region, forming a plurality of lead-out electrodes such that each of the lead-out electrodes comes in contact with the surface of the first portion of the first insulating film, forming a plurality of magnetic resistor elements such that the magnetic resistor elements come in contact with respective surfaces of the lead-out electrodes, forming a second insulating film over the first insulating film so as to fill a gap between the magnetic resistor elements adjacent to each other therewith, forming wire grooves in the second insulating film, and forming, in the wire grooves, predetermined wires each electrically coupled to a predetermined one of the magnetic resistor elements.

According to another embodiment of the present invention, a method of manufacturing a semiconductor device includes the following steps of defining a first region and a second region in a main surface of a semiconductor substrate in such a configuration that the first region and the second region are electrically isolated from each other, forming a first insulating film over the semiconductor substrate so as to cover the first region and the second region therewith, setting a surface of a first portion of the first insulating film located in the first region at a position lower than that of a surface of a second portion of the first insulating film located in the second region, forming a plurality of lead-out electrodes such that each of the lead-out electrodes comes in contact with the surface of the first portion of the first insulating film, forming a plurality of magnetic resistor elements such that the magnetic resistor elements come in contact with respective surfaces of the lead-out electrodes, forming a second insulating film over the first insulating film so as to fill a gap between the magnetic resistor elements adjacent to each other therewith, forming a silicon oxynitride film over the second insulating film, forming a third insulating film over the silicon oxynitride film, forming wire grooves in each of the third insulating film and the silicon oxynitride film, and forming, in the wire grooves, predetermined wires each electrically coupled to a predetermined one of the magnetic resistor elements.

In the semiconductor device according to the embodiment of the present invention, the surface of the first portion of the first insulating film located in the first region where the magnetic resistor elements are formed is at the position lower than that of the surface of the second portion of the first insulating film located in the second region. This ensures a thickness to the portion of the second insulating film located in the first region and in the vicinity of the boundary between the first region and the second region, and inhibits the magnetic resistor element located at the end of the first region in the vicinity of the boundary from being damaged by etching when the first wire grooves are formed in the second insulating film or the like. As a result, it is possible to reduce short circuit failures in the magnetic resistor elements and the like.

In the method of manufacturing the semiconductor device according to the embodiment of the present invention, the surface of the first portion of the first insulating film located in the first region where the magnetic resistor elements are formed is set at the position lower than that of the surface of the second portion of the first insulating film located in the second region. This ensures a thickness to the portion of the second insulating film formed over the first insulating film that is located in the first region and in the vicinity of the boundary between the first region and the second region. As a result, the magnetic resistor element located at the end of the first region in the vicinity of the boundary is inhibited from being damaged by etching when the wire grooves are formed in the second insulating film or the like. Therefore, it is possible to reduce short circuit failures in the magnetic resistor elements and the like.

In the method of manufacturing the semiconductor device according to the another embodiment of the present invention, the surface of the first portion of the first insulating film located in the first region where the magnetic resistor elements are formed is set at the position lower than that of the surface of the second portion of the first insulating film located in the second region. This ensures a thickness to the portion of the second insulating film located in the vicinity of the boundary between the first region and the second region. In addition, the silicon oxynitride film is formed over the second insulating film, and the third insulating film is further formed over the silicon oxynitride film, which can inhibit the magnetic resistor elements from being affected when the third insulating film is formed. Further, when the wire grooves are formed in each of the third insulating film and the silicon oxynitride film, it is possible to cause the silicon oxynitride film to function as an etching stopper film, and form the wire grooves at a given depth.

BRIEF DESCRIPTION OF THE DRAWINGS

FIG. 15 is a cross-sectional view showing a step of a method of manufacturing a semiconductor device according to a comparative example;

FIG. 16 is a cross-sectional view showing a step performed after the step shown in FIG. 15;

DESCRIPTION OF THE PREFERRED EMBODIMENTS

Embodiment 1

Figure 1:
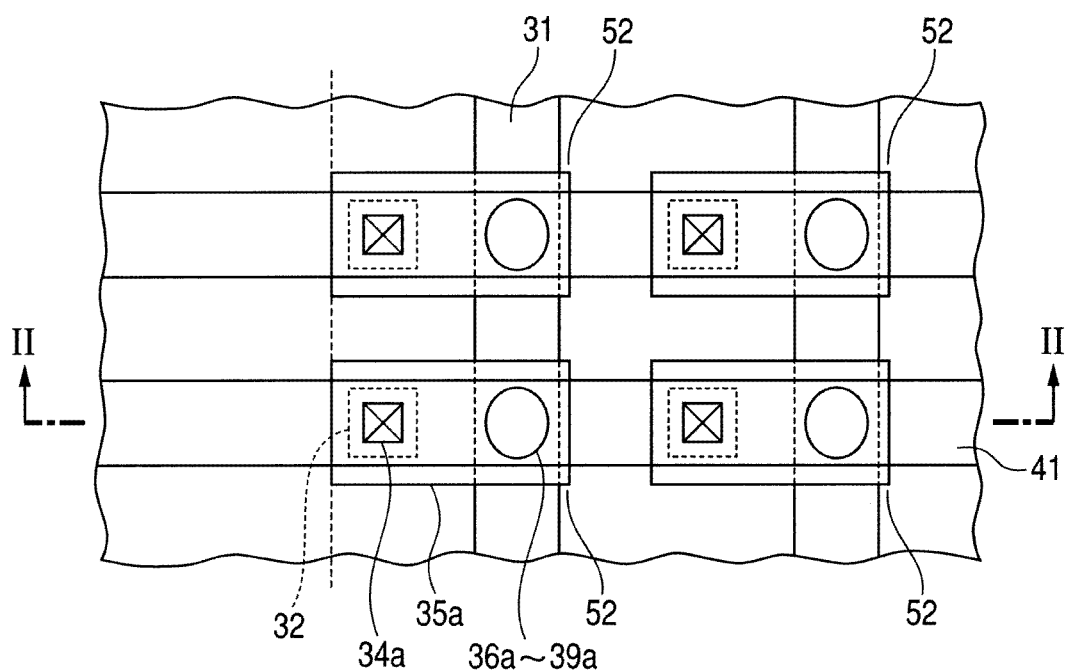
FIG. 1 is a partial plan view of a memory cell region in a semiconductor device according to Embodiment 1 of the present invention.

First, a description will be given to a structure of a memory cell region in a semiconductor device. As shown in FIG. 1, in a memory cell region M, a plurality of digit lines 31 are formed in mutually spaced-apart relation to extend in a direction, and a plurality of bit lines 41 are formed in mutually spaced-apart relation to extend in a direction substantially orthogonal to the direction. At the portions where the digit lines 31 and the bit lines 41 cross each other, magnetic resistor elements 51 are disposed. One ends of the magnetic resistor elements are coupled to the bit lines 41, while the other ends thereof are coupled to the drain regions of element selection transistors (not shown).

Figure 2:
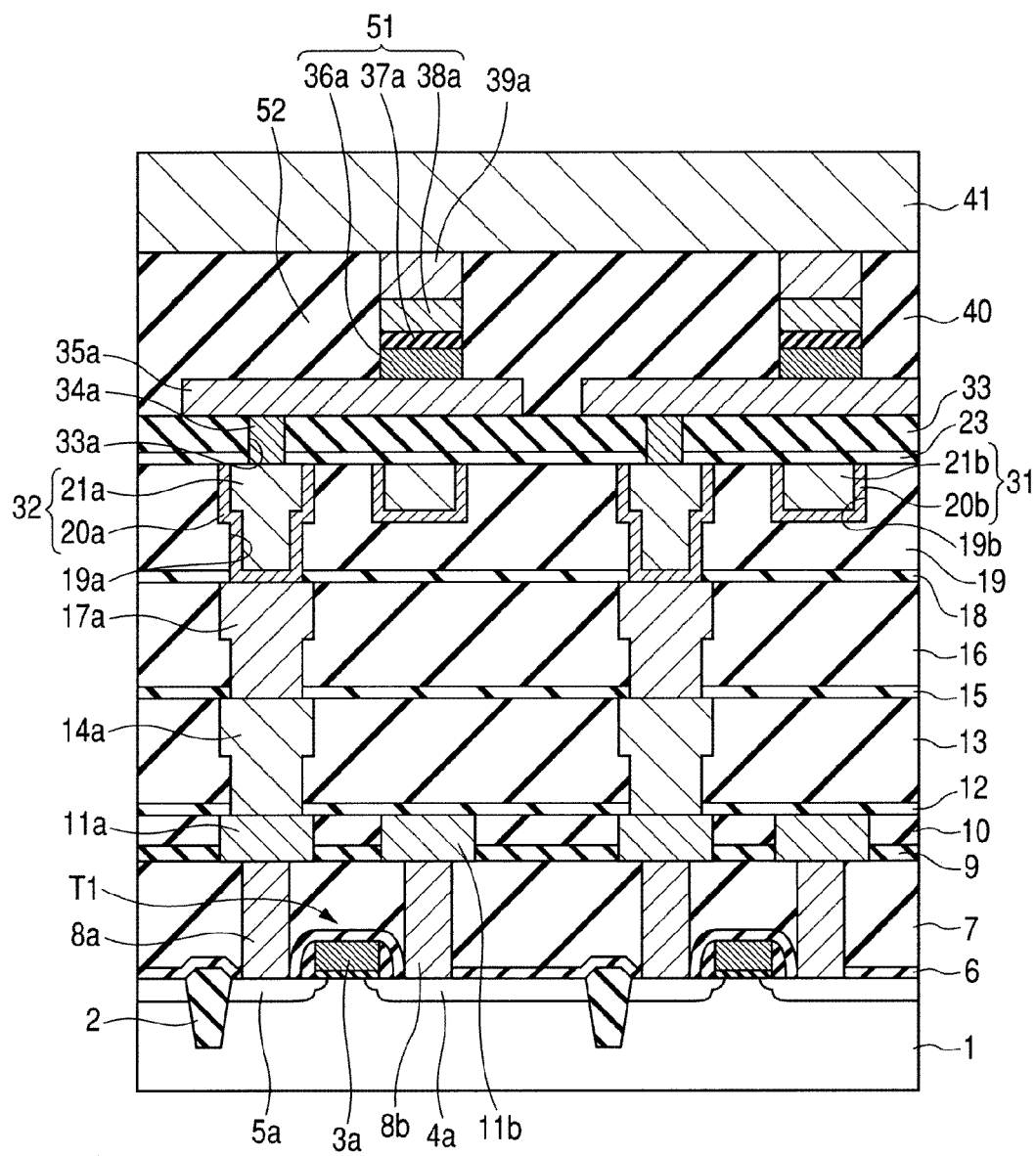
FIG. 2 is a partial cross-sectional view along the cross-sectional line II-II shown in FIG. 1 in Embodiment 1.

As shown in FIG. 2, each of the element selection transistors T1 has a gate electrode 3a, a source region 4a, and a drain region 5a, and is formed in a surface of an element formation region defined in a semiconductor substrate 1 by an isolation insulating film 2. An etching stopper film 6 and an interlayer insulating film 7 are formed so as to cover the element selection transistors T1. Conductive layers 8a electrically coupled to the respective drain regions 5a and conductive layers 8b electrically coupled to the respective source regions 4a are formed so as to extend through the interlayer insulating film 7 and the etching stopper film 6. Over the interlayer insulating film 7, an etching stopper film and an interlayer insulating film 10 are formed so as to cover the conductive layers 8a and 8b. Conductive layers 11a electrically coupled to the individual conductive layers 8a and conductive layers 11b electrically coupled to the individual conductive layers 8b are formed so as to extend through the interlayer insulating film 10 and the etching stopper film 9.

Over the interlayer insulating film 10, an etching stopper film 12 and an interlayer insulating film 13 are formed so as to cover the conductive layers 11a and 11b. Conductive layers 14a electrically coupled to the individual conductive layers 11a are formed so as to extend through the interlayer insulating film 13 and the etching stopper film 12. Over the interlayer insulating film 13, an etching stopper film 15 and an interlayer insulating film 16 are formed so as to cover the conductive layers 14a. Conductive layers 17a electrically coupled to the conductive layers 14a are formed so as to extend through the interlayer insulating film 16 and the etching stopper film 15.

Over the interlayer insulating film 16, an etching stopper film 18 and an interlayer insulating film 19 are formed so as to cover the conductive layers 17a. In each of the interlayer insulating film 19 and the etching stopper film 18, formed are openings 19a each including a via and a wire groove each extending through the interlayer insulating film and the etching stopper film 18, and openings 19b each including a wire groove. In the individual openings 19a, formed are conductive layers 32. In the individual openings 19b, formed are the digit lines 31. Each of the conductive layers 32 is formed of a conductive layer 20a and a conductive layer 21a. Each of the digit lines 31 is formed of a conductive layer 20b and a conductive layer 21b. The digit lines 31 extend in a direction vertical to the surface of a paper sheet with the drawing.

Over the interlayer insulating film 19, an etching stopper film 23 and an interlayer insulating film 33 are formed so as to cover the conductive layers 32 and the digit lines 31. In each of the interlayer insulating film 33 and the etching stopper film 23, via holes 33a are formed to expose the conductive layers 32. Vias 34a are formed so as to fill the via holes 33a. Over the interlayer insulating film 33, formed are lead-out electrodes 35a electrically coupled to the vias 34a.

Over the lead-out electrodes 35a, formed are the magnetic resistor elements 51. Each of the magnetic resistor elements 51 is formed in such a configuration that a pin layer 36a, a tunnel insulating film 37a, and a free layer 38a are stacked. Over the free layer 38a, formed is a cap layer 39a. In the pin layer 36a, the orientation of magnetization is fixed. In the free layer 38a, the orientation of magnetization varies according to magnetization caused by respective currents flowing in the bit line 41 and the digit line 31. Over the interlayer insulating film 33, an interlayer insulating film is formed so as to fill the gap between the adjacent magnetic resistor elements 51. Over the interlayer insulating film 40, formed are the bit lines 41 electrically coupled to the magnetic resistor elements 51. The bit lines 41 are formed so as to be orthogonal to the digit lines 31.

Figure 3:
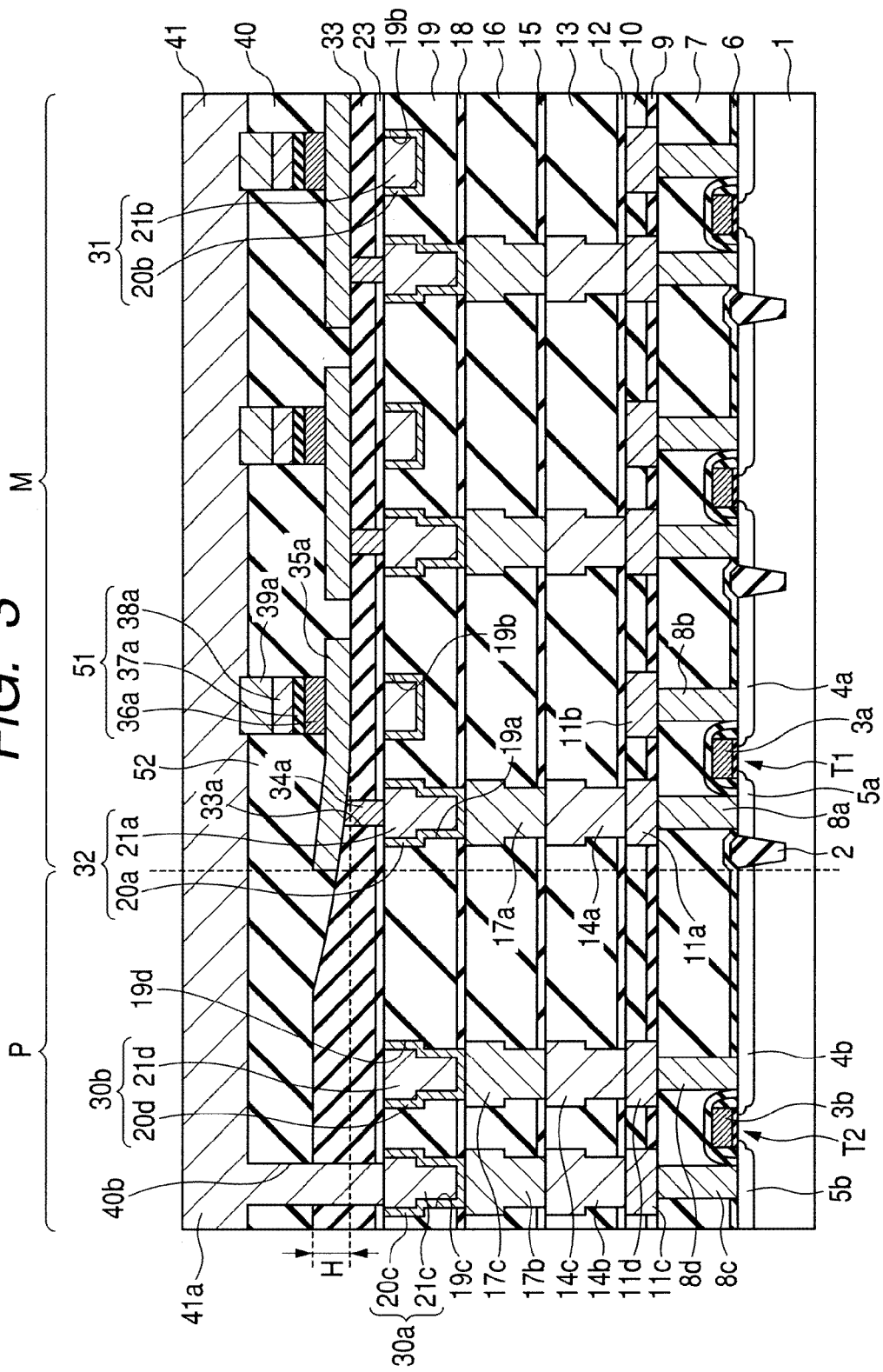
FIG. 3 is a cross-sectional view of the semiconductor device including the memory cell region and a peripheral region in Embodiment 1.

Next, a description will be given to a structure obtained by adding a peripheral region P where a peripheral circuit and the like are formed to the memory cell region M described above. As shown in FIG. 3, in the semiconductor device according to Embodiment 1, memory cells are formed in the interlayer insulating film 33, and the interlayer insulating film 33 is formed such that the upper surface of the portion thereof located in the memory cell region M is formed at a position lower than that of the upper surface of the portion thereof located in the peripheral region P (by the height H). In other words, the surface of the portion of the interlayer insulating film 33 which underlies the memory cells when the memory cells are formed in the memory cell region M is at a position lower than that of the surface of the portion of the interlayer insulating film 33 located in the peripheral region. By providing such a structure, it is possible to eliminate short-circuit failures in the magnetic resistor elements 51 and the like. This will be described later in detail.

In the peripheral region P, formed is a transistor T2 including a gate electrode 3b, a drain region 5b, and a source region 4b. The etching stopper films 6, 9, 12, 15, and 18 and the interlayer insulating films 7, 13, 16, and 19 are formed so as to cover the transistor T2. In each of the interlayer insulating film 19 and the etching stopper film 18, openings 19c and 19d each including a via and a wire groove are formed to extend through the interlayer insulating film 19 and the etching stopper film 18. In the opening 19c, formed is a conductive layer 30a. In the opening 19d, formed is a conductive layer 30b. The conductive layer 30a is formed of a conductive layer 20c and a conductive layer 21c. The conductive layer 30b is formed of a conductive layer 20d and a conductive layer 21d.

The conductive layer 30a is electrically coupled to the drain region 5b of the transistor T2 via conductive layers 17b, 14b, 11c, and 8c. The conductive layer 30b is electrically coupled to the source region 4b of the transistor T2 via conductive layers 17c, 14c, 11d, and 8d. In each of the etching stopper film 23 and the interlayer insulating films 33 and 40 which are formed so as to cover the conductive layers 30a and 30b, an opening 40b is formed to expose the conductive layer 30a. The conductive layer 30a is electrically coupled to a wire 41a by the portion of a conductive layer filling the opening 40b.

Next, a description will be given to the operation of the memory cells in the semiconductor device described above. First, at the time of reading, a predetermined current is allowed to flow in the magnetic resistor element 51 of a specified one of the memory cells, and a difference in resistance value according to the magnetization orientations is sensed. First, the element selection transistor T1 of the specified memory cell is turned ON so that a predetermined sense signal is transmitted from the bit line 41 to the conductive layer 11b as a source line through the specified magnetic resistor element 51 via the lead-out electrode 35a, the via 34a, the conductive layers 21a and 20b, the conductive layer 17, the conductive layer 14, the conductive layer 11a, the conductive layer 8a, the element selection transistor T1, and the conductive layer 8b.

At this time, when the magnetization in the pin layer 36a and the magnetization in the free layer 38a in the magnetic resistor element 51 are in the same orientations (parallel), the resistance value is relatively low. On the other hand, when the magnetization in the pin layer 36a and the magnetization in the free layer 38a in the magnetic resistor element 51 are in opposite orientations (antiparallel), the resistance value is relatively high. As a result, when the respective magnetization orientations in the pin layer 36a and the free layer 38a are parallel, a tunnel current becomes large while, when the respective magnetization orientations in the pin layer 36a and the free layer 38a are antiparallel, the tunnel current becomes small.

Consequently, when the magnetization orientations in the magnetic resistor element 51 are parallel, the intensity of a sense signal flowing in the source line (conductive layer 11b) becomes higher than the intensity of a signal in a predetermined reference memory cell. On the other hand, when the magnetization orientations in the magnetic resistor element 51 are antiparallel, the intensity of the sense signal becomes lower than the intensity of the signal in the predetermined reference memory cell. Thus, depending on whether the intensity of the sense signal is higher or lower than the intensity of the signal in the predetermined reference memory cell, it is determined whether the information written in the specified memory cell is "0" or "1".

At the time of writing (rewriting), predetermined currents are allowed to flow in the bit line 41 and the digit line 31 to magnetize (cause flux reversal in) the magnetic resistor element 51. By first allowing respective predetermined currents to flow in the selected bit line 41 and the selected digit line 31, magnetic fields corresponding to the respective directions of the current flows are formed around the bit line 41 and the digit line 31. On the magnetic resistor element 51 located in the region where the selected bit line 41 and the selected digit line 31 cross each other, a synthetic magnetic field of the magnetic field produced by the current flowing in the bit line 41 and the magnetic field produced by the current flowing in the digit line 31 acts.

At this time, depending on the synthetic magnetic field, there are a configuration in which the free layer 38a of the magnetic resistor element 51 is magnetized in the same orientation as that of the magnetization in the pin layer 36a and a configuration in which the free layer 38a of the magnetic resistor element 51 is magnetized in the orientation opposite to that of the magnetization in the pin layer 36a. In this manner, the case where the respective magnetization orientations in the pin layer 36a and the free layer 38a are the same (parallel) and the case where the respective magnetization orientations in the pin layer 36a and the free layer 38a are opposite (antiparallel) are established so that the magnetization orientations are recorded as information corresponding to "0" and "1".

Figure 4:
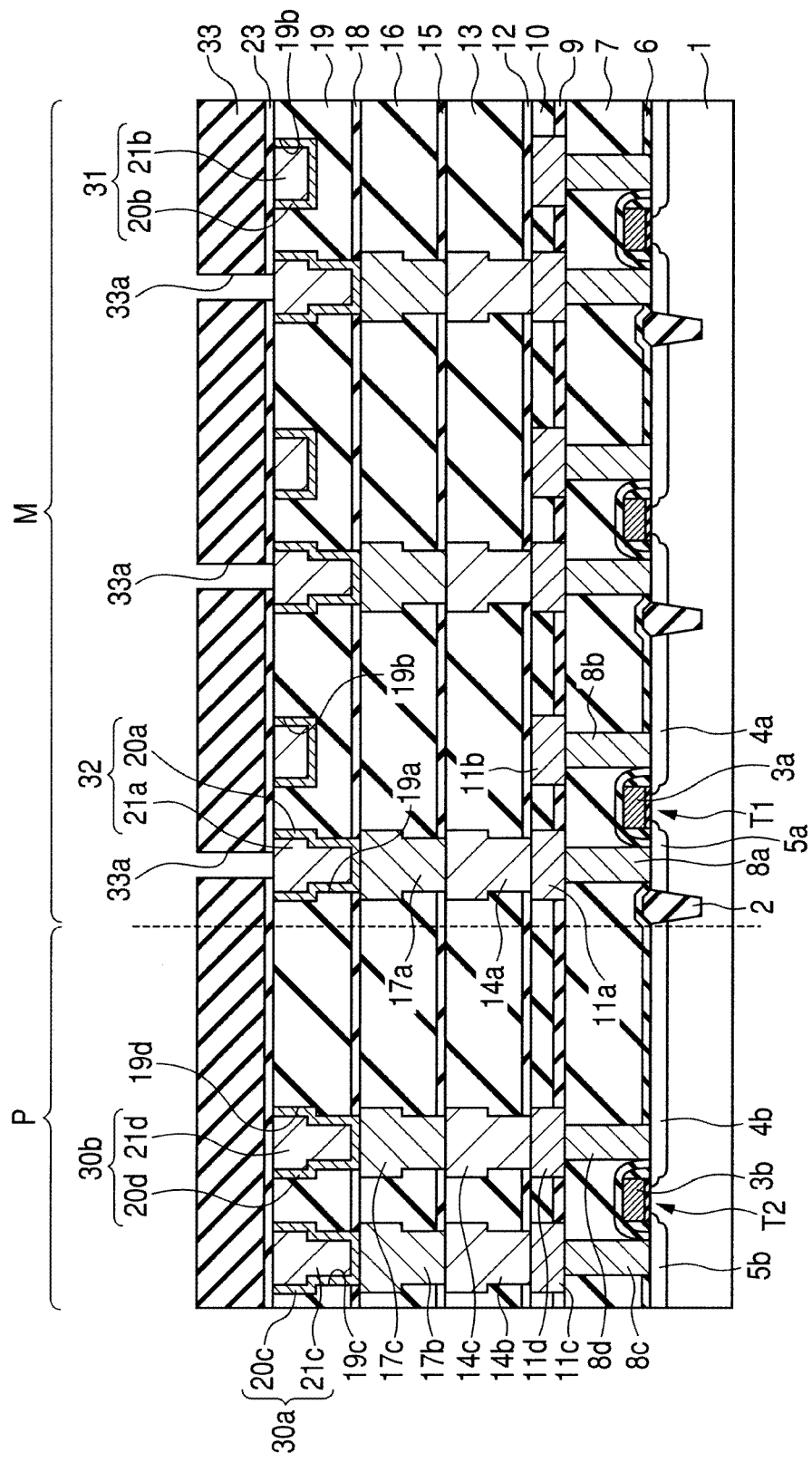
FIG. 4 is a cross-sectional view illustrating a step of a method of manufacturing the semiconductor device in Embodiment 1.

Next, a description will be given to a method of manufacturing the semiconductor device described above. As shown in FIG. 4, the isolation insulating film 2 is formed in a predetermined area of the main surface of the semiconductor substrate 1 to form the memory cell region M and the peripheral region P electrically isolated from each other. Next, in predetermined areas in the memory cell region M, the element selection transistors T1 each including the drain region 5a, the source region 4a, and the gate electrode 3a are formed. Next, in a predetermined area in the peripheral region P, the transistor T2 including the drain region 5b, the source region 4b, and the gate electrode 3b is formed.

The etching stopper film 6 and the interlayer insulating film 7 are successively formed so as to cover the element selection transistors T1 and the transistor T2. As the etching stopper film 6, a silicon nitride film, for example, or the like is formed.

On the other hand, as the interlayer insulating film 7, a silicon dioxide film, for example, or the like is formed so as to have an etching selectivity with respect to the etching stopper film 6. Next, in the memory cell region M, the conductive layers 8a electrically coupled to the respective drain regions 5 of the element selection transistors T1 and the conductive layers 8b electrically coupled to the source regions 4 thereof are formed individually in such a configuration as to extend through the interlayer insulating film 7 and the etching stopper film 6. In the peripheral region P, the conductive layer 8c electrically coupled to the drain region 5b of the transistor T2 and the conductive layer 8d electrically coupled to the source region 4b thereof are formed individually.

Next, over the interlayer insulating film 7, the etching stopper film 9 and the interlayer insulating film 10 are successively formed so as to cover the conductive layers 8a, 8b, 8c, and 8d. On the other hand, as the etching stopper film 9, a silicon nitride film, for example, or the like is formed. As the interlayer insulating film 10, a silicon dioxide film, for example, or the like is formed so as to have an etching selectivity with respect to the etching stopper film 9. Next, in the memory cell region M, the conductive layers 11a electrically coupled to the conductive layers 8a and the conductive layers 11b electrically coupled to the conductive layers 8b are formed individually in such a configuration as to extend through the interlayer insulating film 10 and the etching stopper film 9. In the peripheral region P, the conductive layer 11c electrically coupled to the conductive layer 8c and the conductive layer 11d electrically coupled to the conductive layer 8d are formed individually.

Next, over the interlayer insulating film 10, the etching stopper film 12 and the interlayer insulating film 13 are successively formed so as to cover the conductive layers 11a, 11b, 11c, and 11d. As the etching stopper film 12, a silicon nitride film, for example, or the like is formed. On the other hand, as the interlayer insulating film 13, a silicon dioxide film, for example, or the like is formed so as to have an etching selectivity with respect to the etching stopper film 12. Then, the conductive layers 14a electrically coupled to the conductive layers 11a, the conductive layers 14b electrically coupled to the conductive layers 11c, and the conductive layers 14c electrically coupled to the conductive layer 11d are formed individually in such a configuration as to extend through the interlayer insulating film 13 and the etching stopper film 12. Note that, at this time, a conductive layer need not be coupled to the conductive layer 11c or the conductive layer 11d in the peripheral region P.

Next, over the interlayer insulating film 13, the etching stopper film 15 and the interlayer insulating film 16 are successively formed so as to cover the conductive layers 14a, 14b, and 14c. On the other hand, as the etching stopper film 15, a silicon nitride film, for example, or the like is formed. As the interlayer insulating film 16, a silicon dioxide film, for example, or the like is formed so as to have an etching selectivity with respect to the etching stopper film 15. Next, the conductive layers 17a electrically coupled to the conductive layers 14a, the conductive layer 17b electrically coupled to the conductive layer 14b, and the conductive layer 17c electrically coupled to the conductive layer 14c are formed individually in such a configuration as to extend through the interlayer insulating film 16 and the etching stopper film 15.

Next, over the interlayer insulating film 16, the etching stopper film 18 and the interlayer insulating film 19 are successively formed so as to cover the conductive layer 17. As the etching stopper film 18, a silicon nitride film, for example, or the like is formed. On the other hand, as the interlayer insulating film 19, a silicon dioxide film, for example, or the like is formed so as to have an etching selectivity with respect to the etching stopper film 18. Next, in the memory cell region M, the openings 19a each including the via and the wire groove are formed so as to extend through the interlayer insulating film 19 and the etching stopper film 18. Also in the interlayer insulating film 19, the openings 19b each including the wire groove are formed. On the other hand, in the peripheral region P, the openings 19c and 19d each including the via and the wire groove are formed so as to extend through the interlayer insulating film 19 and the etching stopper film 18.

Next, over the interlayer insulating film 19, a conductive layer is formed so as to cover the inner walls of the openings 19a, 19b, 19c, and 19d. Further, over the conductive layer, a conductive layer is formed so as to fill each of the openings 19a, 19b, 19c, and 19d. Then, the conductive layer is subjected to a chemical mechanical polishing process so that the portion thereof located over the interlayer insulating film 19 is removed. As a result, in the memory cell region M, the conductive layers 32 each including the conductive layers 20a and 21a are formed in the respective openings 19a. It follows that the conductive layers 32 are electrically coupled to the drain regions 5 of the element selection transistors T1 via the conductive layers 17a, 14a, 11a, and 8a. In the openings 19b, the digit lines 31 each including the conductive layers 20b and 21b are formed.

On the other hand, in the peripheral region P, the conductive layer 30a including the conductive layers 20c and 21c is formed in the opening 19c, and the conductive layer 30b including the conductive layers 20d and 21d is formed in the opening 19d. In the chemical mechanical polishing process, a level difference is scarcely formed between the respective portions of the interlayer insulating film 19 located in the memory cell region M and the peripheral region P.

Figure 5:
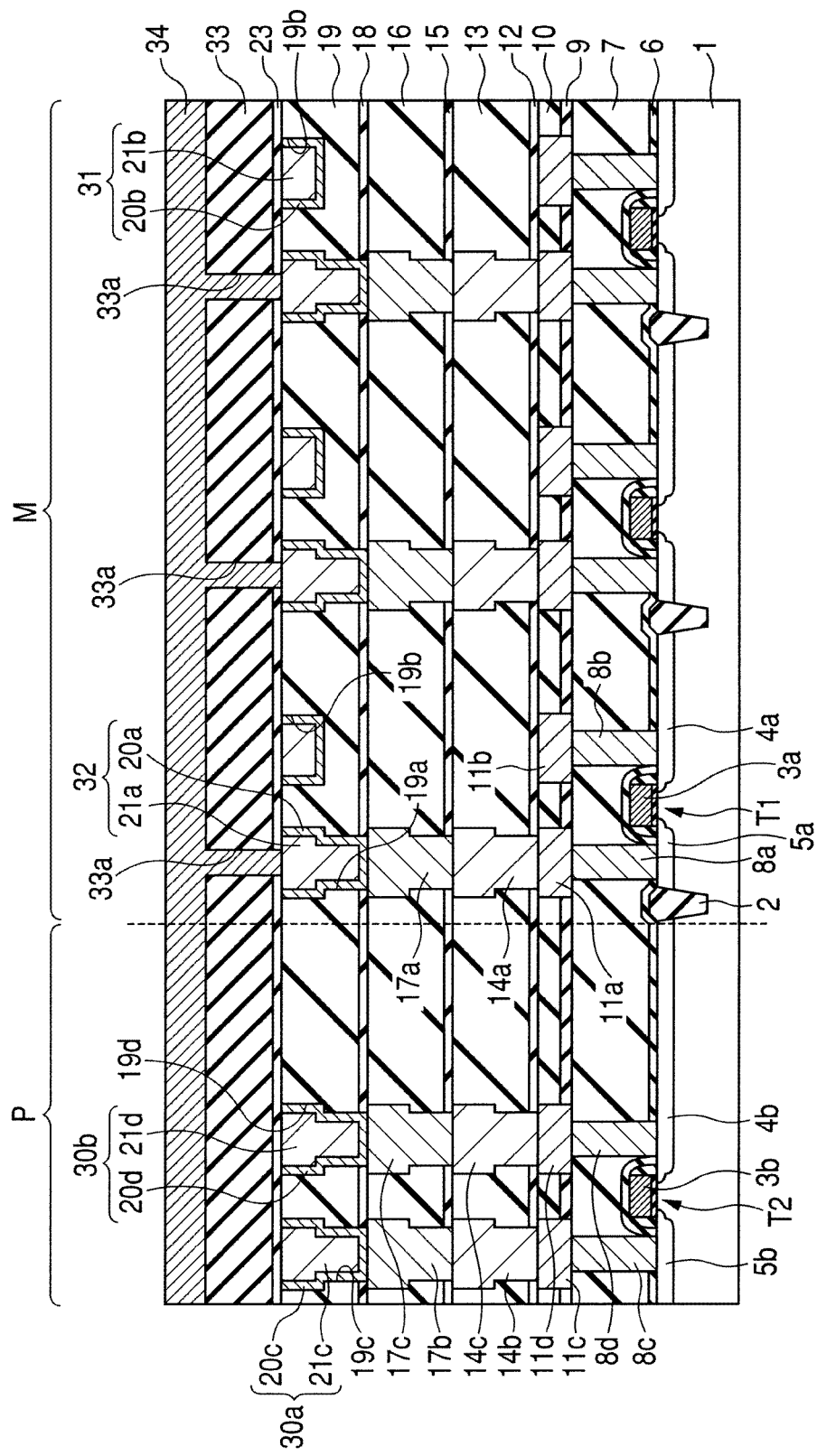
FIG. 5 is a cross-sectional view showing a step performed after the step shown in FIG. 4 in Embodiment 1.

Next, over the interlayer insulating film 19, the etching stopper film 23 and the interlayer insulating film 33 are successively formed so as to cover the conductive layer 32 and the digit lines 31. As the etching stopper film 23, a silicon nitride film, for example, or the like is formed. On the other hand, as the interlayer insulating film 33, a silicon dioxide film, for example, or the like is formed so as to have an etching selectivity with respect to the etching stopper film 23. In the respective portions of the interlayer insulating film 33 and the etching stopper film 23 that are located in the memory cell region M, the via holes 33a are formed to expose the conductive layers 32. Next, as shown in FIG. 5, the conductive layer 34 is formed over the interlayer insulating film 33 in such a configuration as to fill the via holes 33a. The conductive layer 34 is formed in such a configuration that a barrier metal layer and a predetermined metal layer serving as plugs are stacked.

Figure 6:
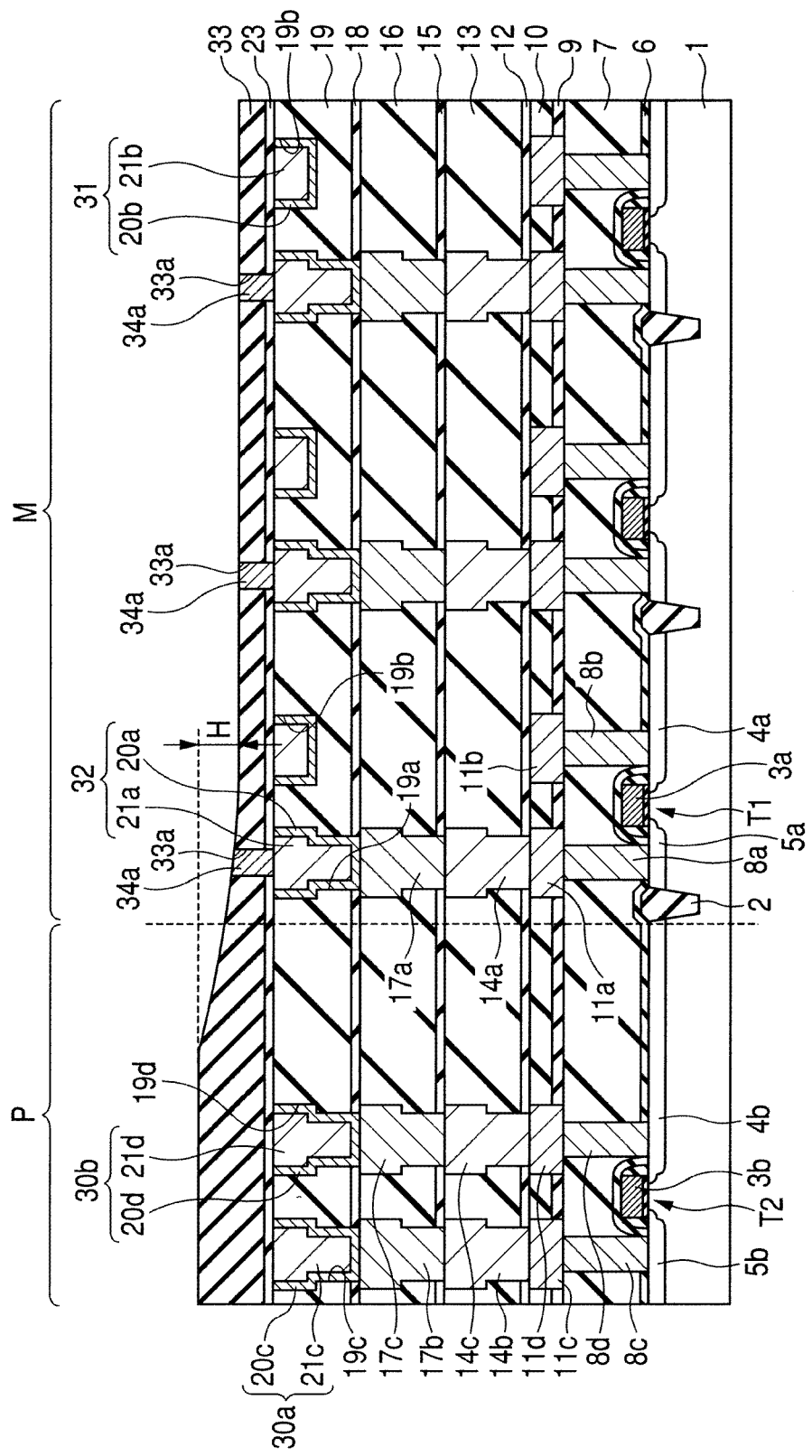
FIG. 6 is a cross-sectional view showing a step performed after the step shown in FIG. 5 in Embodiment 1.

Next, as shown in FIG. 6, the conductive layer 34 is subjected to a chemical mechanical polishing process so that the portion thereof located over the upper surface of the interlayer insulating film 33 is removed, and the conductive layers 34a as the plugs are formed in the respective via holes 33a. At this time, conditions for polishing such as the type of a slurry and a polishing pressure are adjusted to increase a polishing speed at the portion of the interlayer insulating film 33 located in the memory cell region M or the like to a value higher than that of a polishing speed at the portion of the interlayer insulating film 33 located in the peripheral region P. In this manner, the upper surface of the portion of the interlayer insulating film 33 located in the memory cell region M is set at a position lower than that of the upper surface of the portion of the interlayer insulating film 33 located in the peripheral region P. This can be achieved because, while the conductive layers 34a are formed in the memory cell region M, such conductive layers are not formed in the peripheral region P.

For example, the slurry for polishing is changed from a slurry having a relatively large particle diameter such as a primary particle diameter of about 0.07 to 0.5 μm to a slurry containing fumed silica or the like and having a relatively small particle diameter such as a mean primary particle diameter of about 0.001 to 0.07 μm, thereby allowing the surface position of the memory cell region M to be changed with respect to the surface position of the peripheral region P after the polishing. Then, the polishing pressure is increased from about 0.1-20 kPa to about 20-70 kPa, thereby allowing the surface position of the memory cell region M to be set lower than the surface position of the peripheral region P.

In the chemical mechanical polishing process, if the difference (level difference) between the upper surface position of the portion of the interlayer insulating film 33 located in the memory cell region M and the upper surface position of the portion of the interlayer insulating film 33 located in the peripheral region P is excessively large, a stress in the lead-out electrode of the memory cell located at the end of the memory cell region M may increase, or dimensional variations when the magnetic resistor elements are formed may be affected. Accordingly, the upper surface position of the portion of the interlayer insulating film 33 located in the memory cell region M is preferably lower by about 20 to 60 nm than the upper surface position of the portion of the interlayer insulating film 33 located in the peripheral region P (H=about 20 to 60 nm).

Figure 7:
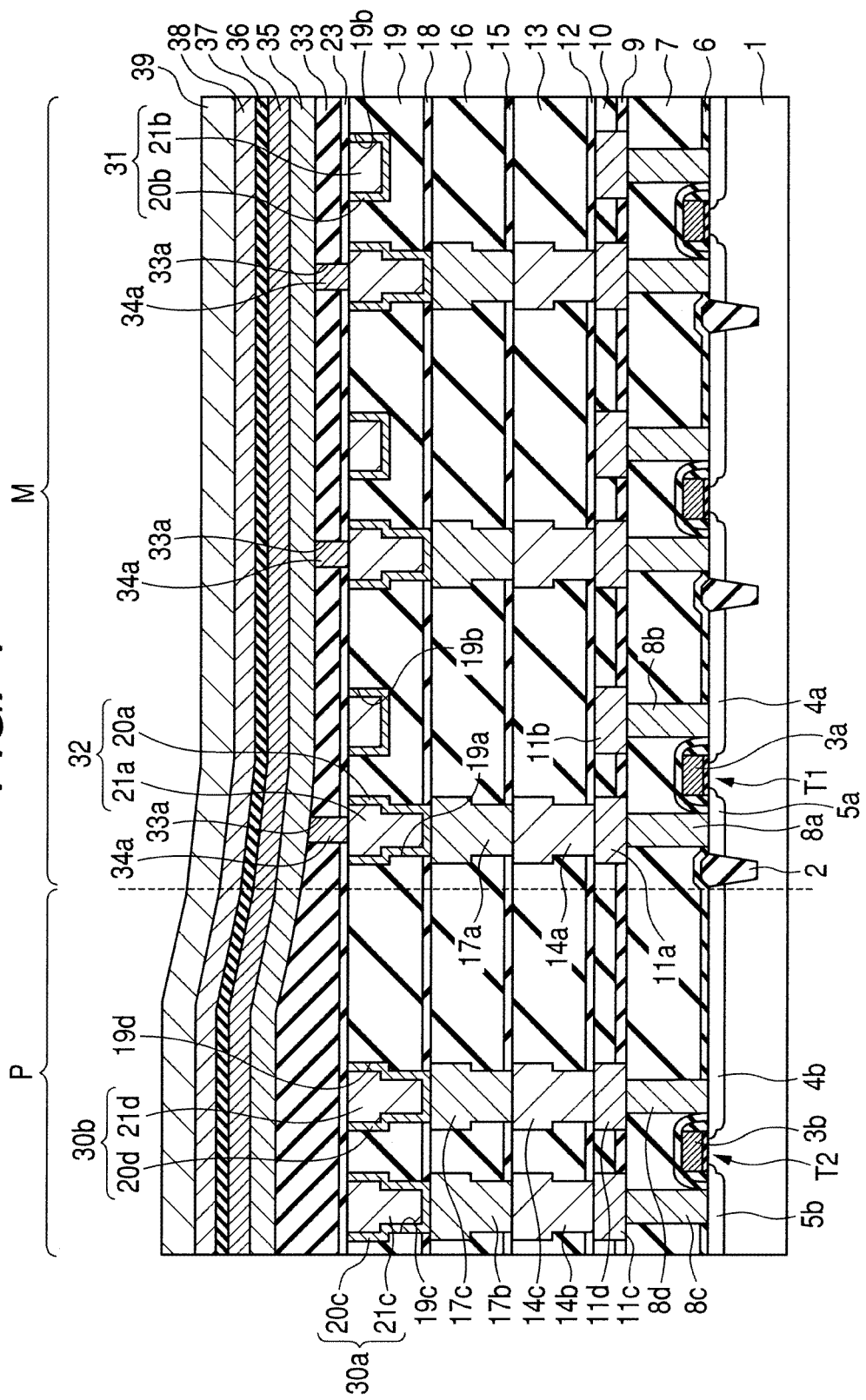
FIG. 7 is a cross-sectional view showing a step performed after the step shown in FIG. 6 in Embodiment 1.

Next, as shown in FIG. 7, a conductive layer 35 serving as the lead-out electrodes is formed. To the conductive layer 35, tantalum (Ta), titanium (Ti), tungsten (W), for example, or the like is applied. Then, over the conductive layer 35, a predetermined laminate film 36 serving as the pin layers is formed. As the laminate film 36, a laminate film containing platinum (Pt), manganese (Mn), nickel (Ni), ruthenium (Ru), cobalt (Co), iron (Fe), or boron (B) is formed.

Next, over the laminate film 36, a tunnel insulating film 37 is formed. The tunnel insulating film 37 is formed by, e.g., depositing aluminum oxide (AlOx) or magnesium oxide (MgO) by a sputtering method. The tunnel insulating film 37 may also be formed by oxidizing aluminum (Al) or magnesium (Mg).

Next, over the tunnel insulating film 37, a predetermined alloy film 38 serving as the free layers is formed. As the alloy film 38, an alloy film containing at least two metals of, e.g., nickel (Ni), iron (Fe), cobalt (Co), and boron (B) is formed. Then, over the alloy film 38, a predetermined film 39 serving as the cap layers is formed. As the predetermined film 39, ruthenium (Ru) or tantalum (Ta), e.g., is formed. As the predetermined film 39, a laminate film of ruthenium (Ru) and tantalum (Ta) may also be formed.

Figure 8:
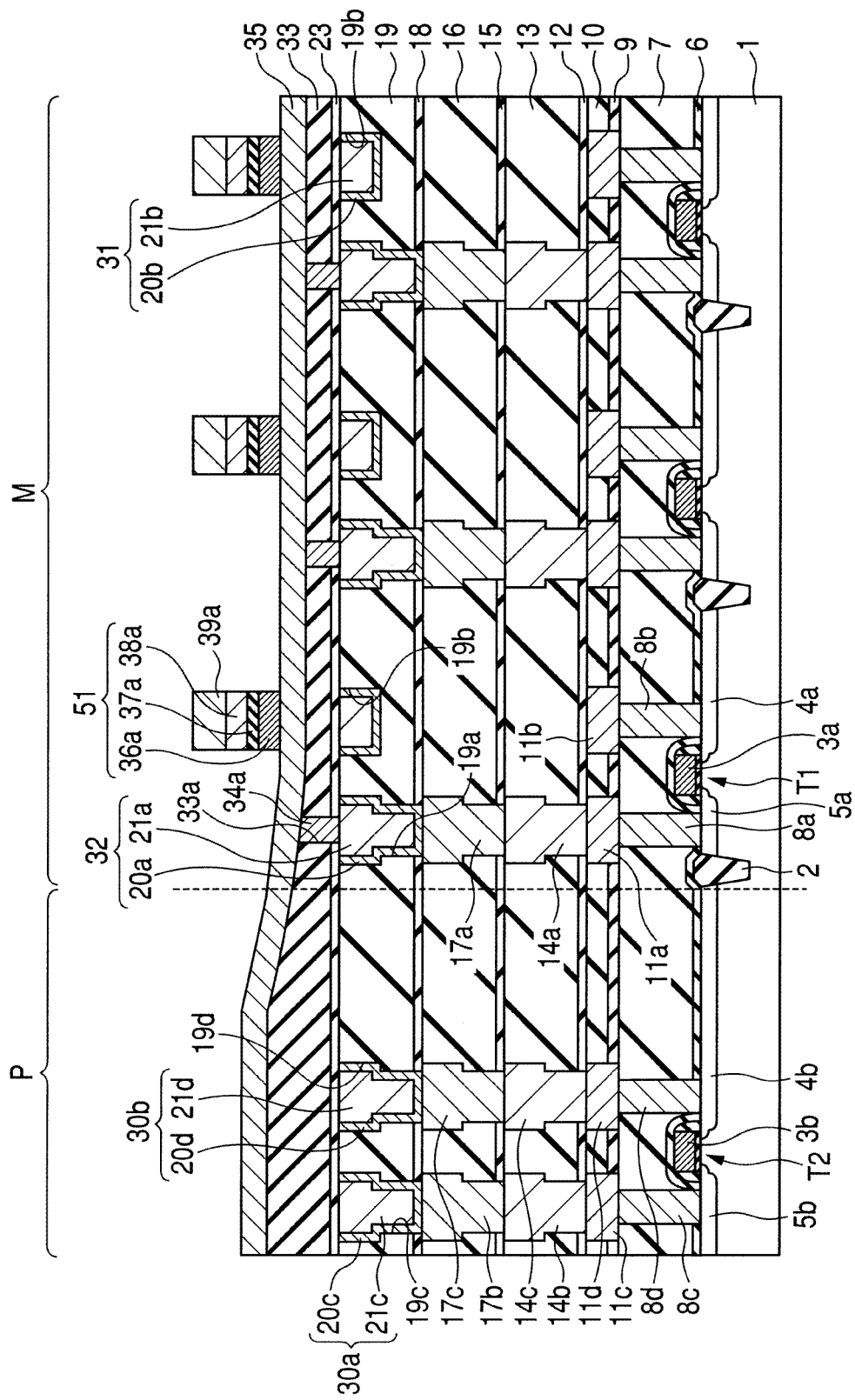
FIG. 8 is a cross-sectional view showing a step performed after the step shown in FIG. 7 in Embodiment 1.

Next, over the predetermined film 39 serving as the cap layers, a resist pattern (not shown) for forming the magnetic resistor elements by patterning is formed. Using the resist pattern as a mask, the predetermined film 39 serving as the cap layers, the metal film 38, the tunnel insulating film 37, and the laminate film 36 are etched and patterned into the pin layers 36a, the tunnel insulating films 37a, the free layers 38a, and the cap layers 39a to form the magnetic resistor elements 51, as shown in FIG. 8.

Figure 9:
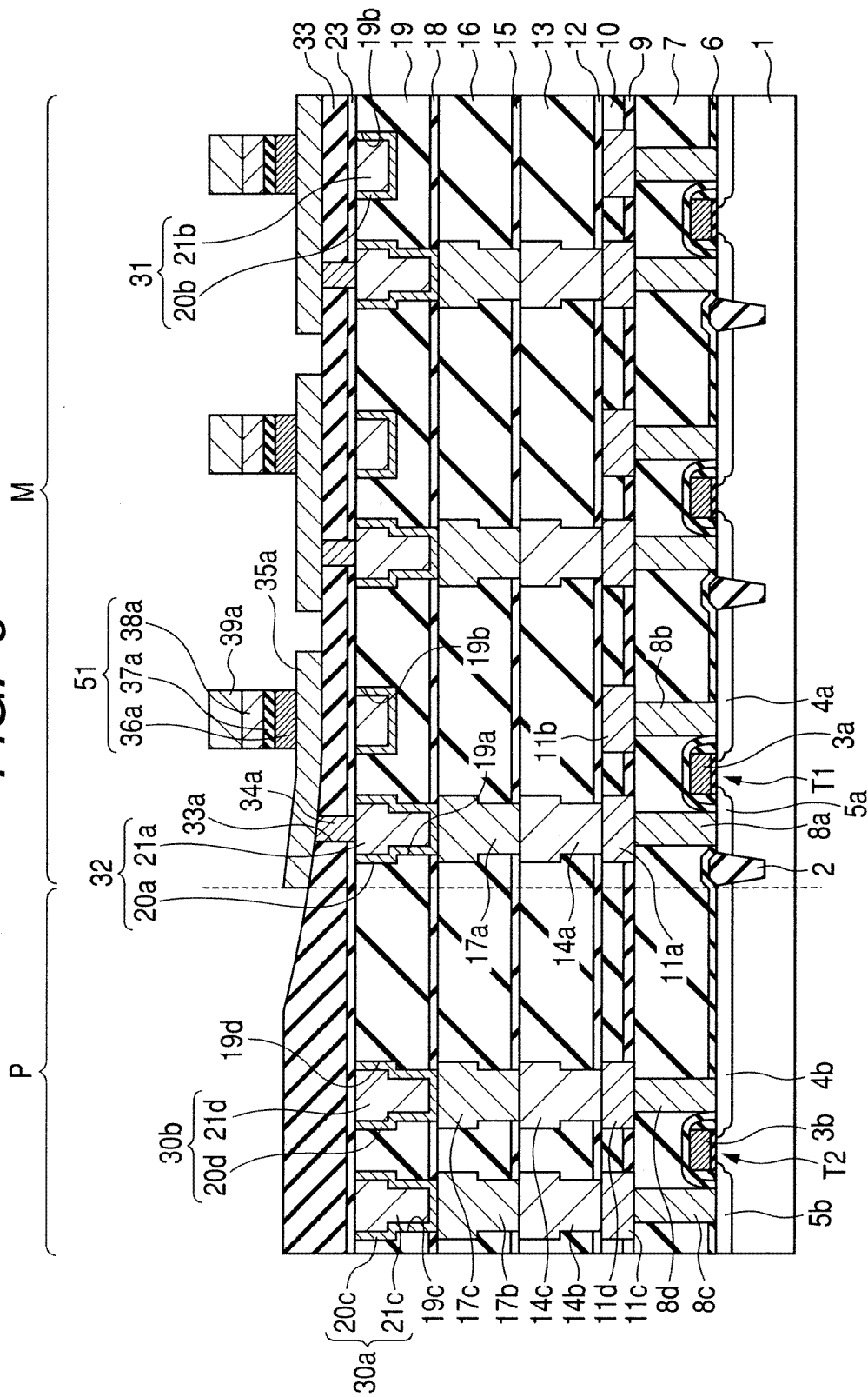
FIG. 9 is a cross-sectional view showing a step performed after the step shown in FIG. 8 in Embodiment 1.

Next, over the conductive layer 35 serving as the lead-out electrodes, a resist pattern (not shown) for forming the lead-out electrodes by patterning is formed. Using the resist pattern as a mask, the conductive layer 35 is etched to form the lead-out electrodes 35a, as shown in FIG. 9. This electrically isolates the individual magnetic resistor elements 51 from each other.

Figure 10:
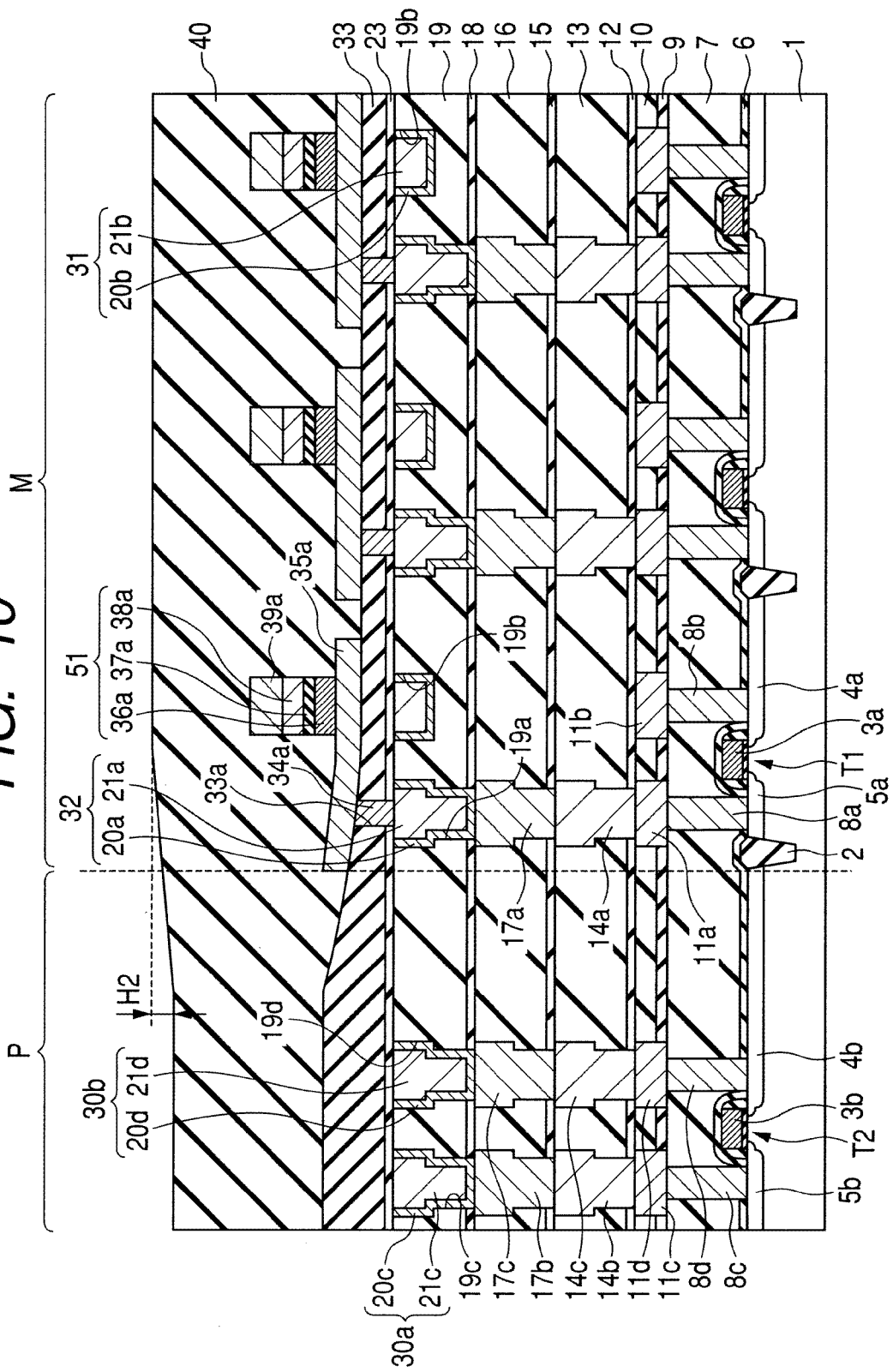
FIG. 10 is a cross-sectional view showing a step performed after the step shown in FIG. 9 in Embodiment 1.

Next, as shown in FIG. 10, the interlayer insulating film 40 is formed over the interlayer insulating film 33 so as to cover the magnetic resistor elements 51. At this time, the surface of the portion of the interlayer insulating film 33 located in the memory cell region M is at a position lower than that of the surface of the portion of the interlayer insulating film 33 located in the peripheral region P. Therefore, in the interlayer insulating film 40 formed over the interlayer insulating film 33, the difference (H2) between the surface position of the portion of the interlayer insulating film 40 located in the memory cell region M and the surface position of the portion of the interlayer insulating film 40 located in the peripheral region P is reduced.

Figure 11:
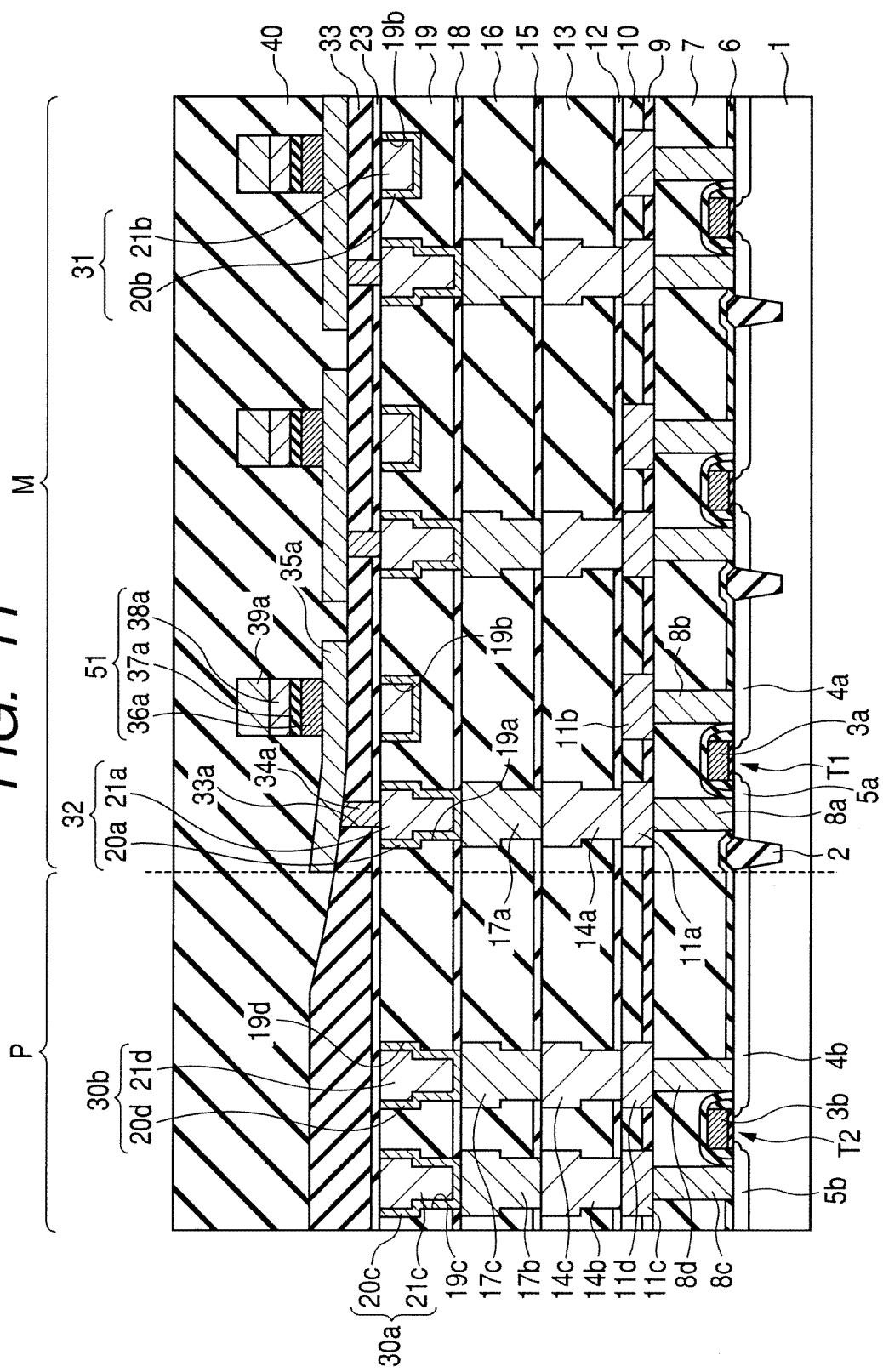
FIG. 11 is a cross-sectional view showing a step performed after the step shown in FIG. 10 in Embodiment 1.

Next, as shown in FIG. 11, the interlayer insulating film 40 is subjected to a chemical mechanical polishing process, and thereby planarized. At this time, the difference (H2) between the surface position of the portion of the interlayer insulating film 40 located in the memory cell region M and the surface position of the portion of the interlayer insulating film 40 located in the peripheral region P has been reduced. Accordingly, in the interlayer insulating film 40 after subjected to the polishing process, the portion of the interlayer insulating film 40 covering the magnetic resistor element 51 located at the end of the memory cell region M is prevented from becoming extremely thinner than the portion of the interlayer insulating film 40 covering the magnetic resistor elements 51 located more inward in the memory cell region M.

Figure 12:
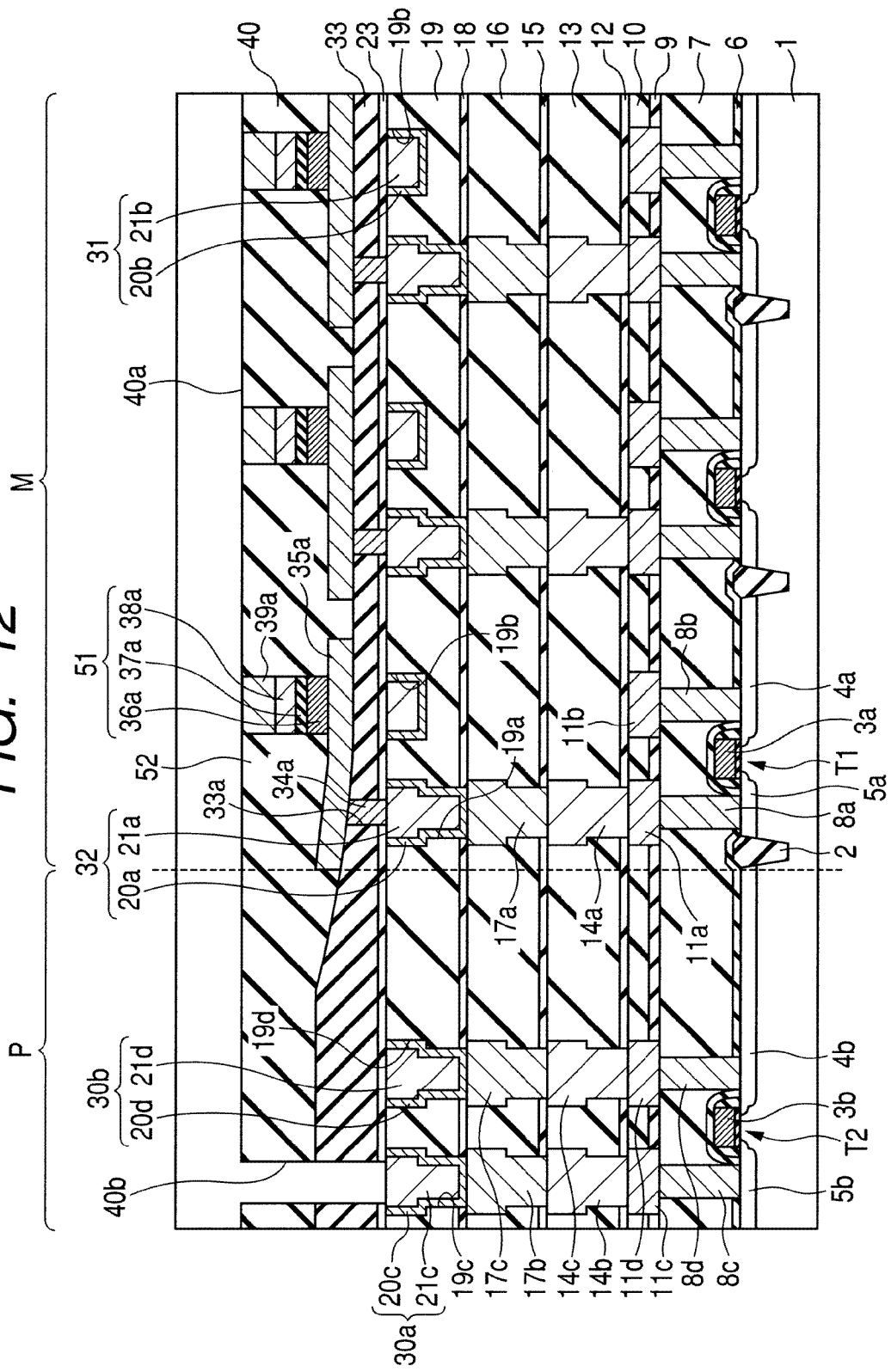
FIG. 12 is a cross-sectional view showing a step performed after the step shown in FIG. 11 in Embodiment 1.

Next, over the interlayer insulating film 40, a resist pattern (not shown) for forming wire grooves and the like is formed. Using the resist pattern as a mask, the interlayer insulating film 40 and the like are etched so that wire grooves 40a for forming the bit lines are formed in the memory cell region M to expose the cap layers 39a of the magnetic resistor elements 51, as shown in FIG. 12. On the other hand, in the peripheral region P, the opening 40b and the wire groove 40a are formed to expose the conductive layer 30a.

Figure 13:
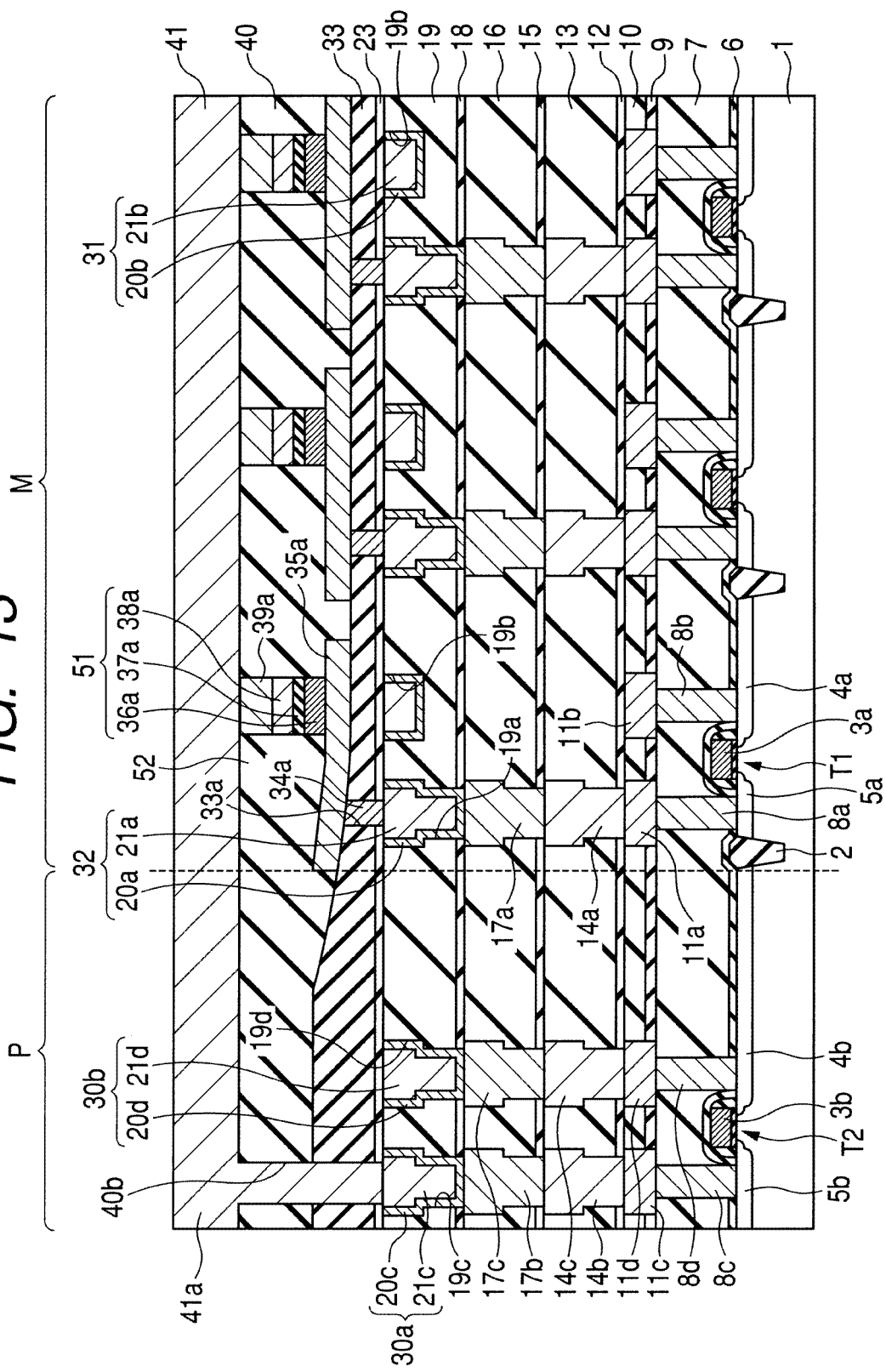
FIG. 13 is a cross-sectional view showing a step performed after the step shown in FIG. 12 in Embodiment 1.

Next, over the interlayer insulating film 40, a predetermined conductive layer (not shown) serving as the bit lines and wires is formed so as to fill each of the wire grooves 40a and the opening 40b. Then, as shown in FIG. 13, the conductive layer is subjected to a chemical mechanical polishing process so that the portion thereof located over the upper surface of the interlayer insulating film 40 is removed, and the bit lines 41 are formed in the wire grooves 40a in the memory cell region M. On the other hand, in the peripheral region P, the wire 41a is formed in the wire groove 40a. In this manner, the main portion of the semiconductor device is formed.

Figure 14:
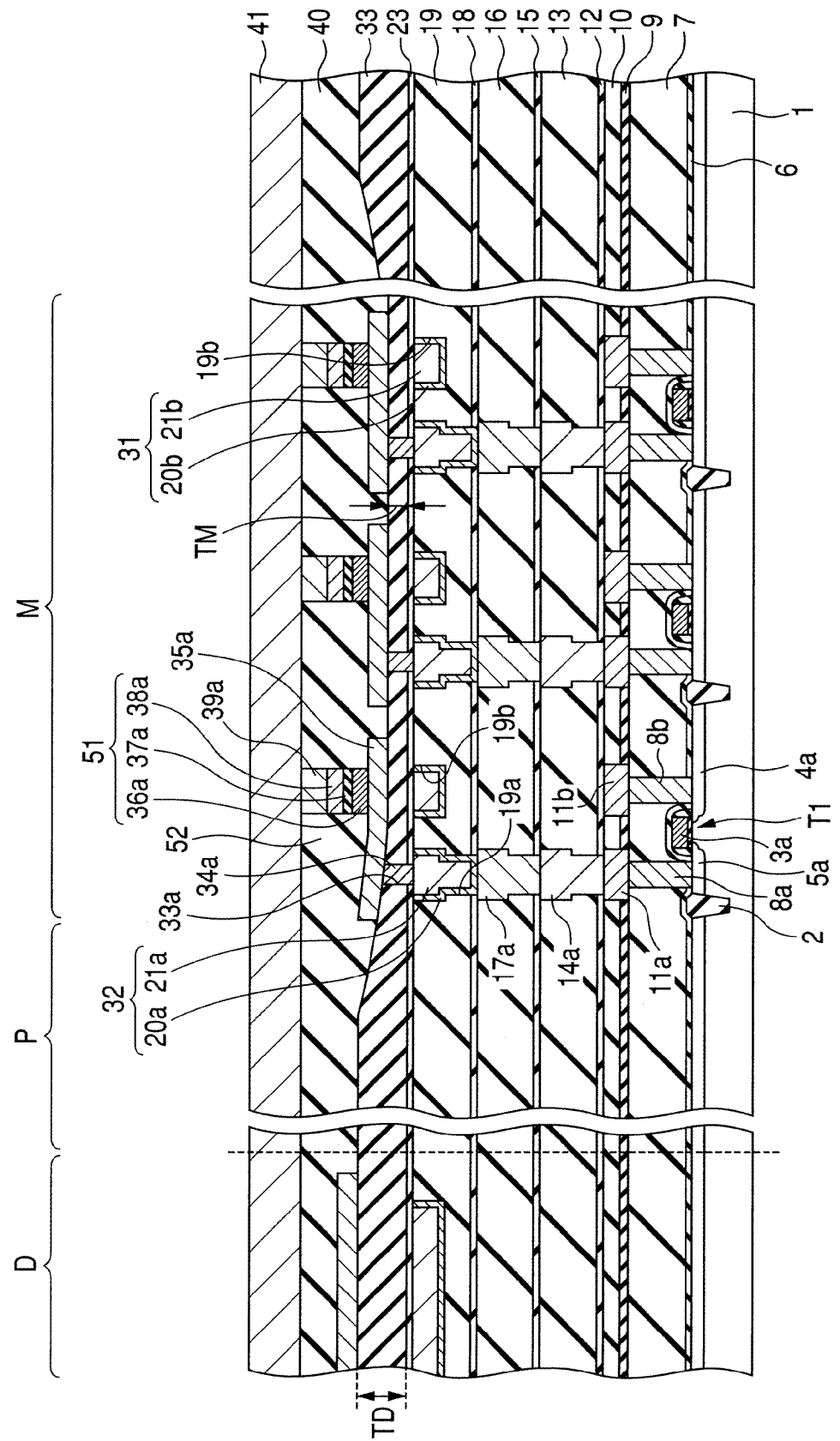
FIG. 14 is a cross-sectional view showing a step performed after the step shown in FIG. 13 in Embodiment 1.

The semiconductor device described above is formed such that the surface of the portion of the interlayer insulating film 33 located in the memory cell region M is at a position lower than that of the surface of the portion of the interlayer insulating film 33 located in the peripheral region P. Accordingly, as shown in FIG. 14, after final dicing is performed to provide the semiconductor devices, the thickness TD of the portion of the interlayer insulating film 33 left in a dicing region D and exposed at the end surface of the semiconductor substrate 1 or the like is larger than the thickness TM of the portion of the interlayer insulating film 33 located in the memory cell region M.

In addition, since the surface of the portion of the interlayer insulating film 33 located in the memory cell region M is at a position lower than that of the surface of the portion of the interlayer insulating film 33 located in the peripheral region P, after the portion of the interlayer insulating film 40 formed over the interlayer insulating film 33 is subjected to the polishing process, the portion of the interlayer insulating film 40 covering the magnetic resistor element 51 located at the end of the memory cell region M is prevented from becoming extremely thinner than the portion of the interlayer insulating film 40 covering the magnetic resistor elements 51 located more inward in the memory cell region M. Therefore, it is possible to inhibit the magnetic resistor element 51 of the memory cell located at the end of the memory cell region M from being damaged by etching when the wire grooves for forming the bit lines are formed or the like.

This will be described in relation to a comparative example. A semiconductor device according to the comparative example is formed as follows. First, through the same steps as shown in FIG. 4 described above, element selection transistors, predetermined interlayer insulating films, and predetermined conductive layers are formed over a semiconductor substrate. Then, as shown in FIG. 15, an interlayer insulating film 119 is formed over the semiconductor substrate 101. Note that, in FIG. 15, the structure between the interlayer insulating film 119 and the semiconductor substrate 101 is omitted for clear illustration.

In the interlayer insulating film 119, conductive layers 132 and digit lines 131 are formed. Then, over the interlayer insulating film 119, an etching stopper film 123 is formed so as to cover the conductive layer 132 and the digit lines 131 and, over the etching stopper film 123, an interlayer insulating film 133 is formed. Next, in each of the respective portions of the interlayer insulating film 133 and the etching stopper film 123 that are located in the memory cell region M, via holes 133a are formed to expose the conductive layer 132. Then, a conductive layer 134 is formed over the interlayer insulating film 133 in such a configuration as to fill each of the via holes 133a. The conductive layer 134 is formed in such a configuration that a barrier metal layer and a predetermined metal layer serving as plugs are stacked.

Figure 17:
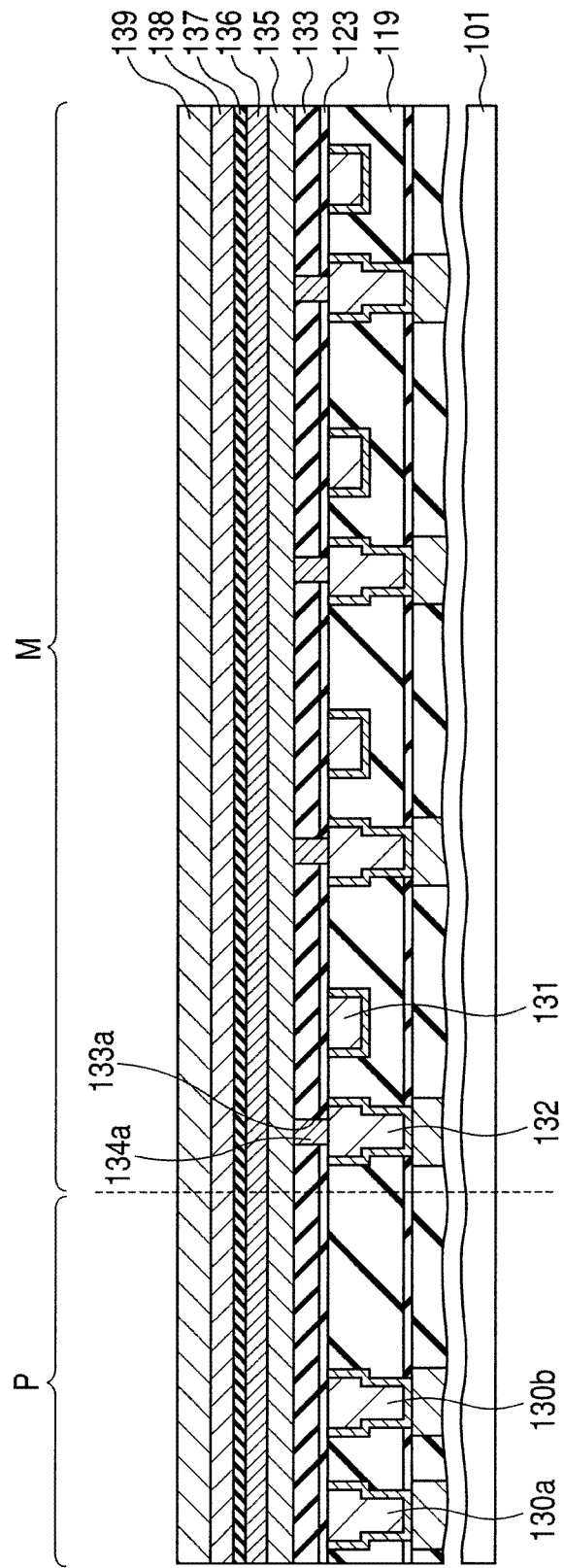
FIG. 17 is a cross-sectional view showing a step performed after the step shown in FIG. 16.

Next, as shown in FIG. 16, the conductive layer 134 is subjected to a chemical mechanical polishing process so that the portion thereof located over the upper surface of the interlayer insulating film 133 is removed, and conductive layers 134a are formed in the respective via holes 133a. Then, through the same steps as shown in FIG. 7, a conductive layer 135 serving as lead-out electrodes, a predetermined laminate film 136 serving as pin layers, a tunnel insulating film 137, a predetermined alloy film 138 serving as free layers, and a predetermined film 139 serving as cap layers are formed successively over the interlayer insulating film 133, as shown in FIG. 17.

Figure 18:
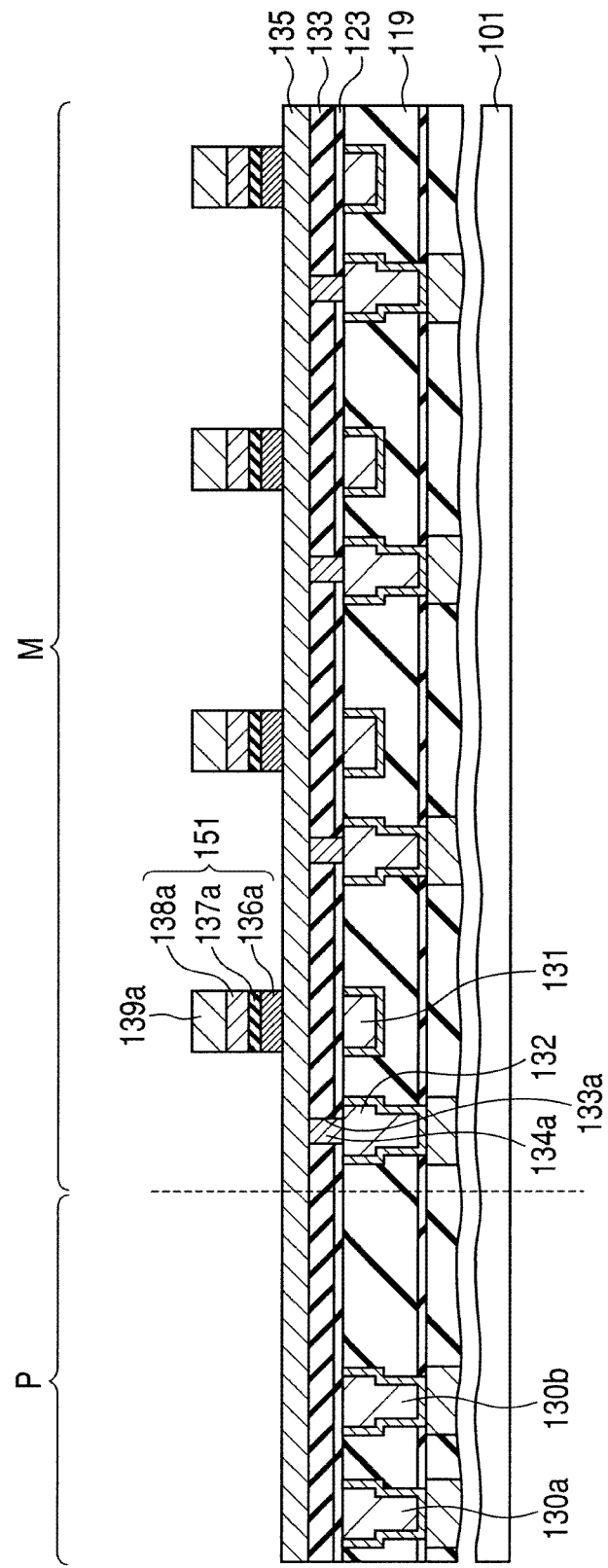
FIG. 18 is a cross-sectional view showing a step performed after the step shown in FIG. 17.

Next, over the predetermined film 139 serving as the cap layers, a resist pattern (not shown) for forming magnetic resistor elements by patterning is formed. Using the resist pattern as a mask, the predetermined film 139 serving as the cap layers, the metal film 138, the tunnel insulating film 137, and the laminate film 136 are etched and patterned into pin layers 136a, tunnel insulating films 137a, free layers 138a, and cap layers 139a to form magnetic resistor elements 151, as shown in FIG. 18.

Figure 19:
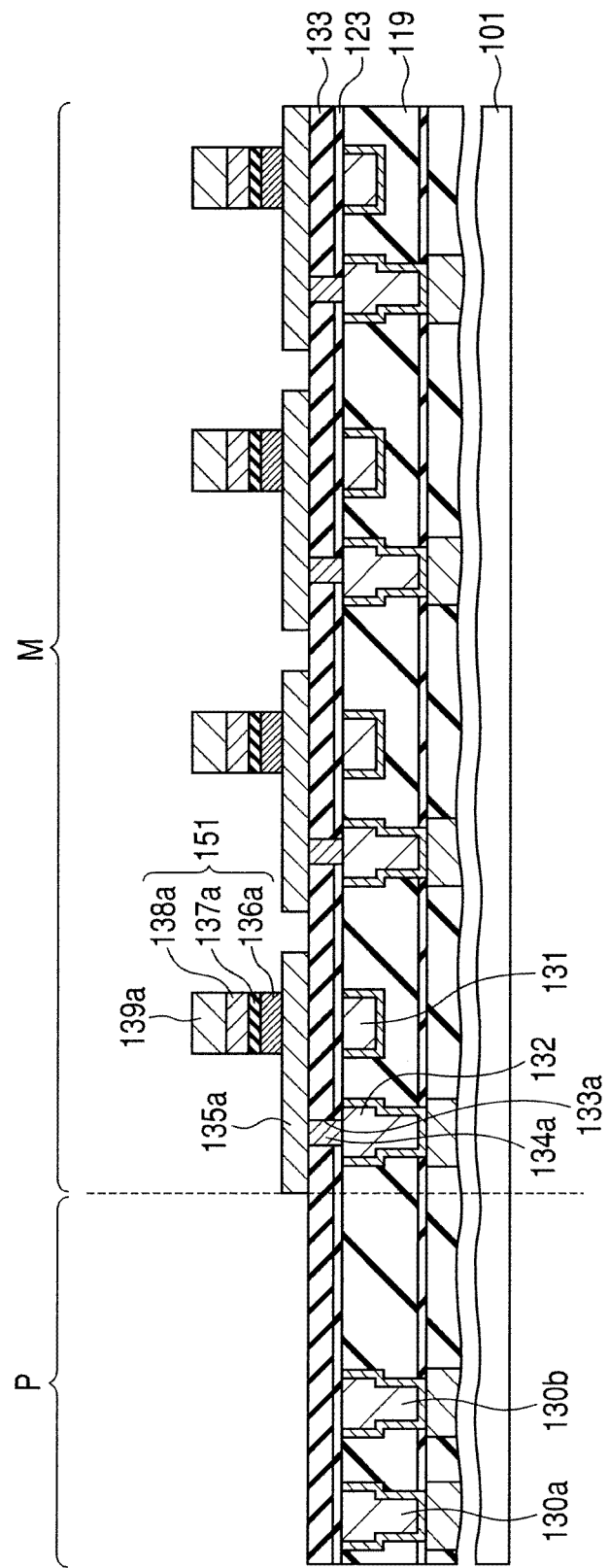
FIG. 19 is a cross-sectional view showing a step performed after the step shown in FIG. 18.

Next, over the conductive layer 135 serving as the lead-out electrodes, a resist pattern (not shown) for forming the lead-out electrodes by patterning is formed. Using the resist pattern as a mask, the conductive layer 135 is etched to form lead-out electrodes 135a, as shown in FIG. 19. This electrically isolates the individual magnetic resistor elements 151 from each other.

Figure 20:
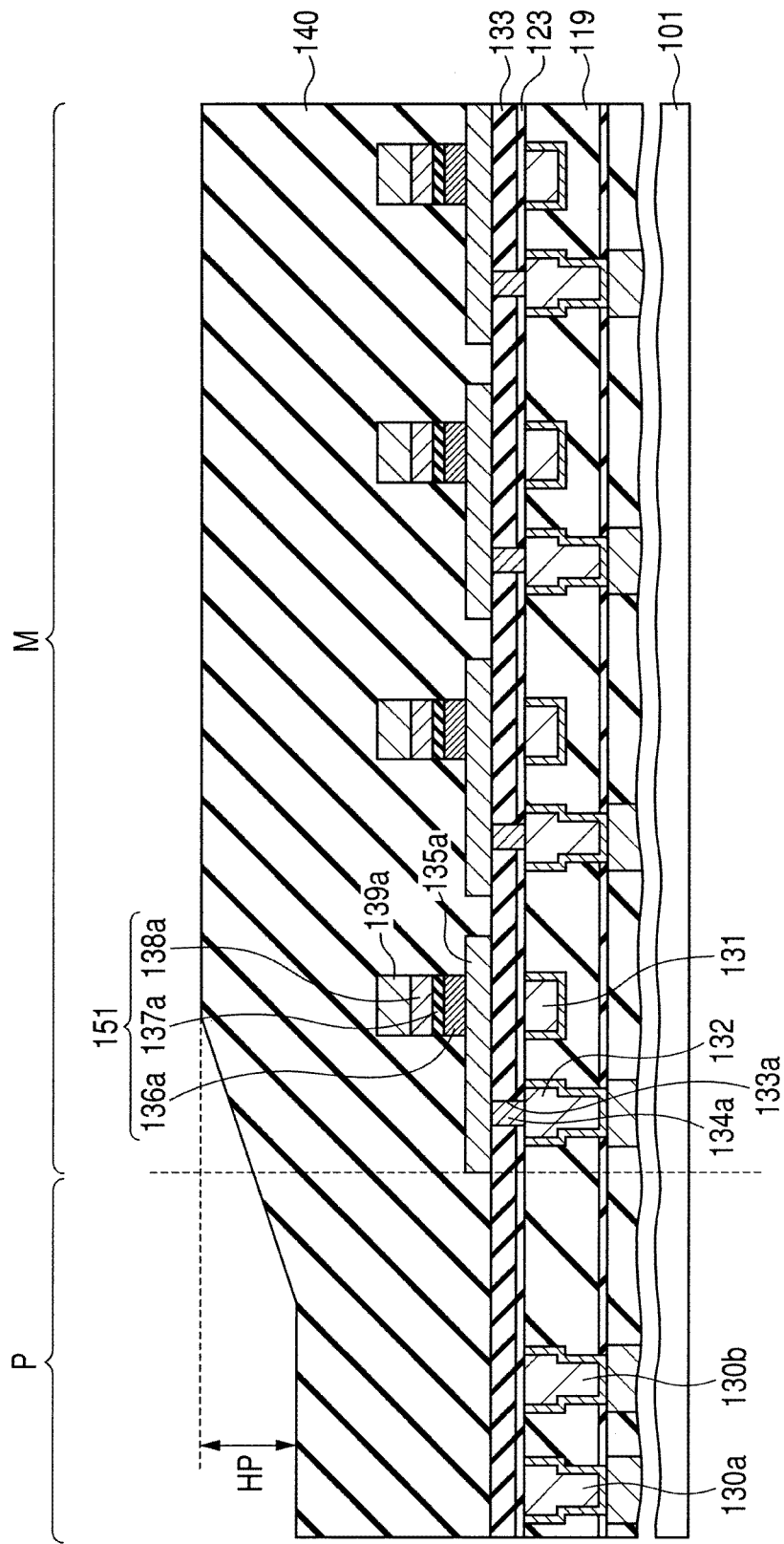
FIG. 20 is a cross-sectional view showing a step performed after the step shown in FIG. 19.

Next, as shown in FIG. 20, an interlayer insulating film 140 is formed over the interlayer insulating film 133 so as to cover the magnetic resistor elements 151. At this time, the surface of the portion of the interlayer insulating film 133 located in the memory cell region M is at substantially the same position (height) as that of the surface of the portion of the interlayer insulating film 133 located in the peripheral region P. Accordingly, in the interlayer insulating film 140 formed over the interlayer insulating film 133, the surface position of the portion of the interlayer insulating film 140 located in the memory cell region M is higher than the surface position of the portion of the interlayer insulating film 140 located in the peripheral region P due to the heights of the magnetic resistor elements 151, and the difference (HP) therebetween is about 100 to 150 nm.

Figure 21:
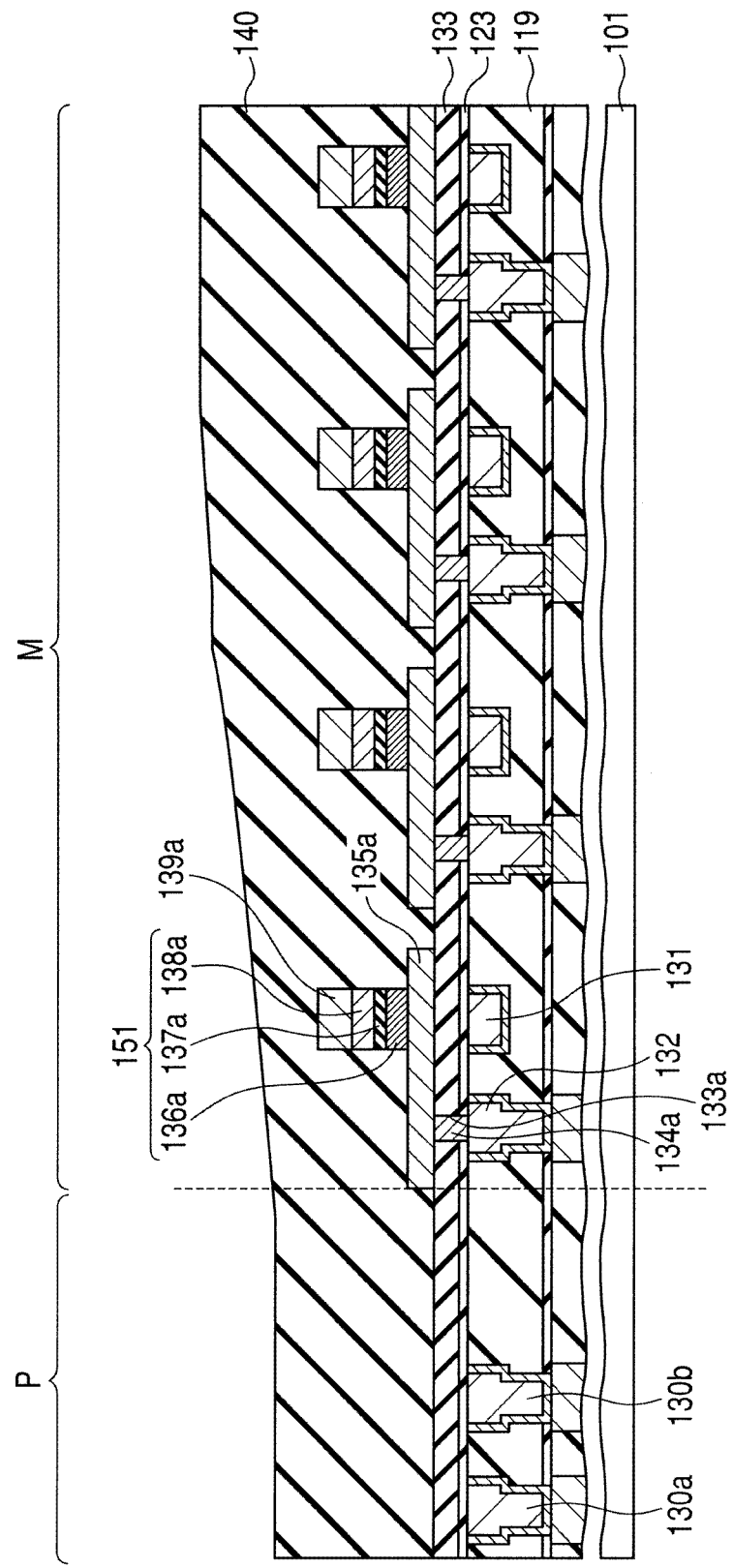
FIG. 21 is a cross-sectional view showing a step performed after the step shown in FIG. 20.

Next, as shown in FIG. 21, the interlayer insulating film 140 is subjected to a chemical mechanical polishing process, and thereby planarized. At this time, due to the difference (HP) between the surface position of the portion of the interlayer insulating film 140 located in the memory cell region M and the surface position of the portion of the interlayer insulating film 140 located in the peripheral region P, in the interlayer insulating film 140 after subjected to the polishing process, the portion of the interlayer insulating film 140 covering the magnetic resistor element 151 located at the end of the memory cell region M becomes thinner than the portion of the interlayer insulating film 140 covering the magnetic resistor elements 151 located more inward in the memory cell region M.

Figure 22:
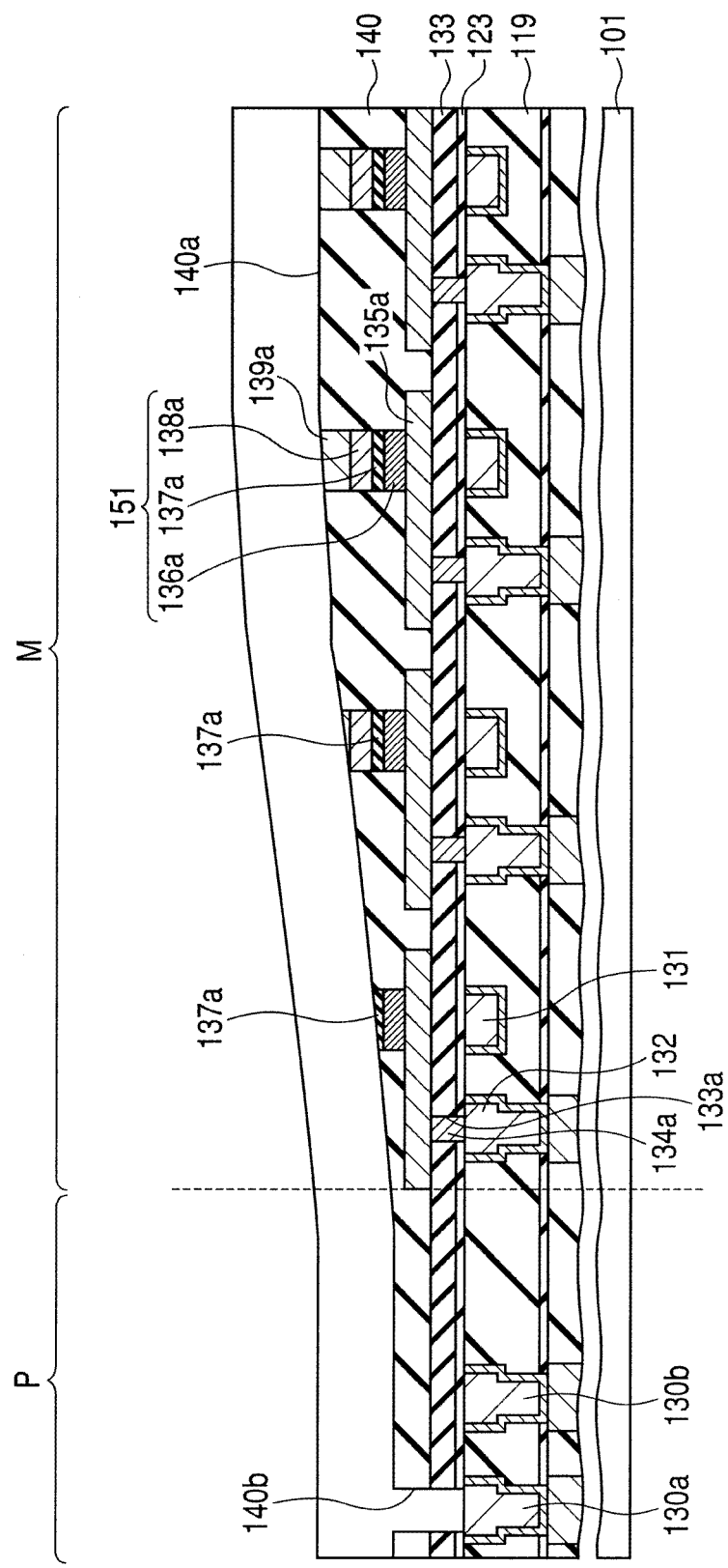
FIG. 22 is a cross-sectional view showing a step performed after the step shown in FIG. 21.

Next, over the interlayer insulating film 140, a resist pattern (not shown) for forming wire grooves and the like is formed. Using the resist pattern as a mask, the interlayer insulating film 140 and the like are etched so that wire grooves 140a for forming bit lines are formed in the memory cell region M to expose the cap layers 139a of the magnetic resistor elements 151, as shown in FIG. 22. On the other hand, in the peripheral region P, an opening 140b and a wire groove 140a are formed to expose the conductive layer 130a.

At this time, the portion of the interlayer insulating film 140 covering the magnetic resistor element 151 located at the end of the memory cell region M is thinner than the portion of the interlayer insulating film 140 covering the magnetic resistor elements 151 located more inward in the memory cell region M. Accordingly, the magnetic resistor elements 151 are prone to damage caused by etching when the wire grooves 140a are formed, and the tunnel insulating films 137a may be broken down by the damage.

Figure 23:
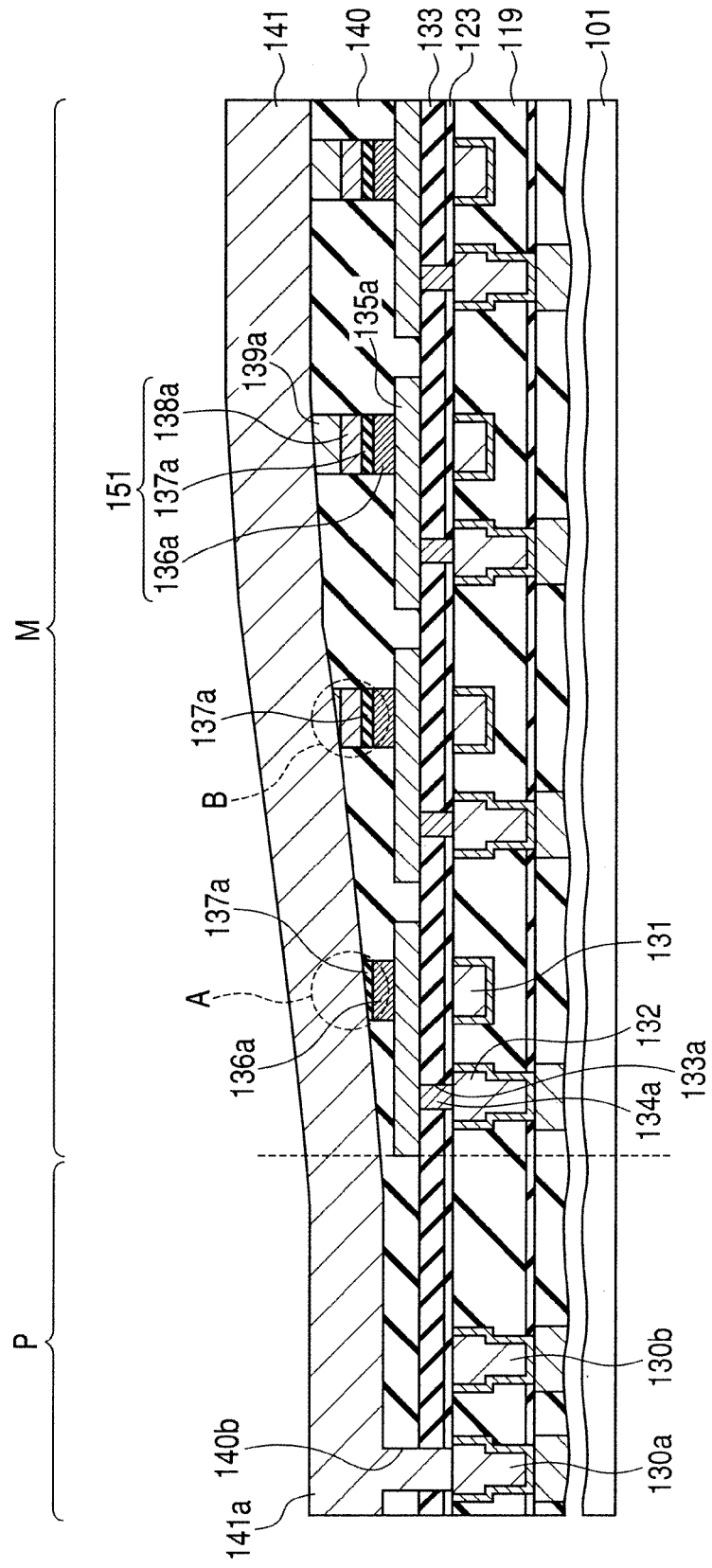
FIG. 23 is a cross-sectional view showing a step performed after the step shown in FIG. 22.

Next, over the interlayer insulating film 140, a predetermined conductive layer (not shown) serving as the bit lines and wires is formed so as to fill each of the wire grooves 140a and the opening 140b. The conductive layer is subjected to a chemical mechanical polishing process to form bit lines 141 in the wire grooves 140a in the memory cell region M, and form a wire 141a in the wire groove 140a in the peripheral region P, as shown in FIG. 23. In this manner, the semiconductor device according to the comparative example is formed.

In the semiconductor device according to the comparative example, the interlayer insulating film 133 is substantially flat. Accordingly, in the interlayer insulating film 140 formed over the interlayer insulating film 133, the surface of the portion of the interlayer insulating film 140 located in the memory cell region M is at a position higher than that of the surface of the portion of the interlayer insulating film 140 located in the peripheral region P due to the heights of the magnetic resistor elements 151, and the level difference (HP) therebetween is relatively large.

Therefore, even when the interlayer insulating film 140 is subjected to the polishing process to reduce the level difference, planarization is limited. In particular, the portion of the interlayer insulating film 140 covering the magnetic resistor element 151 located at the end of the memory cell region M becomes thinner than the portion of the interlayer insulating film 140 covering the magnetic resistor elements 151 located more inward in the memory cell region M. If the interlayer insulating film 140 in this state is subjected to etching for forming the wire grooves 140a, the tunnel insulating films 137a of the magnetic resistor elements 151 may be broken down. Also, the tunnel insulating films 137a may be damaged by sputtering when the bit lines 141 are formed.

Then, as shown in the broken line circle A of FIG. 23, the bit line 141 and the pin layer 136a may be electrically short-circuited, and the magnetic resistor element 151 may not function as a memory cell. Even when the tunnel insulating film 137a is not broken down, as shown in the broken line circle B, the damage caused by etching may reach the vicinity of the tunnel insulating film 137a. In such a case also, the magnetic resistor element 151 may not function as a memory cell.

It can be considered that, in addition to such damage caused by etching, a stress resulting from the polishing process may probably give damage. That is, it can be considered that, due to a relatively large level difference between the surface of the portion of the interlayer insulating film 140 located in the memory cell region M and the surface of the portion of the interlayer insulating film 140 located in the peripheral region P, a stress occurring when the interlayer insulating film 140 is subjected to the chemical mechanical polishing process may probably be localized particularly to the magnetic resistor element 151 located at the end of the memory cell region M, and give damage to the tunnel insulating film 137a.

Figure 24:
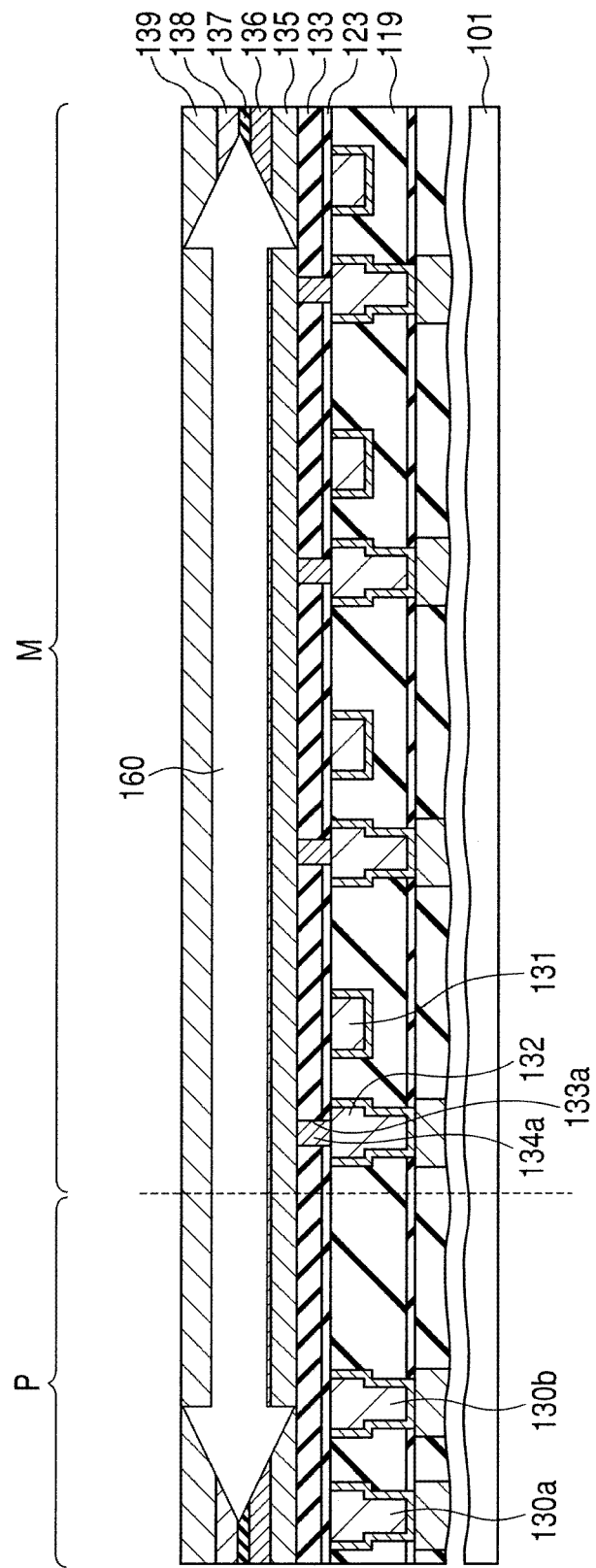
FIG. 24 is a first cross-sectional view for illustrating the problem of the semiconductor device according to the comparative example.

It can be further considered that a membrane stress in each of the layers forming the magnetic resistor element may probably give distortion to the tunnel insulating film. The laminate film 136 serving as the pin layers, the tunnel insulating film 37, the alloy film 38 serving as the free layers, and the predetermined film 39 serving as the cap layers are mainly formed by a sputtering method. As shown in FIG. 24, the laminate film 136 formed by the sputtering method and the like have a relatively high membrane stress, as indicated by the arrow 160.

Figure 25:
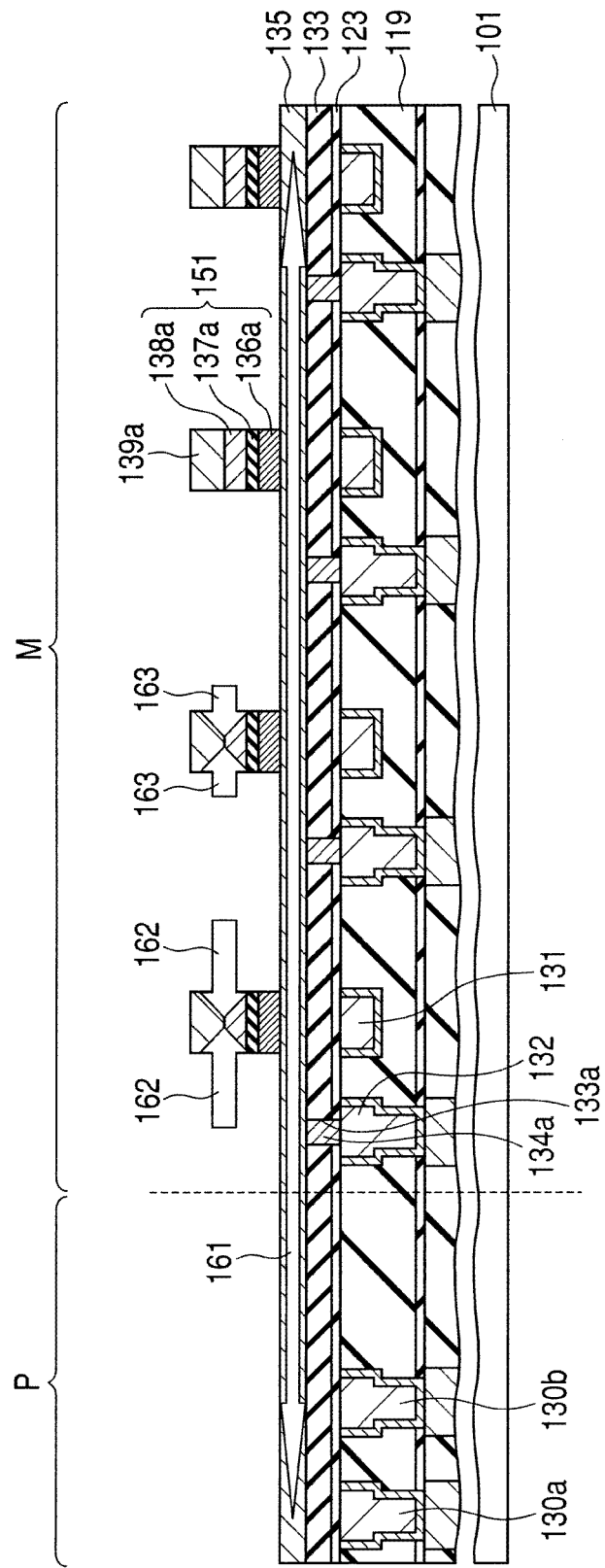
FIG. 25 is a second cross-sectional view for illustrating the problem of the semiconductor device according to the comparative example.

When the laminate film 136 and the like having such a high membrane stress are etched and patterned into the magnetic resistor elements, the stress is released. At this time, as shown in FIG. 25, the conductive layer 135 serving as the lead-out electrodes still remains to be patterned while, in the peripheral region P, the laminate film 136 and the like are entirely removed and lost. Therefore, it can be considered that a change in the membrane stress (arrow 161) in the portion of the conductive layer 135 located in the peripheral region P from which the laminate film 136 and the like have been removed particularly affects the membrane stress in the magnetic resistor element located in the vicinity of the peripheral region P, i.e., in the MTJ element located at the end of the memory cell region M. As a result, it can be considered that a change in the membrane stress (arrow 162) in the magnetic resistor element located at the end of the memory cell region M is larger than a change in the membrane stress (arrow 163) in each of the magnetic resistor elements located more inward, and the stress change may probably cause the breakdown of the tunnel insulating film of the magnetic resistor element.

Figure 26:
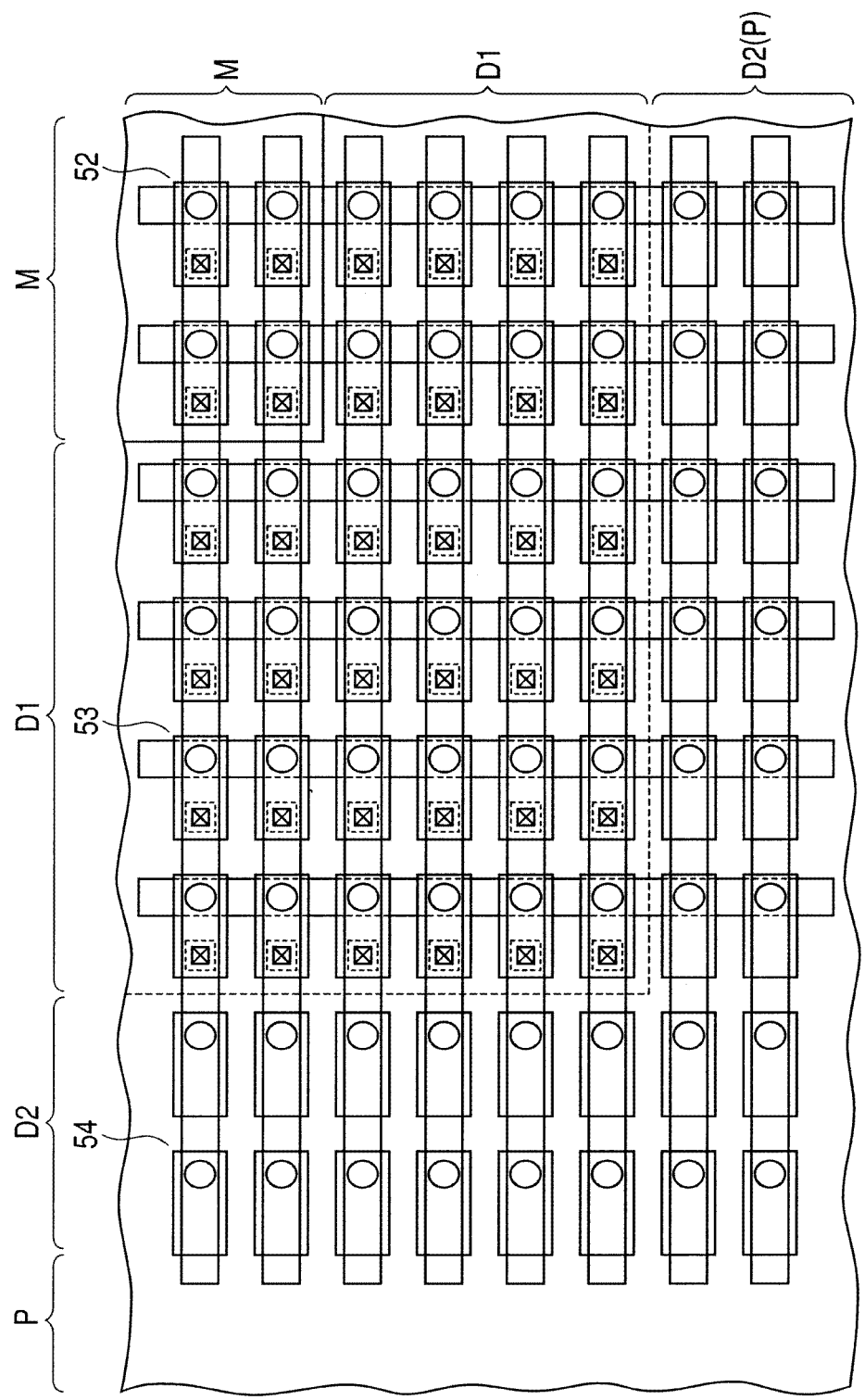
FIG. 26 is a plan view showing an example of a two-dimensional configuration of the semiconductor device according to the comparative example.

Accordingly, in the semiconductor device according to the comparative example, such a memory cell cannot perform its intrinsic function, and has no choice but to be used as a dummy memory cell, as shown in FIG. 26. It follows therefore that the regions D1 and D2 for such dummy memory cells 53 and are disposed so as to surround the periphery of the inherent memory cell region M where each of the memory cells performs its intrinsic function, which also serves as a factor inhibiting the miniaturization of the semiconductor device.

Figure 27:
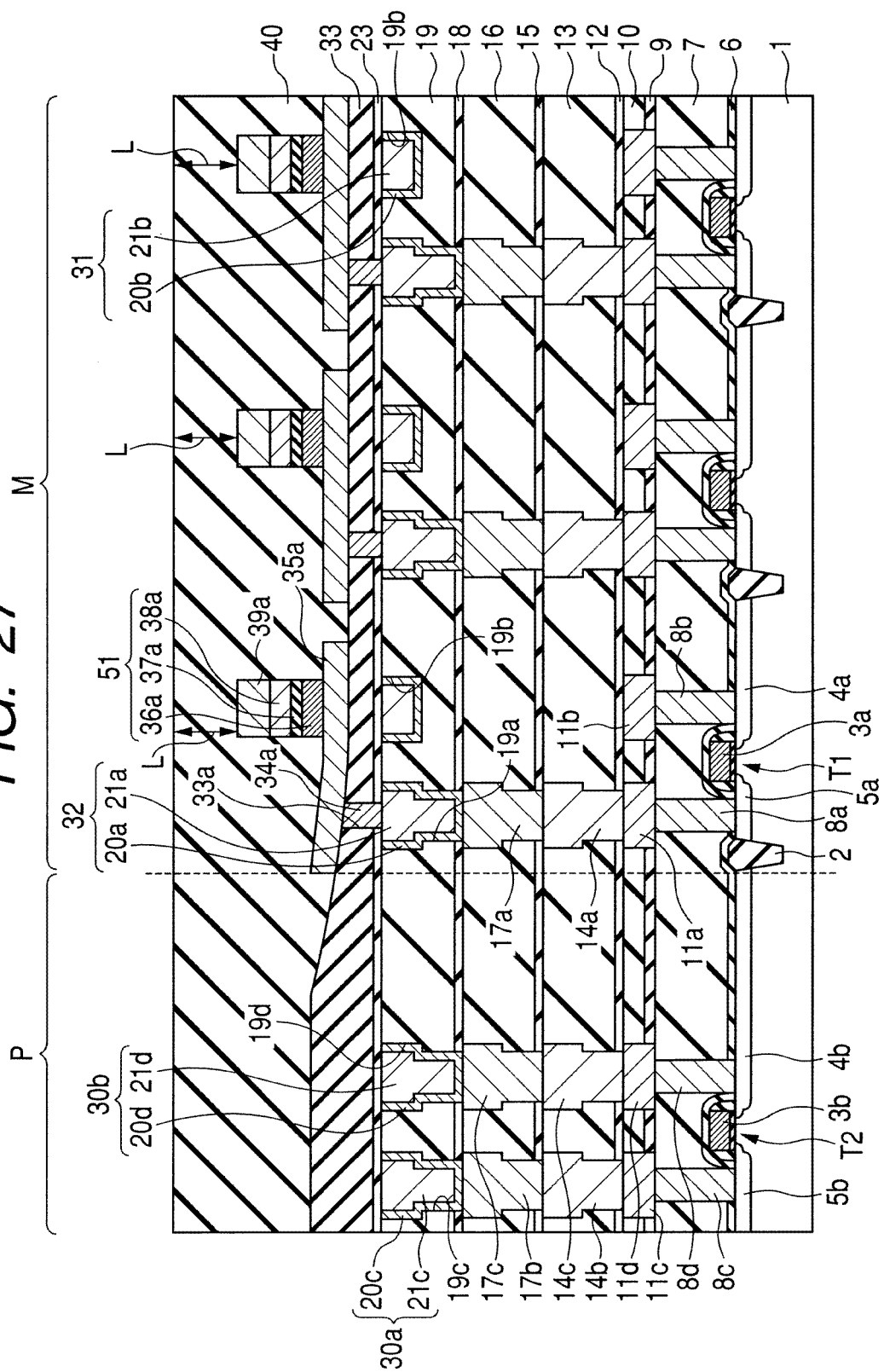
FIG. 27 is a first cross-sectional view for illustrating an operation and effect in Embodiment 1.

The semiconductor device described above as compared to the semiconductor device according to the comparative example is formed such that the surface of the portion of the interlayer insulating film 33 located in the memory cell region M is at a position lower than that of the surface of the portion of the interlayer insulating film 33 located in the peripheral region P. Accordingly, as shown in FIG. 27, after the interlayer insulating film 40 formed over the interlayer insulating film 33 is subjected to the polishing process, the portion of the interlayer insulating film 40 covering the magnetic resistor element 51 located at the end of the memory cell region M is prevented from becoming extremely thinner than the portion of the interlayer insulating film 40 covering the magnetic resistor elements 51 located more inward in the memory cell region M. The individual portions of the interlayer insulating film 40 covering the magnetic resistor elements 51 have substantially the same thickness L throughout the entire memory cell region M.

Figure 28:
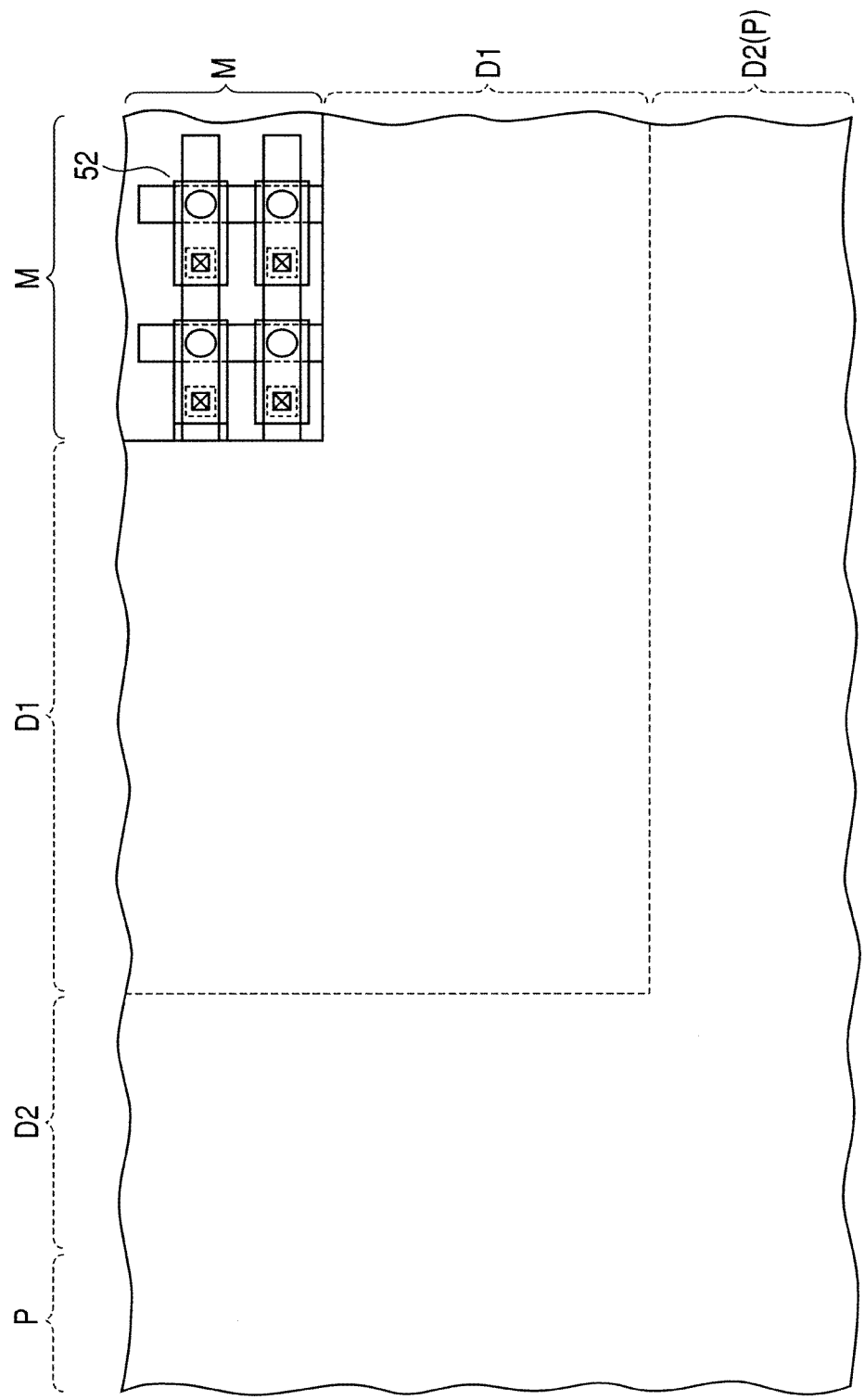
FIG. 28 is a plan view showing a two-dimensional configuration for illustrating the operation and effect in Embodiment 1.

Therefore, it is possible to inhibit the magnetic resistor element of the memory cell located at the end of the memory cell region M from being excessively damaged by the etching when the wire grooves for forming the bit lines are formed or the like, or damaged by sputtering when the bit lines are formed. As a result, it is possible to particularly inhibit the dielectric breakdown of the tunnel insulating film of the magnetic resistor element 51 located at the end of the memory cell region M. In addition, the number of dummy cells which do not function as memories can be reduced compared with that of the dummy cells in the semiconductor device according to the comparative example. Moreover, as shown in FIG. 28, it is also possible to eliminate the regions (regions D1 and D2) where the dummy cells are formed.

Figure 29:
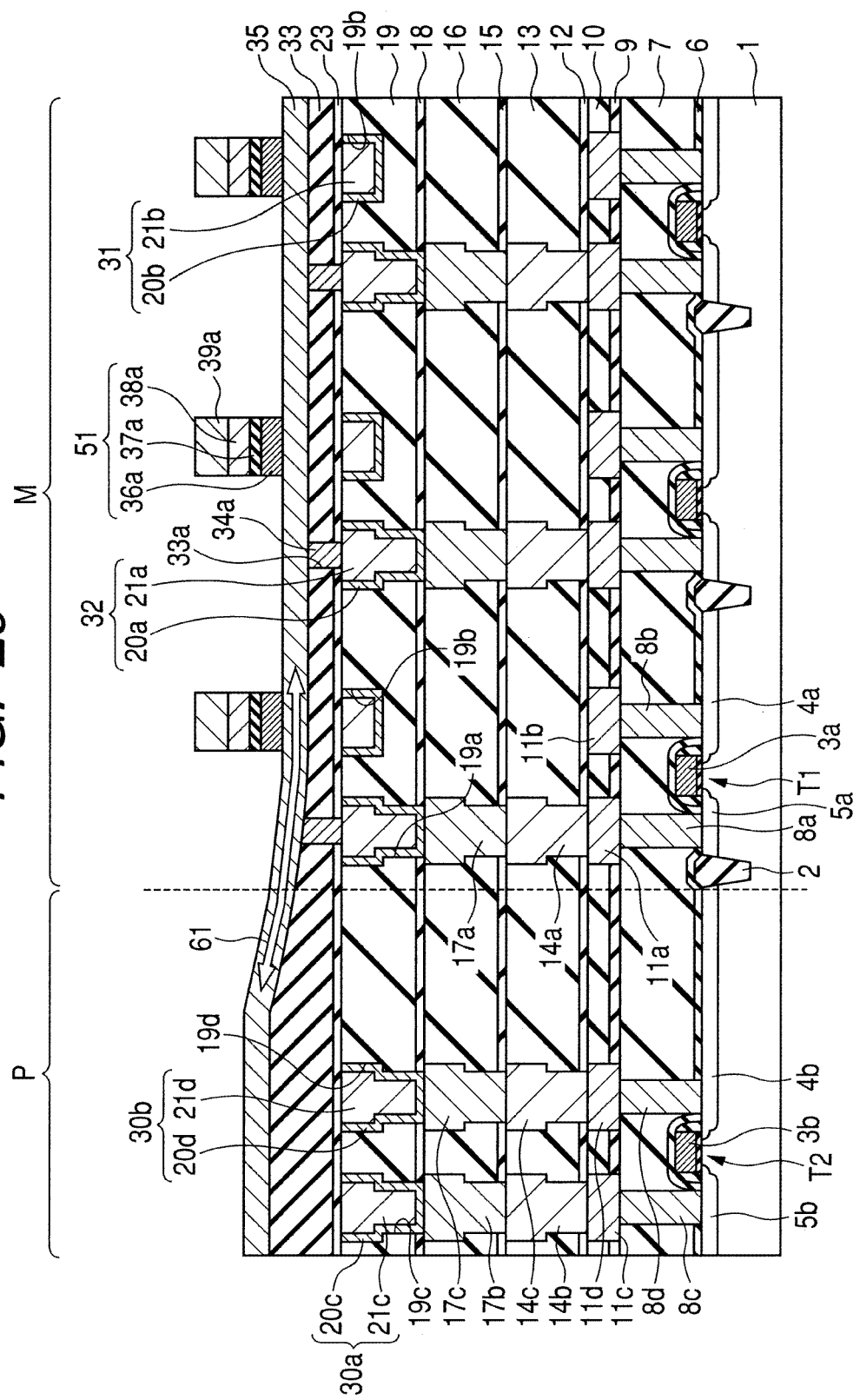
FIG. 29 is a second cross-sectional view for illustrating the operation and effect in Embodiment 1.

Also, the interlayer insulating film 33 is subjected to the polishing process so that the surface of the portion thereof located in the memory cell region M is smoothly coupled to the surface of the portion thereof located in the peripheral region P, as shown in FIG. 29. In particular, the interlayer insulating film 33 is formed such that the surface thereof downwardly protrudes in an area extending from the boundary portion between the peripheral region P and the memory cell region M to the memory cell located at the end of the memory cell region M.

With the interlayer insulating film 33 being formed to downwardly protrude, the membrane stress in the conductive layer 35 formed thereover to serve as the lead-out electrodes is reduced. That is, by being formed to downwardly protrude, the interlayer insulating film 33 can have a compression stress. The compression stress can reduce a tensile strain (arrow 61) in the conductive layer 35 formed over the interlayer insulating film 33, and further reduce the membrane stress in each of the layers forming the magnetic resistor elements formed over the conductive layer 35. As a result, it is also possible to inhibit the dielectric breakdown of the tunnel insulating films resulting from the membrane stresses.

Embodiment 2

Here, a description will be given to a technique in which the surface of the portion of the interlayer insulating film located in the memory cell region is set by etching at a position lower than that of the surface of the portion of the interlayer insulating film located in the peripheral region.

Figure 30:
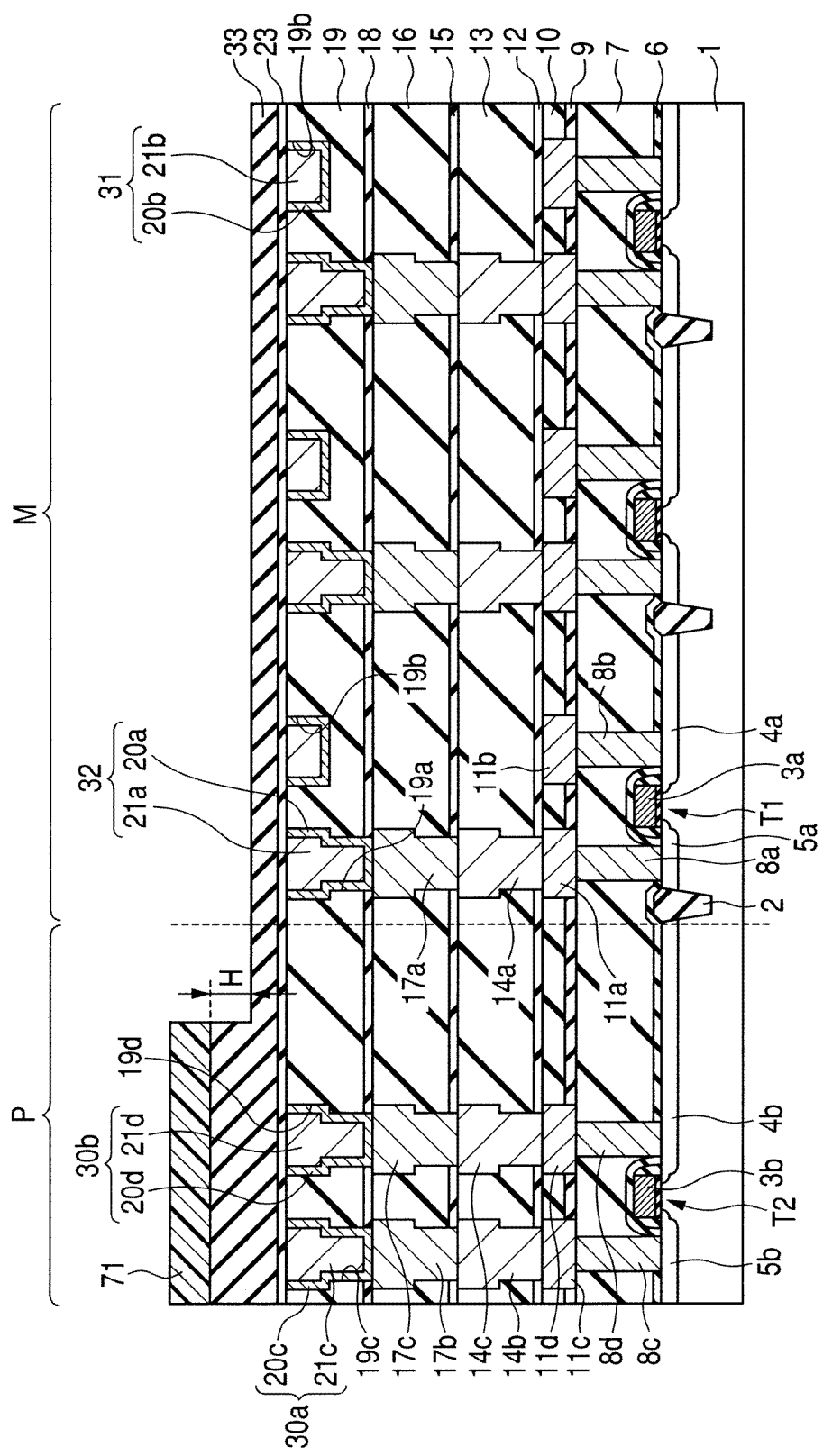
FIG. 30 is a cross-sectional view showing a step of a method of manufacturing a semiconductor device according to Embodiment 2 of the present invention.

In the steps shown in FIG. 4 described above, the etching stopper film 23 is formed so as to cover the interlayer insulating film 19, and the interlayer insulating film 33 is formed over the etching stopper film 23. Then, as shown in FIG. 30, a resist pattern 71 is formed so as to expose the portion of the interlayer insulating film 33 located in the memory cell region M and cover the portion thereof located in the peripheral region P. Using the resist pattern 71 as a mask, the portion of the interlayer insulating film 33 located in the memory cell region M is etched to have the surface thereof set at a position lower than that of the surface of the portion of the interlayer insulating film 33 located in the peripheral region P. Note that, in FIG. 30 and the like, the same members as those of the semiconductor device described in Embodiment 1 are provided with the same reference numerals.

Figure 31:
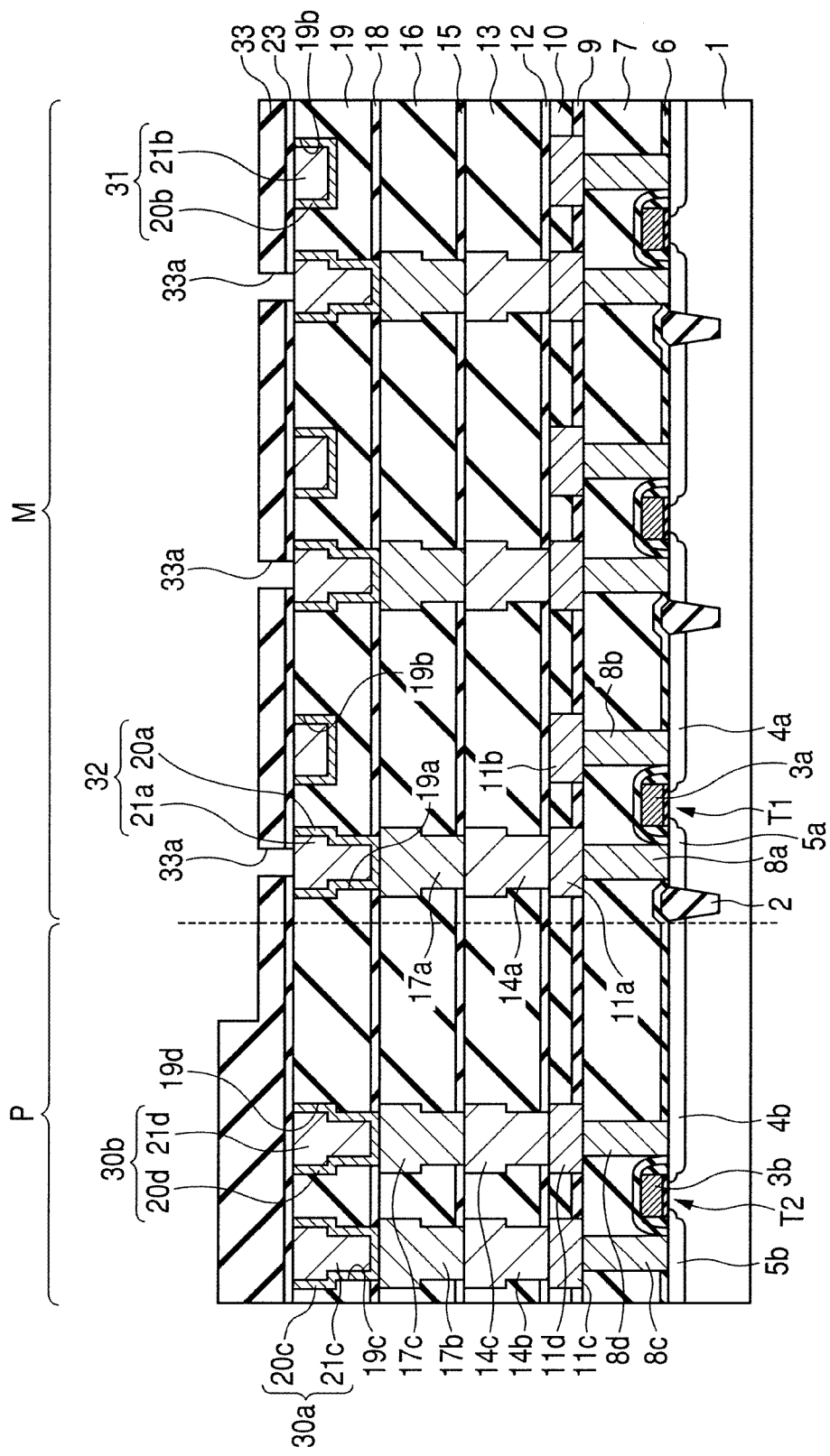
FIG. 31 is a cross-sectional view showing a step performed after the step shown in FIG. 30 in Embodiment 2.
Figure 32:
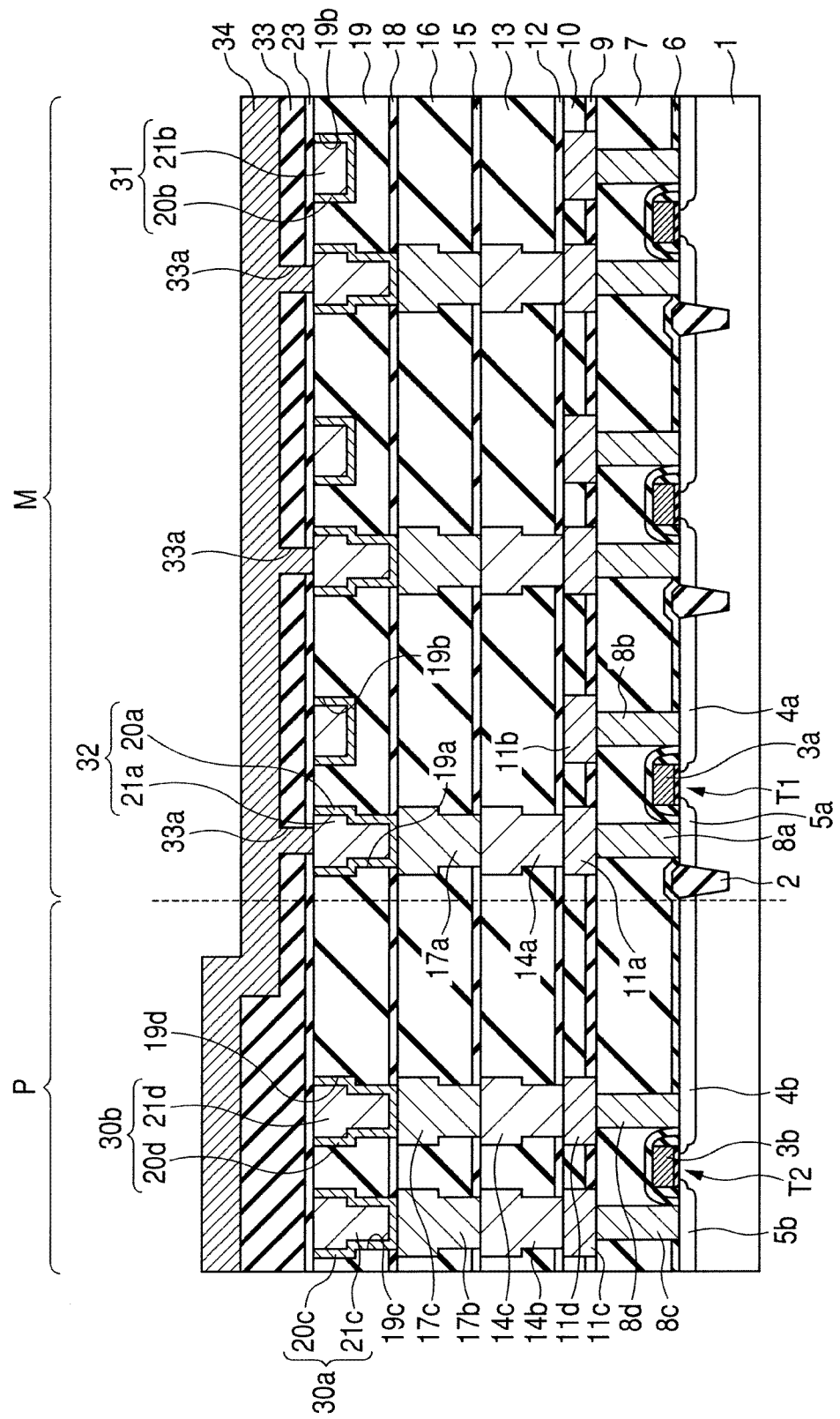
FIG. 32 is a cross-sectional view showing a step performed after the step shown in FIG. 31 in Embodiment 2.
Figure 33:
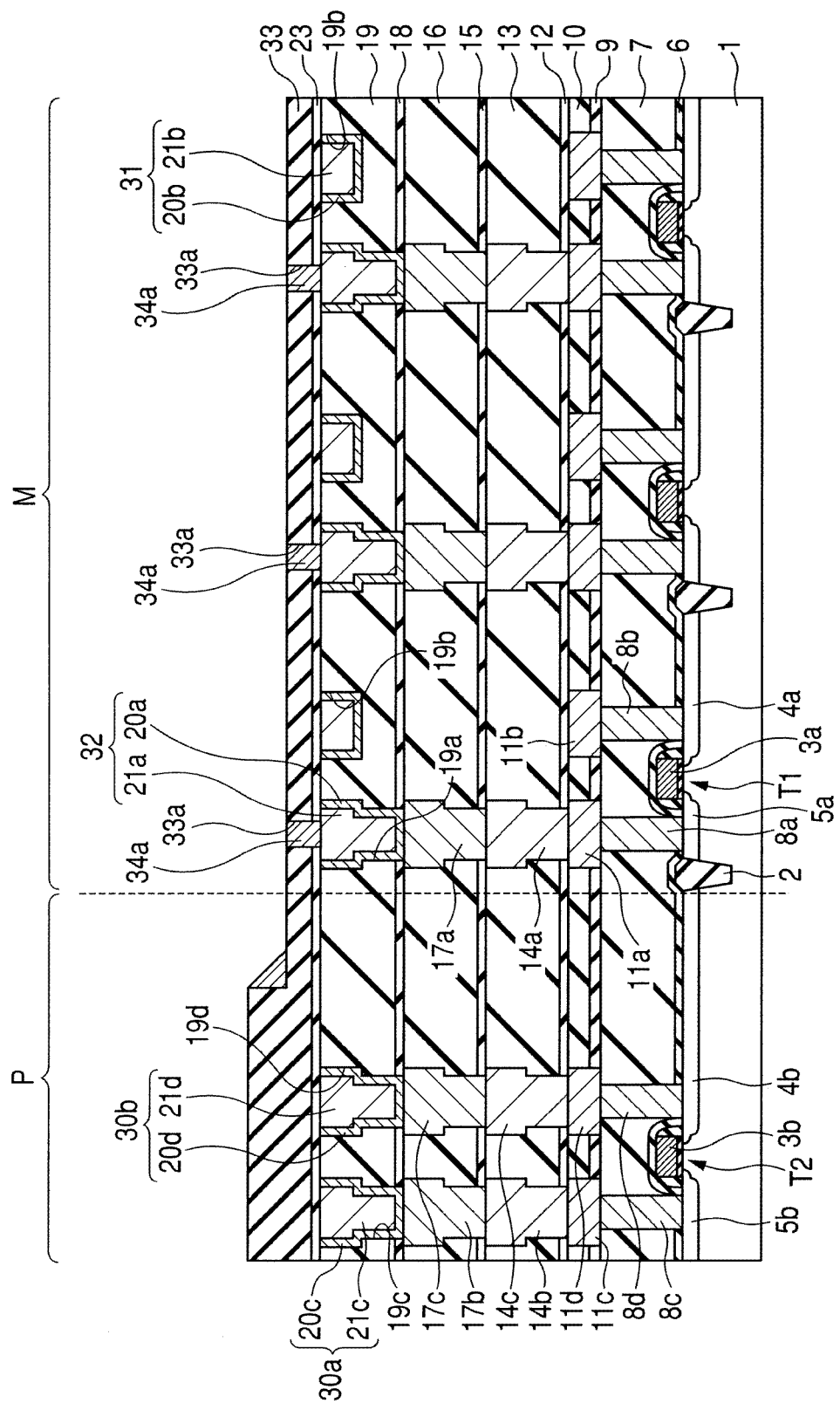
FIG. 33 is a cross-sectional view showing a step performed after the step shown in FIG. 32 in Embodiment 2.

Next, as shown in FIG. 31, the via holes 33a are formed in the portion of the interlayer insulating film 33 located in the memory cell region M to expose the conductive layer 32. Then, as shown in FIG. 32, the conductive layer 34 is formed over the interlayer insulating film 33 in such a configuration as to fill each of the via holes 33a. The conductive layer 34 is formed in such a configuration that a barrier metal layer and a predetermined metal layer serving as plugs are stacked. Then, as shown in FIG. 33, the entire surface of the conductive layer 34 is etched so that the portion thereof located over the upper surface of the interlayer insulating film 33 is removed, and the conductive layers 34a as the plugs are formed in the respective via holes 33a.

Figure 34:
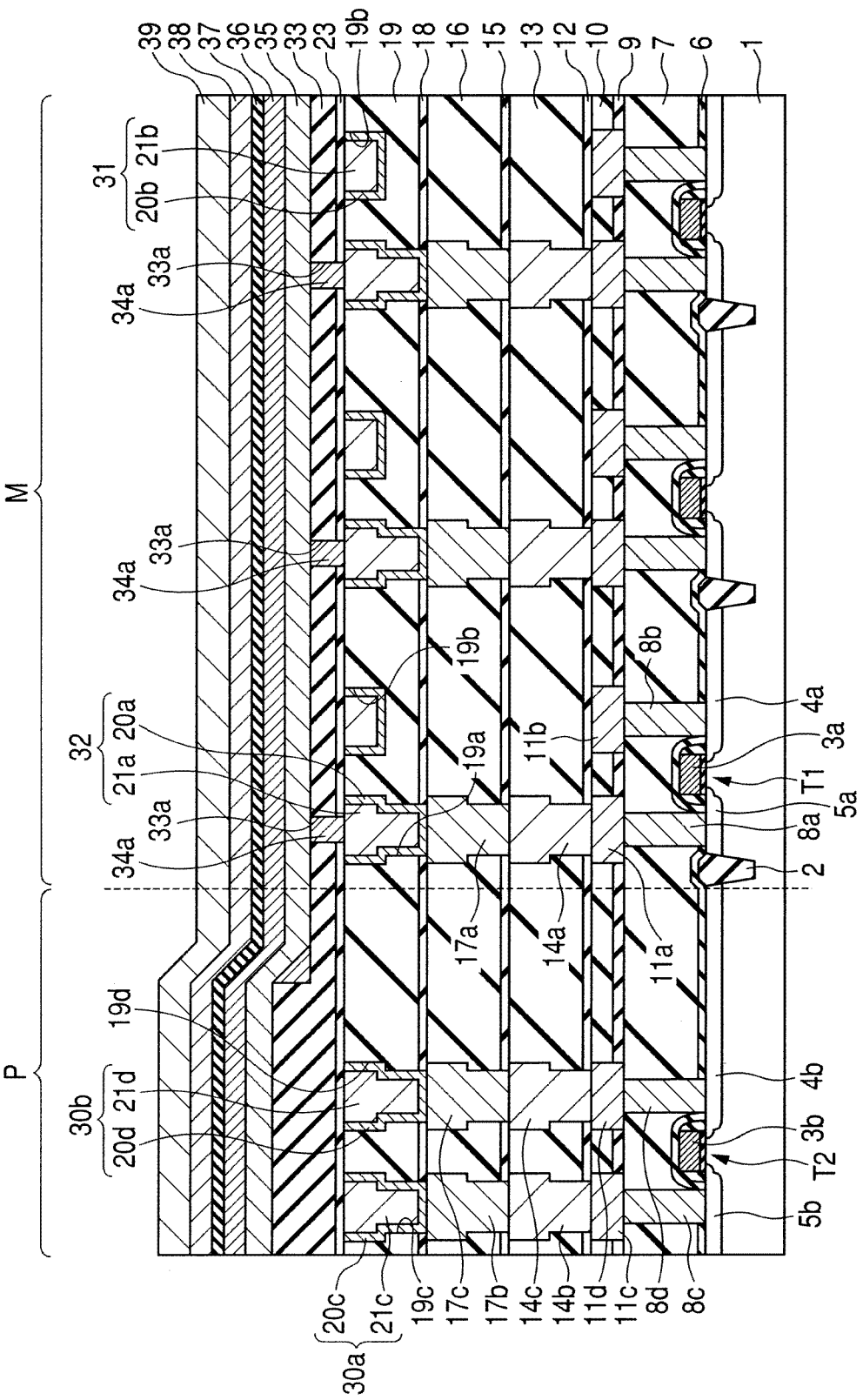
FIG. 34 is a cross-sectional view showing a step performed after the step shown in FIG. 33 in Embodiment 2.

Next, in the same manner as in the step shown in FIG. 7, the conductive layer 35 serving as lead-out electrodes is formed over the interlayer insulating film 33, as shown in FIG. 34. Then, over the conductive layer 35, the predetermined laminate film 36 serving as pin layers, the tunnel insulating film 37, and the predetermined alloy film 38 serving as free layers are successively formed. Then, over the alloy film 38, the predetermined film 39 serving as cap layers is formed. Then, over the predetermined film 39 serving as the cap layers, a resist pattern (not shown) for forming magnetic resistor elements by patterning is formed.

Figure 35:
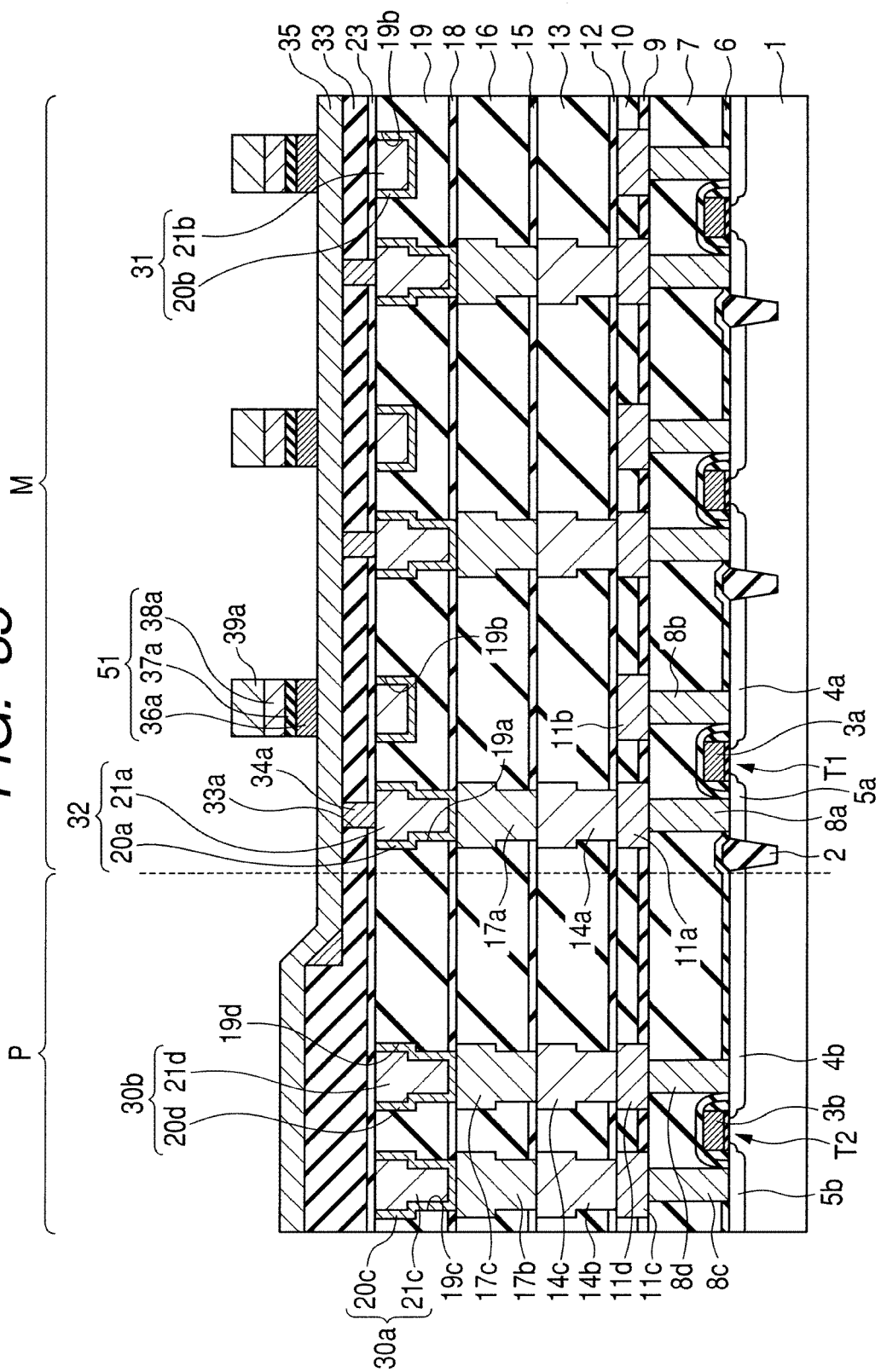
FIG. 35 is a cross-sectional view showing a step performed after the step shown in FIG. 34 in Embodiment 2.

Next, using the resist pattern as a mask, the predetermined film 39 serving as the cap layers, the metal film 38, the tunnel insulating film 37, and the laminate film are etched and patterned into the pin layers 36a, the tunnel insulating films 37a, the free layers 38a, and the cap layers 39 to form the magnetic resistor elements 51, as shown in FIG. 35.

Figure 36:
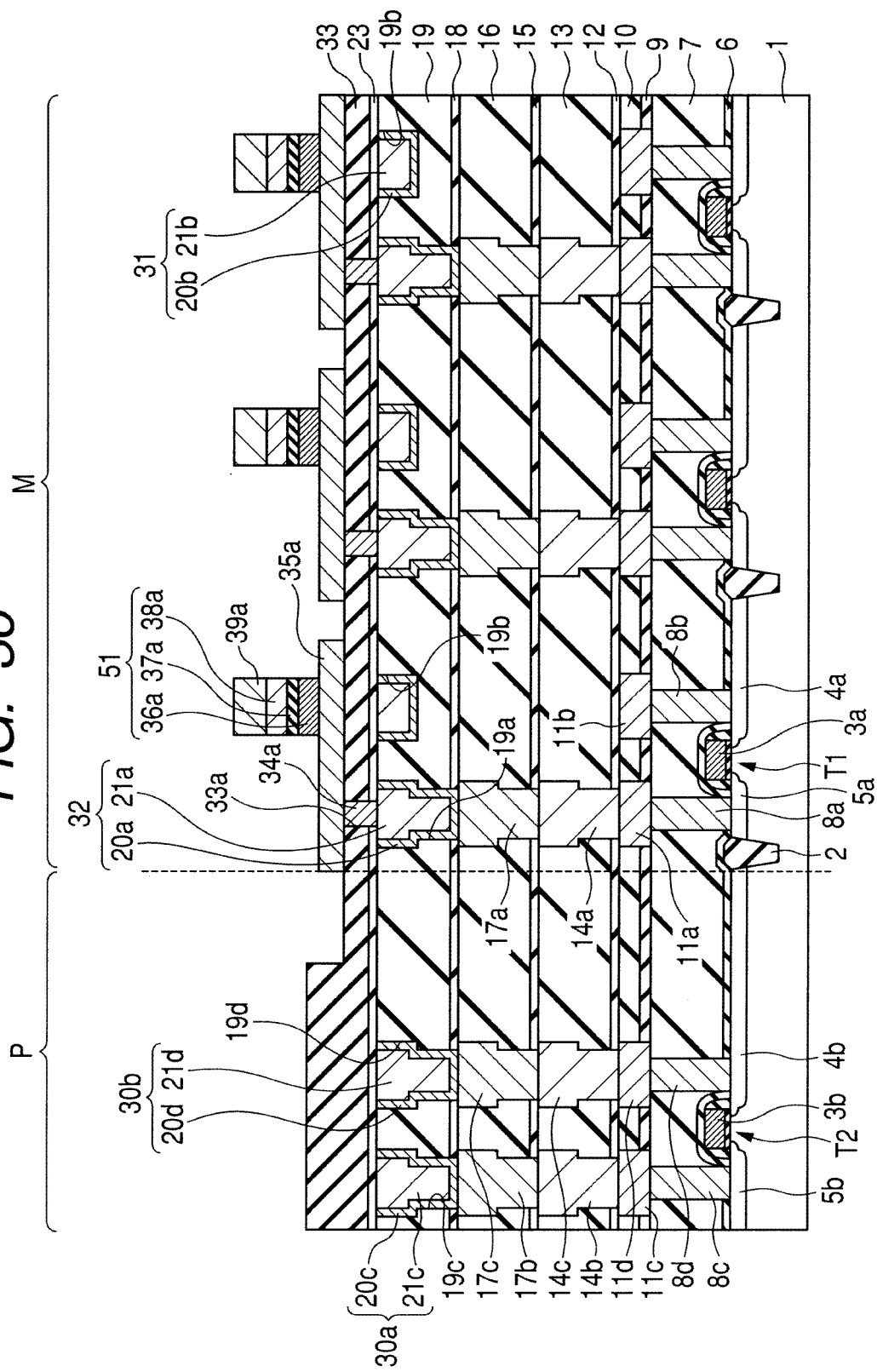
FIG. 36 is a cross-sectional view showing a step performed after the step shown in FIG. 35 in Embodiment 2.

Next, over the conductive layer 35 serving as the lead-out electrodes, a resist pattern (not shown) for forming the lead-out electrodes by patterning is formed. Using the resist pattern as a mask, the conductive layer 35 is etched to form the lead-out electrodes 35a, as shown in FIG. 36. This electrically isolates the individual magnetic resistor elements 51 from each other.

Figure 37:
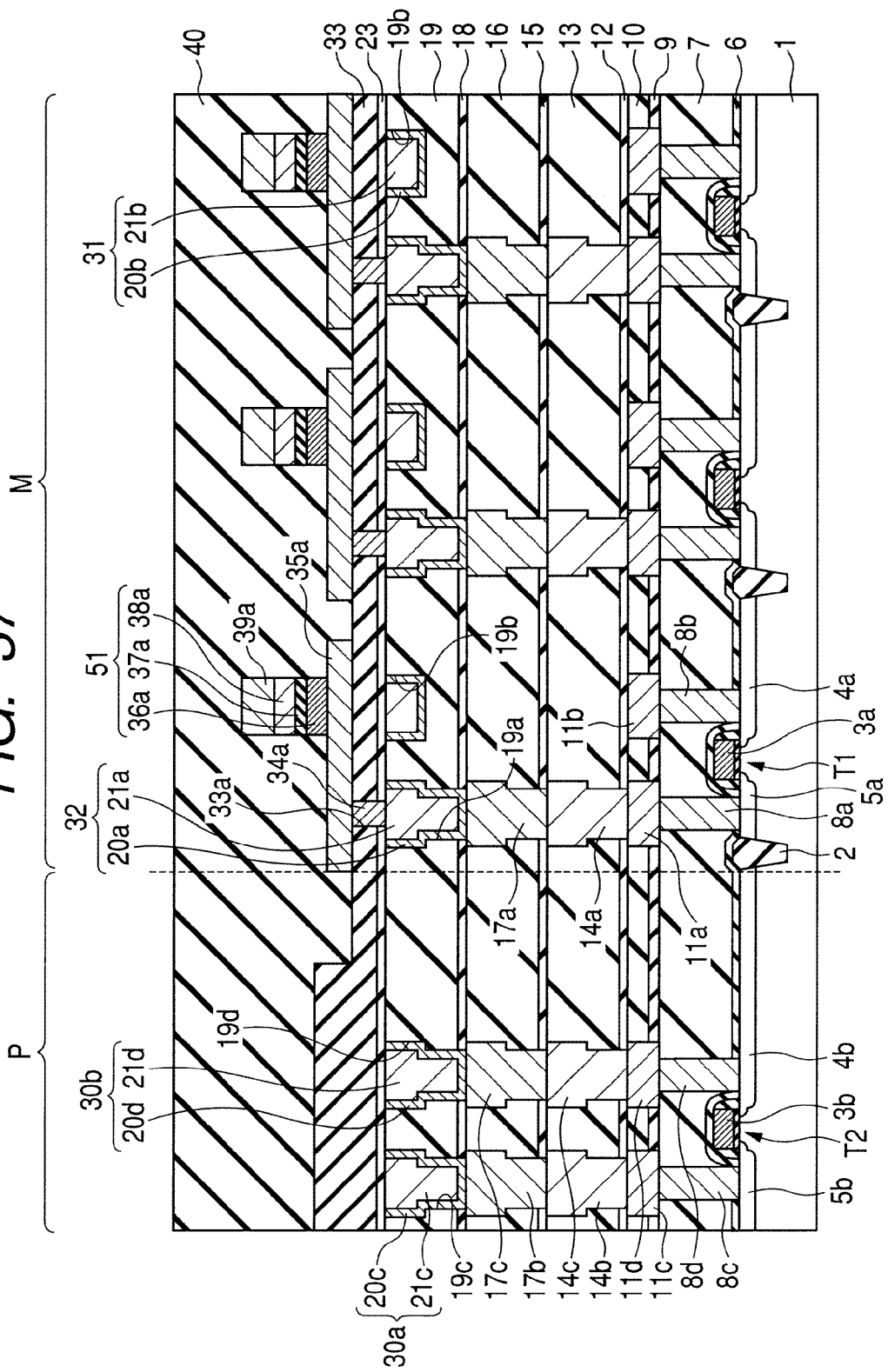
FIG. 37 is a cross-sectional view showing a step performed after the step shown in FIG. 36 in Embodiment 2.

Next, over the interlayer insulating film 33, the interlayer insulating film 40 is formed so as to cover the magnetic resistor elements 51 (see FIG. 37). At this time, the surface position of the portion of the interlayer insulating film 33 located in the memory cell region M is lower than the surface position of the portion of the interlayer insulating film 33 located in the peripheral region P. Accordingly, in the interlayer insulating film 40 formed over the interlayer insulating film 33, the difference between the surface position of the portion of the interlayer insulating film 40 located in the memory cell region M and the surface position of the portion of the interlayer insulating film 40 located in the peripheral region P is reduced.

Next, as shown in FIG. 37, the interlayer insulating film is subjected to a chemical mechanical polishing process, and thereby planarized. At this time, the difference between the surface position of the portion of the interlayer insulating film 40 located in the memory cell region M and the surface position of the portion of the interlayer insulating film 40 located in the peripheral region P has been reduced. Accordingly, in the interlayer insulating film 40 after subjected to the polishing process, the portion of the interlayer insulating film 40 covering the magnetic resistor element 51 located at the end of the memory cell region M is prevented from becoming extremely thinner than the portion of the interlayer insulating film 40 covering the magnetic resistor elements 51 located more inward in the memory cell region M.

Figure 38:
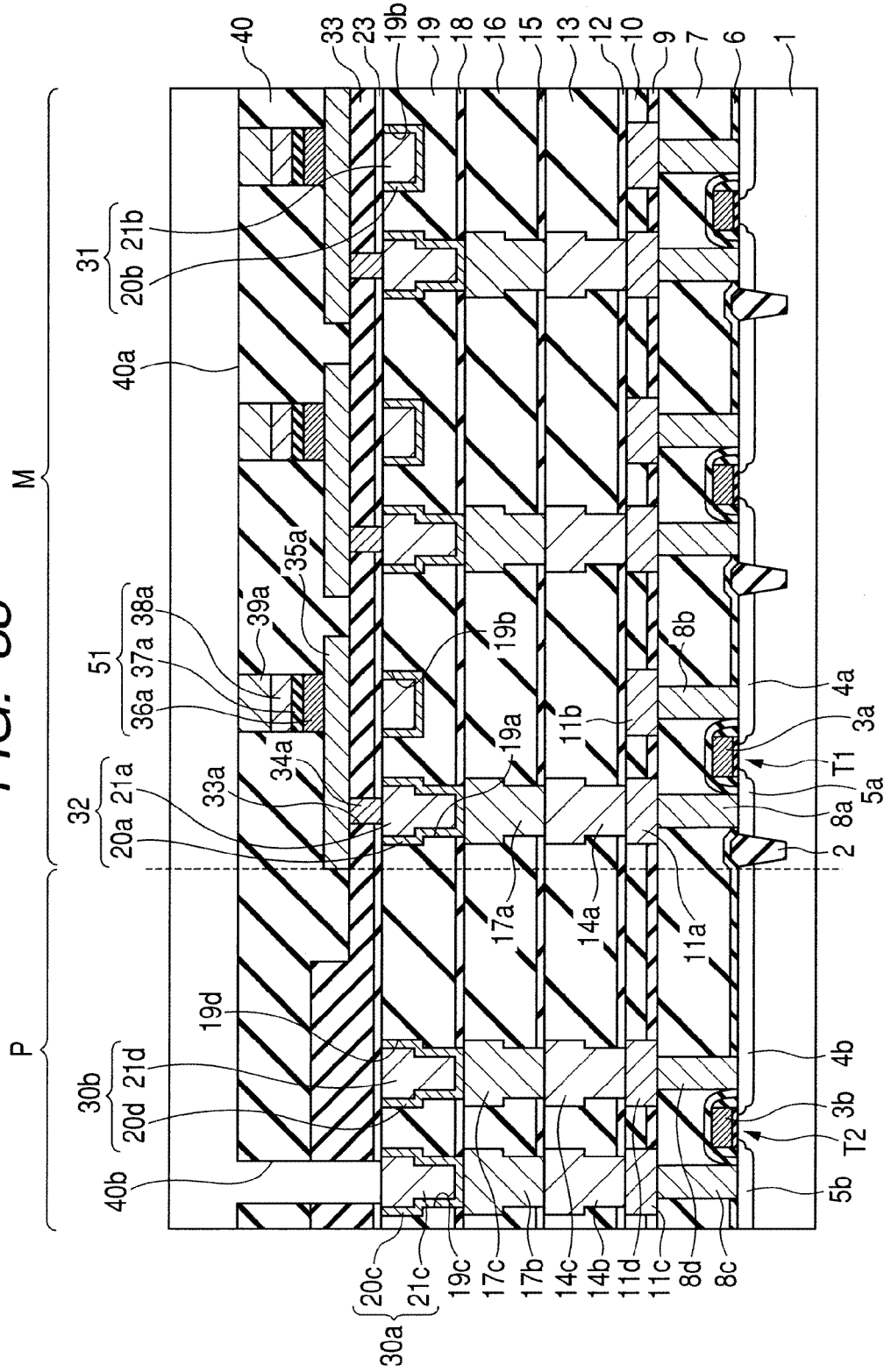
FIG. 38 is a cross-sectional view showing a step performed after the step shown in FIG. 37 in Embodiment 2.
Figure 39:
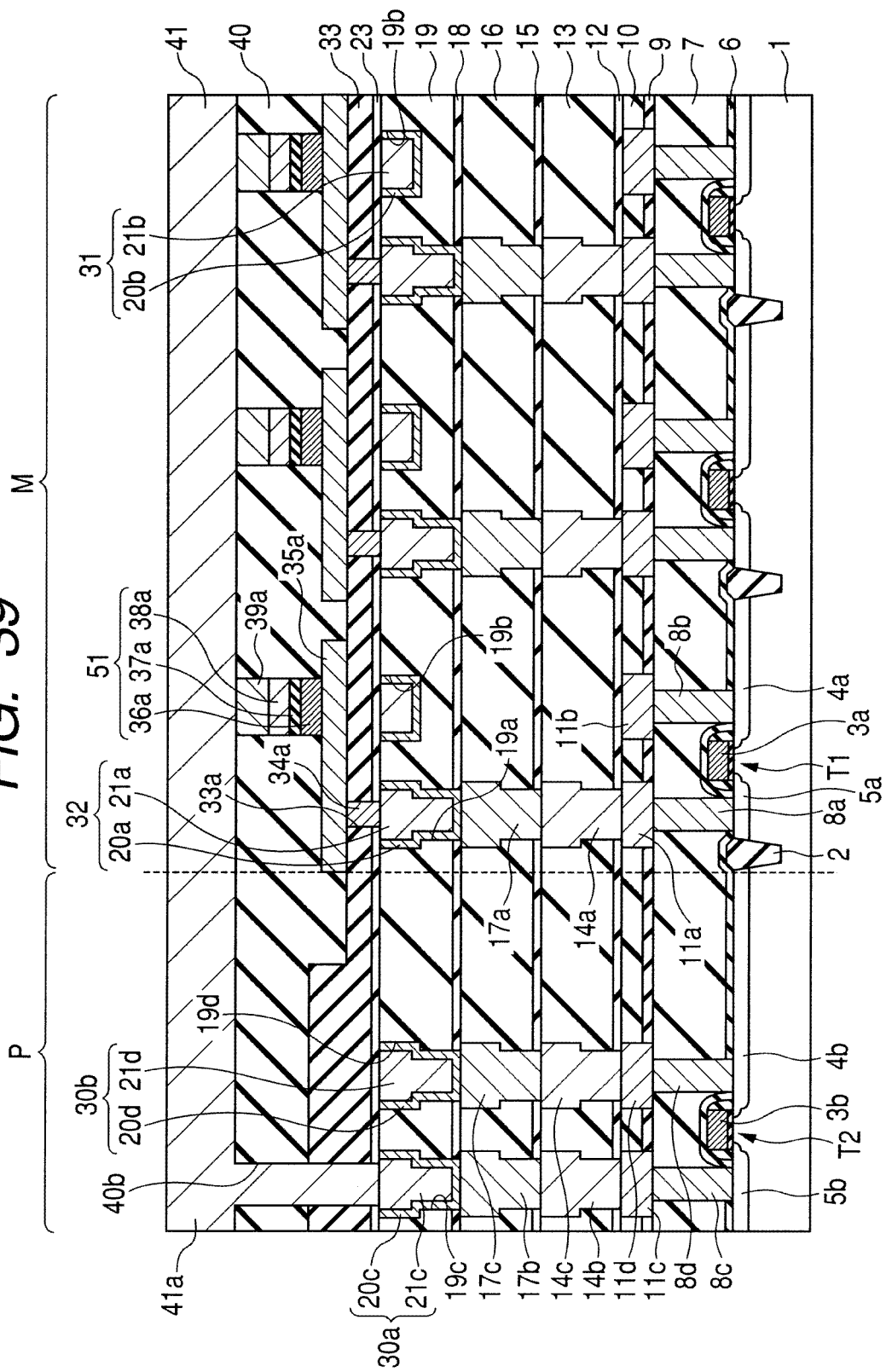
FIG. 39 is a cross-sectional view showing a step performed after the step shown in FIG. 38 in Embodiment 2.

Next, over the interlayer insulating film 40, a resist pattern (not shown) for forming wire grooves is formed. Using the resist pattern as a mask, the interlayer insulating film is etched so that the wire grooves 40a for forming bit lines are formed in such a configuration as to expose the cap layers 39a of the magnetic resistor elements 51, as shown in FIG. 38. Next, over the interlayer insulating film 40, a predetermined conductive layer (not shown) serving as the bit lines is formed so as to fill each of the wire grooves 40a. Then, as shown in FIG. 39, the conductive layer is subjected to a chemical mechanical polishing process so that the portion thereof located over the upper surface of the interlayer insulating film 40 is removed, and the bit lines 41 are formed in the wire grooves 40a. In this manner, the main portion of the semiconductor device is formed.

In the semiconductor device described above also, the surface of the portion of the interlayer insulating film 33 located in the memory cell region M is at a position lower than that of the surface of the portion of the interlayer insulating film 33 located in the peripheral region P in the same manner as in the previously described semiconductor device according to Embodiment 1. Accordingly, after the portion of the interlayer insulating film 40 formed over the interlayer insulating film 33 is subjected to the polishing process, the portion of the interlayer insulating film 40 covering the magnetic resistor element 51 located at the end of the memory cell region M is prevented from becoming extremely thinner than the portion of the interlayer insulating film 40 covering the magnetic resistor elements 51 located more inward in the memory cell region M. This inhibits the magnetic resistor element 51 of the memory cell located at the end of the memory cell region M from being damaged by etching when wire grooves for forming the bit lines are formed or the like. As a result, it is possible to reduce short circuit failures in the magnetic resistor elements 51 and the like.

Figure 40:
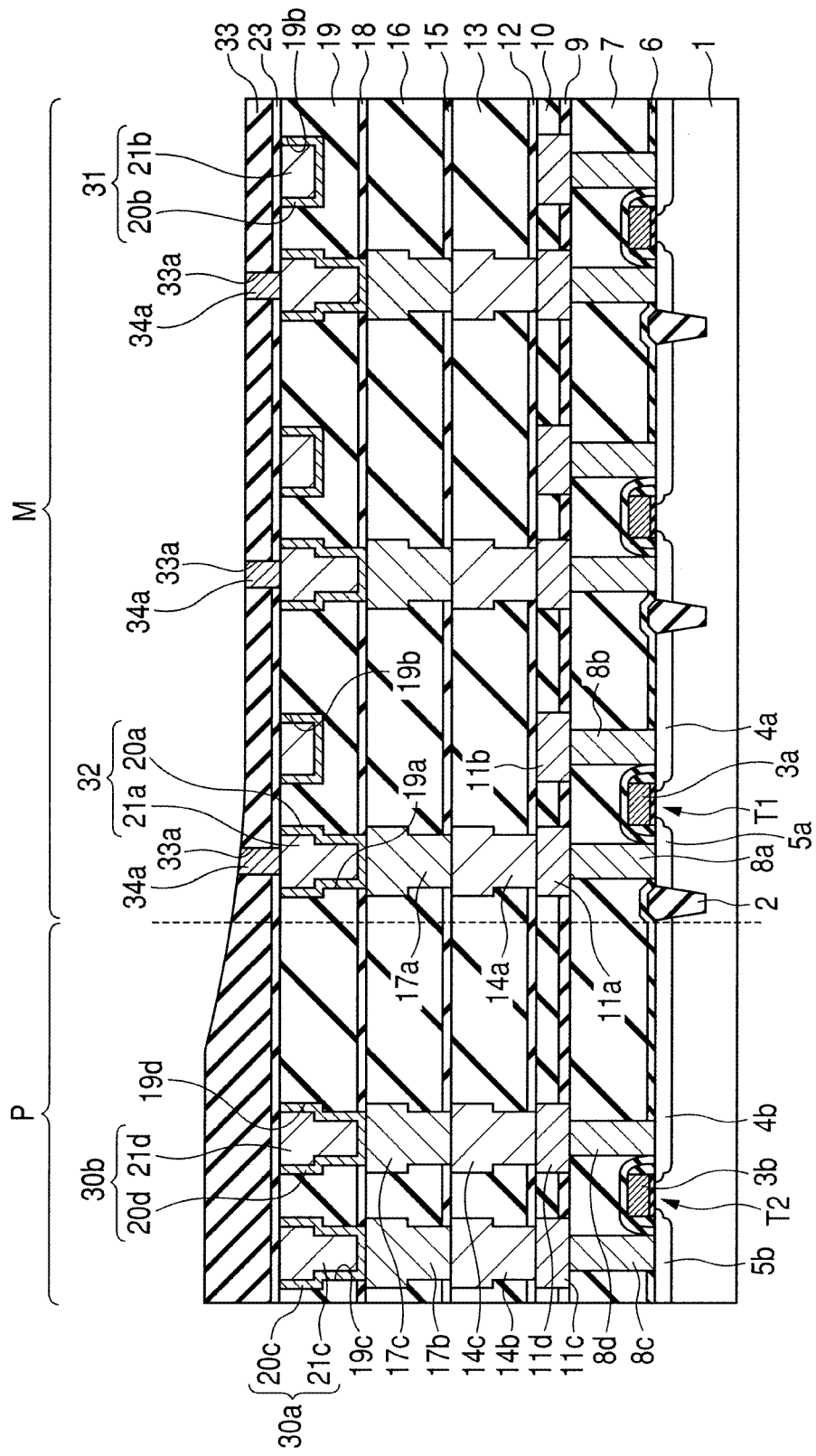
FIG. 40 is a cross-sectional view illustrating a step of a manufacturing process according to a variation of Embodiment 2.

In the method of manufacturing the semiconductor device described above, the description has been given using, as an example, the case where the conductive layers 34a as the plugs are formed by etching the conductive layer 34 (see FIG. 32). However, as shown in FIG. 40, the conductive layers 34a as the plugs may also be formed by subjecting the conductive layer 34 to a chemical mechanical polishing process. In this case, the surface of the portion of the interlayer insulating film 33 located in the memory cell region M is smoothly coupled to the surface of the portion of the interlayer insulating film 33 located in the peripheral region P. In particular, in the boundary portion between the memory cell region M and the peripheral region P, the surface of the interlayer insulating film 33 downwardly protrudes.

This reduces a membrane stress in the conductive layer 35 formed over the interlayer insulating film 33 to serve as the lead-out electrodes in the same manner as in the semiconductor device described above, and can further reduce a membrane stress in each of the layers forming the magnetic resistor elements formed over the conductive layer 35. As a result, it is possible to inhibit the breakdown of the tunnel insulating films resulting from the membrane stresses, and reduce a short circuit failure in the magnetic resistor element 51 located at the end of the memory cell region M and the like.

Figure 41:
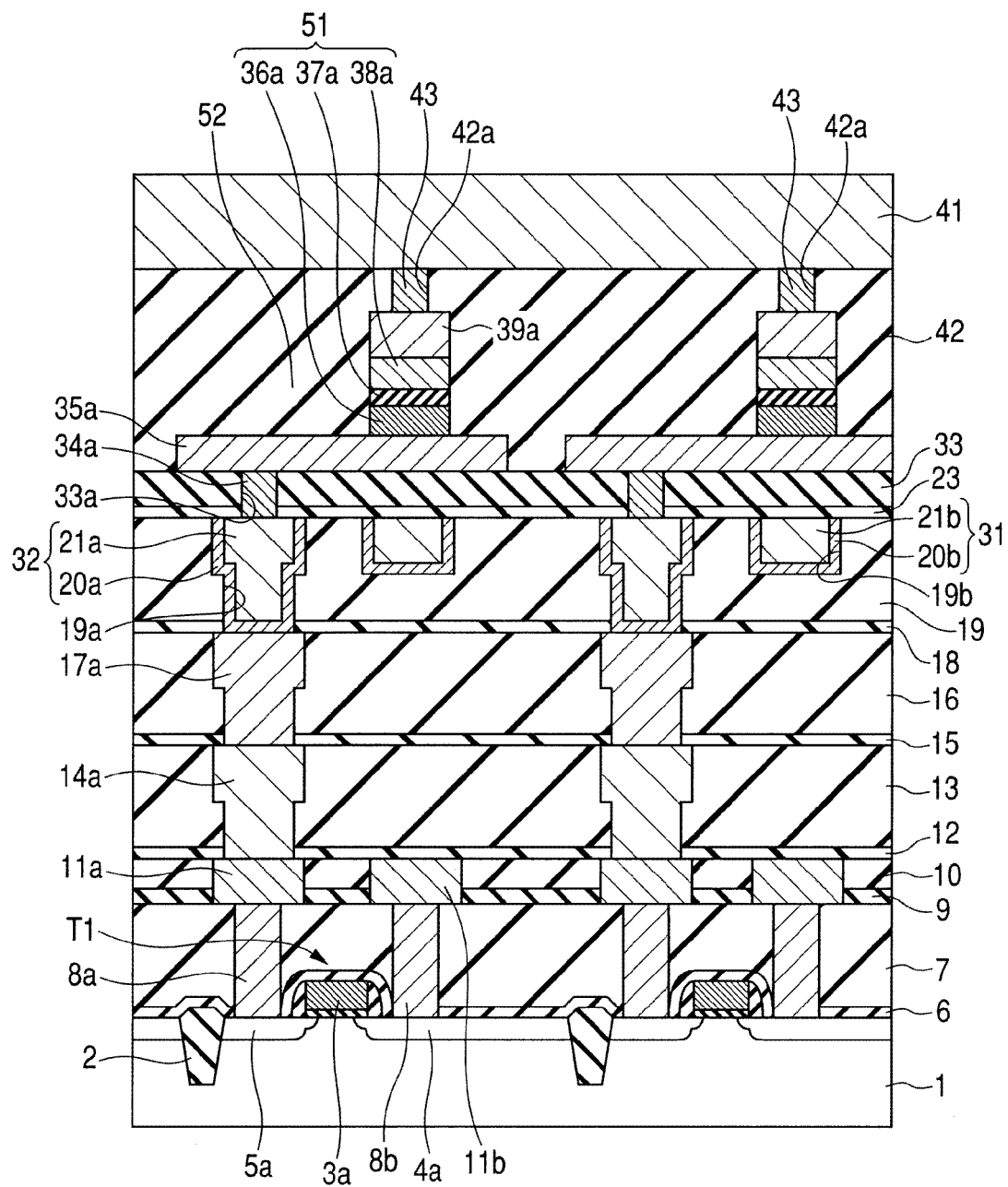
FIG. 41 is a partial cross-sectional view of a semiconductor device according to a first variation of each of the embodiments.
Figure 42:
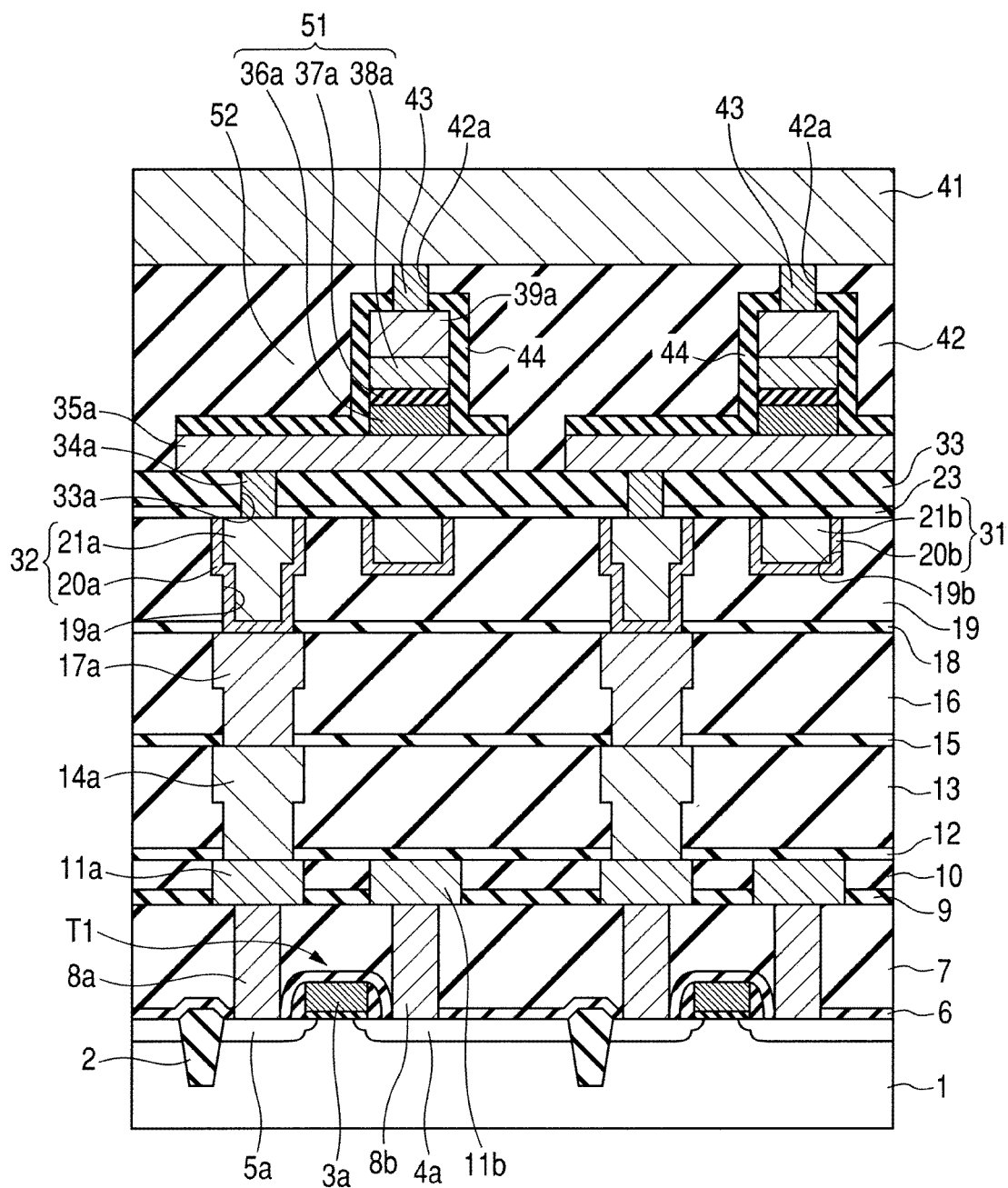
FIG. 42 is a partial cross-sectional view of a semiconductor device according to a second variation of each of the embodiments.

In each of the embodiments, the semiconductor device configured such that the bit lines are directly coupled to the cap layers has been described as an example. However, as shown in FIG. 41, the semiconductor device may also be configured such that the bit lines 41 and the cap layers 39a are electrically coupled to each other with vias 43 formed in via holes 42a in an interlayer insulating film 42 being interposed therebetween. Alternatively, as shown in FIG. 42, the semiconductor device may also be configured such that a protective film 44 such as a silicon nitride film is formed so as to cover the surfaces of the lead-out electrodes 35a and the surfaces of the magnetic resistor elements 51. Note that, in FIGS. 41 and 42, the same members as those of the semiconductor device described in each of the embodiments are provided with the same reference numerals.

Figure 43:
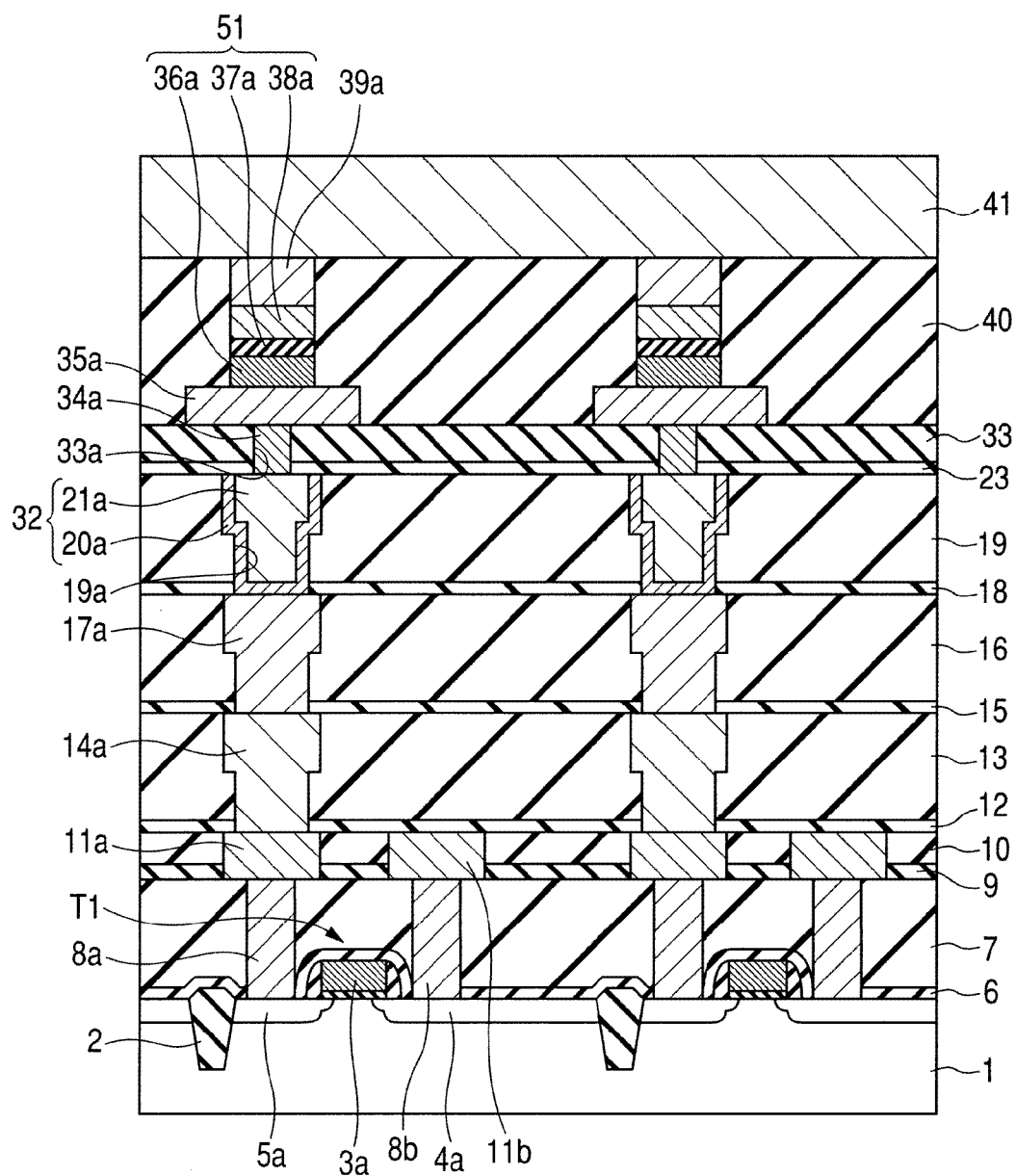
FIG. 43 is a partial cross-sectional view of a semiconductor device according to a third variation of each of the embodiments.

As the semiconductor device according to each of the embodiments, a semiconductor device has been shown which is configured such that a spin orientation in each of the magnetic resistor elements 51 located at the intersections of the bit lines 41 and the digit lines 31 is changed using a magnetic field produced by allowing respective currents to flow in the corresponding bit line 41 and the corresponding digit line 31. However, as shown in FIG. 43, the semiconductor device according to each of the embodiments may also be a semiconductor device configured such that digit lines are not provided, and the spin orientation in each of the magnetic resistor elements 51 is changed by allowing a current to flow in the magnetic resistor element 51 via the corresponding bit line 41. Since the semiconductor device does not have digit lines, the process steps can be simplified compared with the case where digit lines are provided, and the configuration is also effective for area reduction. In particular, the semiconductor device of this type is called a Spin Torque Transfer RAM (STT-RAM). Note that, in FIG. 43, the same members as those of the semiconductor device described in each of the embodiments are provided with the same reference numerals.

In each of the embodiments described above, the description has been given using, as an example, the case where the wire grooves for forming the bit lines are formed in the interlayer insulating film 40. However, the wire grooves may also be formed by forming a silicon oxynitride film covering the magnetic resistor elements 51. In this case, the silicon oxynitride film functions as an etching stopper when the wire grooves are formed. It is also possible to reduce the degradation of the magnetic resistor elements 51 due to hydrogen generated after the formation of the silicon oxynitride film using the silicon oxynitride film. A description will be given hereinbelow to a producing method thereof.

Figure 44:
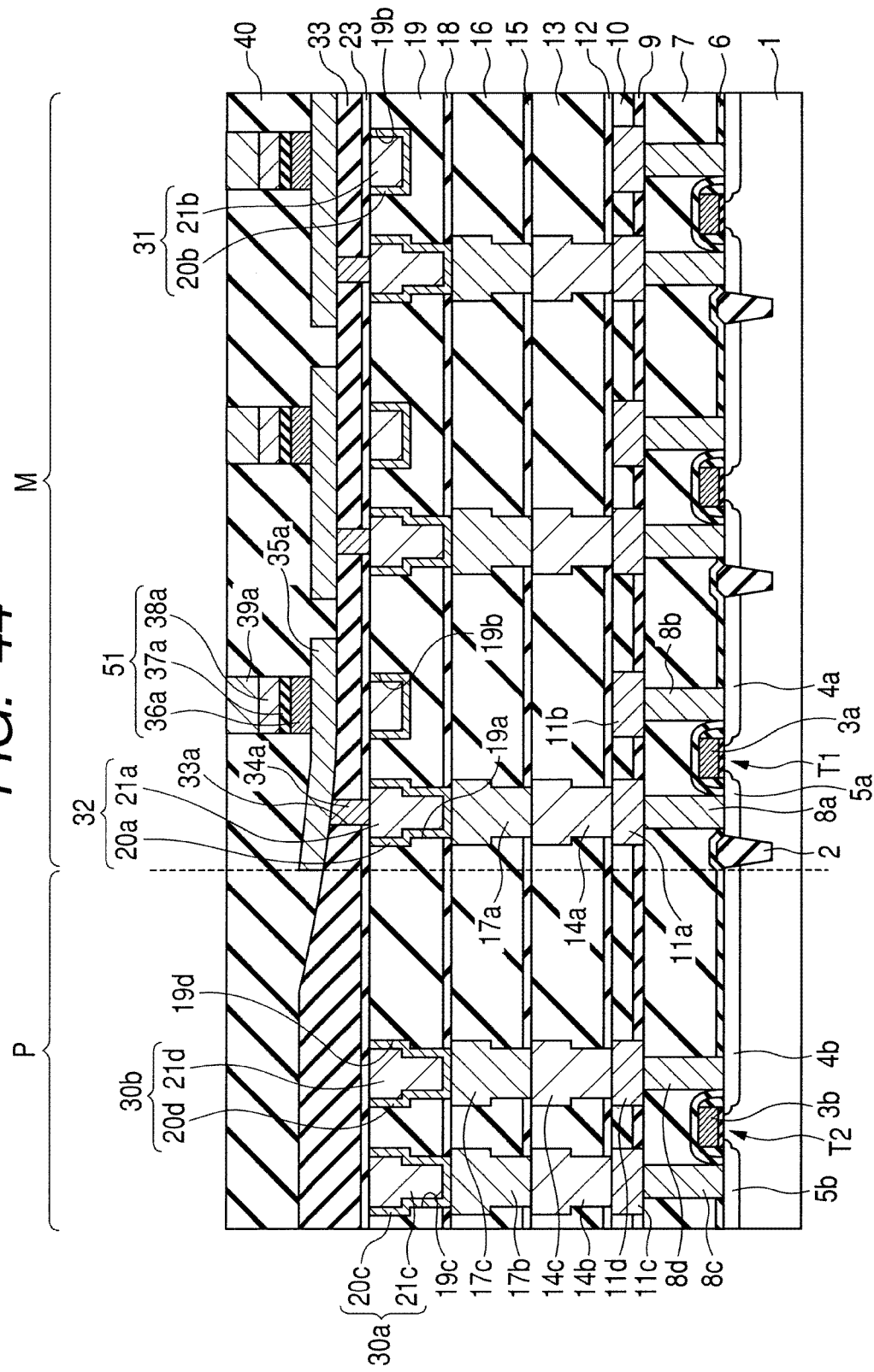
FIG. 44 is a cross-sectional view illustrating a step of a method of manufacturing a semiconductor device according to a fourth variation of each of the embodiments.

After the step shown in FIG. 10 described above, as shown in FIG. 44, the interlayer insulating film 40 is subjected to a chemical mechanical polishing process so as to expose the cap layers 39a of the magnetic memory elements 51.

Figure 45:
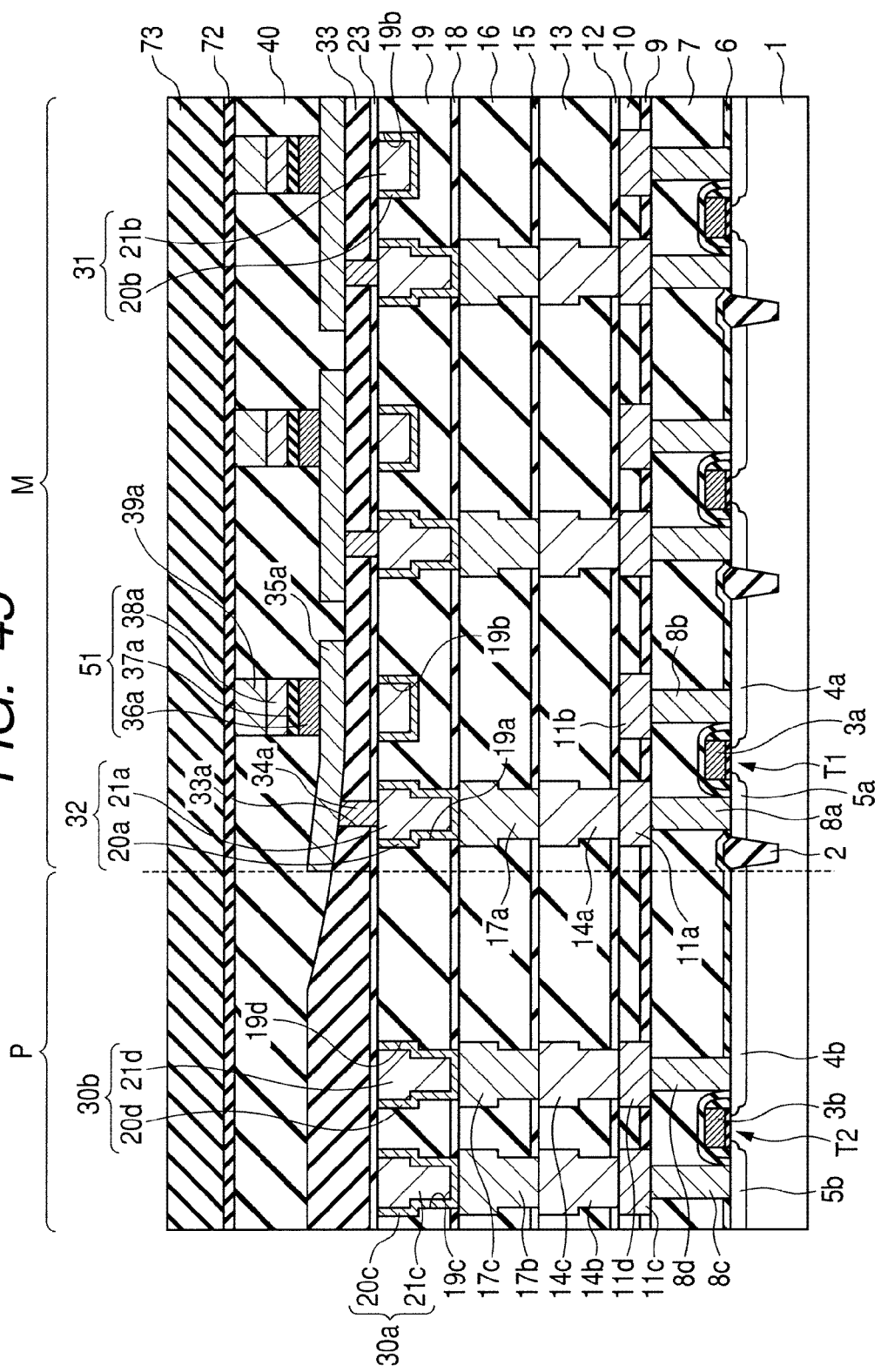
FIG. 45 is a cross-sectional view showing a step performed after the step shown in FIG. 44 in each of the embodiments.

Next, as shown in FIG. 45, a silicon oxynitride film 72 is formed over the interlayer insulating film 40 so as to cover the exposed cap layers 39a. Then, over the silicon oxynitride film 72, an interlayer insulating film 73 made of, e.g., a silicon dioxide film is formed to have a thickness larger than that of the silicon oxynitride film 72. At this time, since the silicon oxynitride film 72 is formed so as to cover the magnetic resistor elements, it is possible to prevent the degradation of the magnetic resistor elements 51 due to hydrogen generated during the formation of the interlayer insulating film 73 made of the silicon dioxide film. Moreover, since the silicon oxynitride film 72 is formed thinner than the interlayer insulating film 73, variations in film thickness when the silicon oxynitride film 72 is etched later can be reduced.

Figure 46:
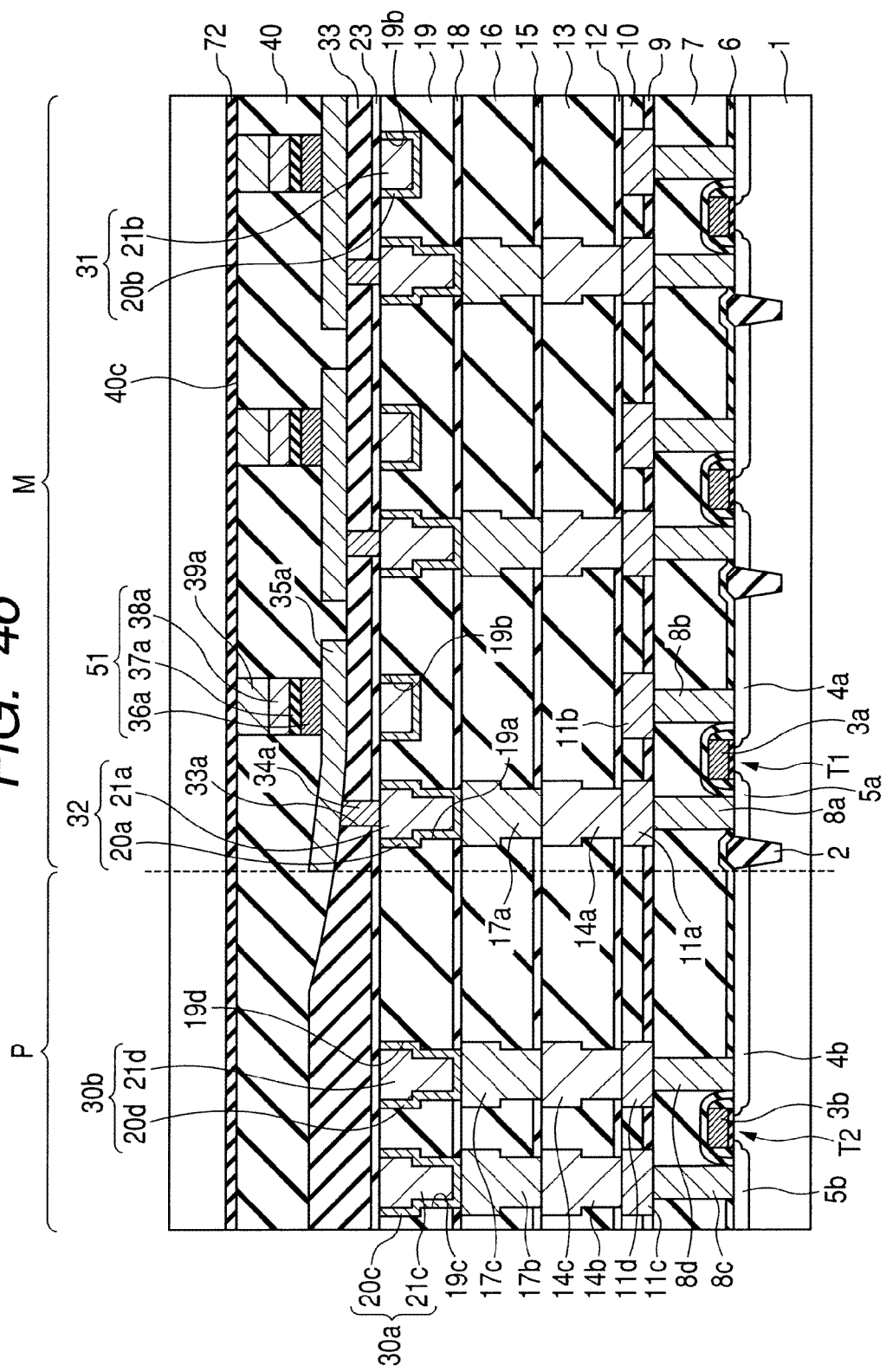
FIG. 46 is a cross-sectional view showing a step performed after the step shown in FIG. 45 in each of the embodiments.

Next, as shown in FIG. 46, a resist pattern (not shown) for forming wire grooves is formed over the interlayer insulating film 73. Using the resist pattern as a mask and using the silicon oxynitride film 72 as an etching stopper film, the interlayer insulating film 73 is etched to first form openings 40c serving as parts of the wire grooves in each of which the silicon oxynitride film 72 is exposed at the bottom surface thereof.

Figure 47:
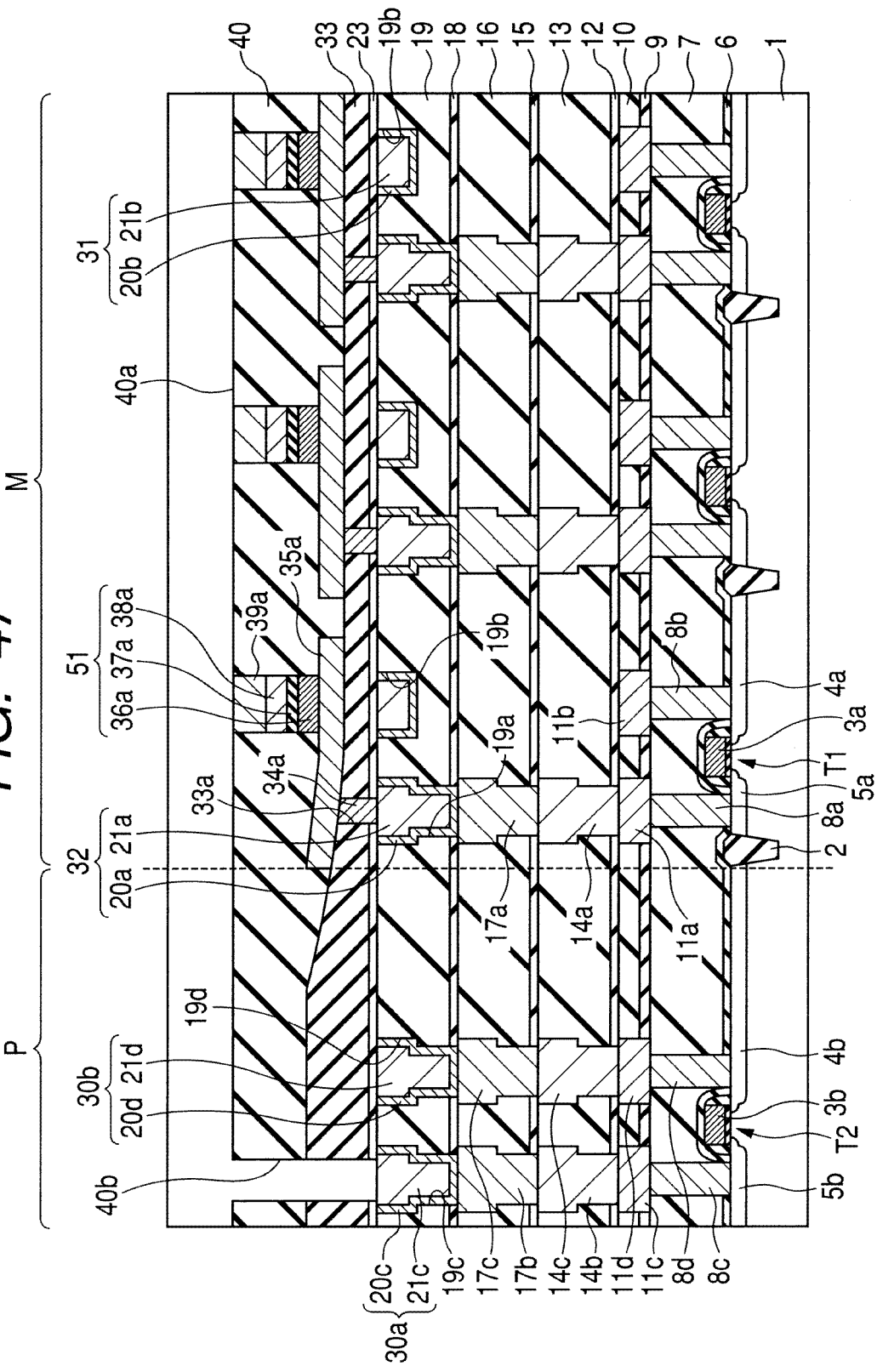
FIG. 47 is a cross-sectional view showing a step performed after the step shown in FIG. 46 in each of the embodiments.

Next, as shown in FIG. 47, in the memory cell region M, the silicon oxynitride film 72 is etched to expose the cap layers 39a. On the other hand, in the peripheral region P, the silicon oxynitride film 72, the interlayer insulating films 40 and 33, and the etching stopper film 23 are etched to expose the conductive layer 30a. In this manner, the wire grooves 40a are formed completely.

At this time, the wire grooves 40a may also be formed as follows. That is, using the resist pattern used when the interlayer insulating film 73 is etched as a mask, the respective portions of the silicon oxynitride film 72 located in the memory cell region M and in the peripheral region P are etched so that the silicon oxynitride film 72 is removed. Then, the resist pattern is removed, and a new resist pattern (not shown) is formed in the peripheral region P. Using the resist pattern as a mask, the respective portions of the interlayer insulating films 40 and 33 and the etching stopper film 23 that are located in the peripheral region P are etched so as to expose the conductive layer 30a, whereby the wire grooves 40a may be formed appropriately.

Alternatively, the wire grooves 40a may also be formed as follows. That is, a resist pattern (not shown) is formed in the peripheral region P. Using the resist pattern as a mask, the respective portions of the silicon oxynitride film 72, the interlayer insulating films 40 and 33, and the etching stopper film 23 that are located in the peripheral region P are etched to expose the conductive layers 30a. Then, a new resist pattern (not shown) is formed and, using the new resist pattern as a mask, the portion of the silicon oxynitride film 73 located in the memory cell region M is etched to expose the cap layers 39a, whereby the wire grooves 40a may be formed appropriately.

Figure 48:
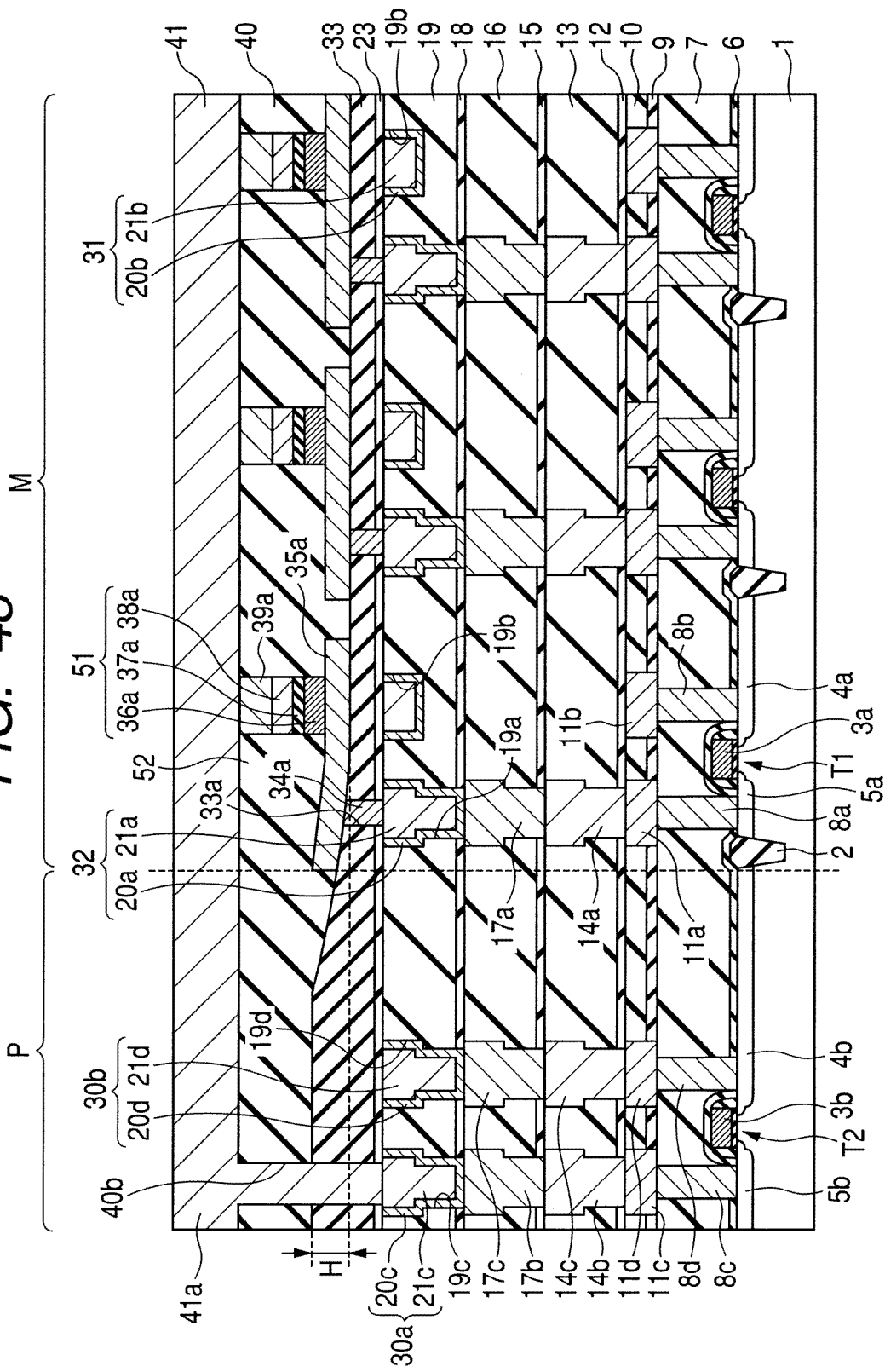
FIG. 48 is a cross-sectional view showing a step performed after the step shown in FIG. 47 in each of the embodiments.

Next, over the interlayer insulating film 40, a predetermined conductive layer (not shown) serving as bit lines and wires is formed so as to fill each of the wire grooves 40a. Then, as shown in FIG. 48, the conductive layer is subjected to a chemical mechanical polishing process so that the portion thereof located over the upper surface of the interlayer insulating film 40 is removed. As a result, the bit lines 41 are formed in the wire grooves 40a in the memory cell region M, while the wire 41a is formed in the wire groove 40a in the peripheral region P. In this manner, the main portion of the semiconductor device is formed. Note that, in FIGS. 44 to 48, the same members as those of the semiconductor device described in each of the embodiments are provided with the same reference numerals.

Figure 49:
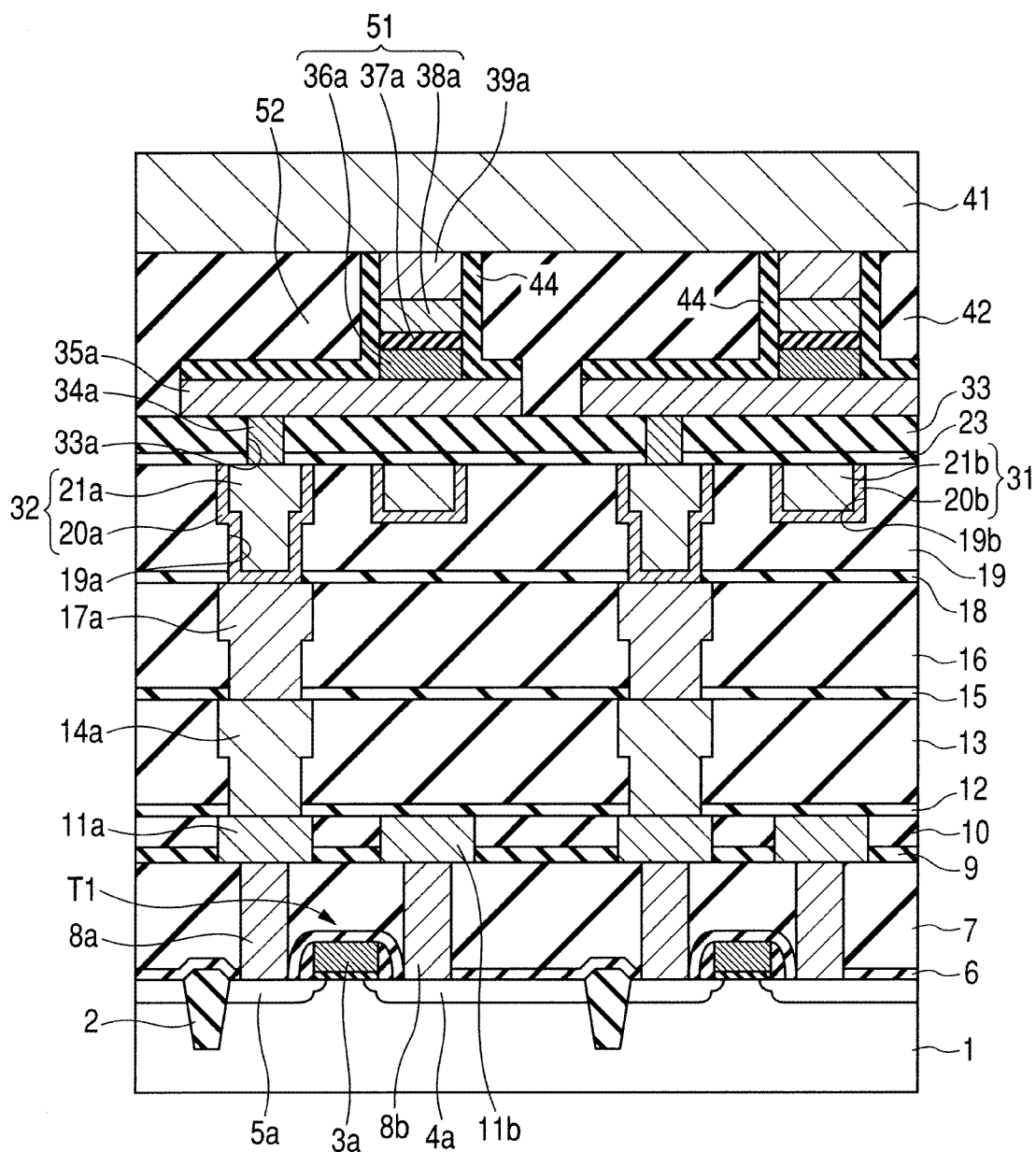
FIG. 49 is a partial cross-sectional view of a semiconductor device according to a fifth variation of each of the embodiments.

As a variation of the semiconductor device, as shown in FIG. 49, the semiconductor device may also be configured such that the protective film 44 such as a silicon nitride film or the like is formed so as to cover the respective surfaces of the lead-out electrodes 35a and the magnetic resistor elements 51, and the bit lines 41 and the cap layers 39a are directly coupled to each other. Note that, in FIG. 49, the same members as those of the semiconductor device described in each of the embodiments are provided with the same reference numerals.

The embodiments disclosed herein are illustrative, and the present invention is not limited thereto. The present invention is not defined by the scope described above but, rather by the claims and is intended to include the meanings equivalent to the claims and all the modifications within the claims.

The present invention is used effectively in a semiconductor device including a magnetic resistor element.

What is claimed is:

1. A semiconductor device, comprising:
   a first region and a second region defined in a main surface of a semiconductor substrate;
   a first insulating film formed over the semiconductor substrate so as to cover the first region and the second region;
   a plurality of first conductor formed so as to come in contact with a surface of a first portion of the first insulating film located in the first region;
   a plurality of magnetic resistor elements formed at the respective first conductor;
   a second insulating film formed over the first insulating film so as to fill a gap between the magnetic resistor elements adjacent to each other, and having first wire grooves; and
   first wires formed in the first wire grooves, and each electrically coupled to a predetermined one of the magnetic resistor elements,
   wherein a surface of the first portion of the first insulating film is at a position lower than that of a surface of a second portion of the first insulating film located in the second region.

2. A semiconductor device according to claim 1, wherein a thickness of the first portion of the first insulating film is smaller than a thickness of the second portion of the first insulating film.

3. A semiconductor device according to claim 1, wherein a thickness of a portion of the first insulating film exposed at an end surface of the semiconductor substrate after subjected to dicing is larger than the thickness of the first portion of the first insulating film.

4. A semiconductor device according to claim 1, wherein the surface of the first portion of the first insulating film is smoothly coupled to a surface of the second portion of the first insulating film.

5. A semiconductor device according to claim 1, wherein the surface of the first portion of the first insulating film is stepwise coupled to a surface of the second portion of the first insulating film.

6. A semiconductor device according to claim 1, wherein a surface of the second insulating film is at a position higher than that of an upper surface of each of the magnetic resistor elements,
   wherein openings are formed in the second insulating film to expose the magnetic resistor elements, and
   wherein second conductor electrically coupling the magnetic resistor elements and the first wires are formed in the openings.

7. A semiconductor device according to claim 1, wherein a third insulating film is formed between the second insulating film and each of the magnetic resistor elements and the corresponding one of the first conductor in such a configuration as to cover respective surfaces of the magnetic resistor element and the first conductor.

8. A semiconductor device according to claim 1, wherein each of the magnetic resistor elements is configured such that a spin orientation therein is changed by a magnetic field produced by allowing respective currents to flow in the corresponding one of the first wires and in a second wire formed below the magnetic resistor element at a distance therefrom.

9. A semiconductor device according to claim 1, wherein each of the magnetic resistor elements is configured such that a spin orientation therein is changed by a current allowed to flow in the magnetic resistor element via the corresponding one of the first wires.

10. A method of manufacturing a semiconductor device having a first region and a second region in a main surface of a semiconductor substrate, comprising the steps of:
    forming a first insulating film over the semiconductor substrate so as to cover the first region and the second region therewith;
    setting a surface of a first portion of the first insulating film located in the first region at a position lower than that of a surface of a second portion of the first insulating film located in the second region;
    forming a plurality of first conductor such that each of the first conductor comes in contact with the surface of the first portion of the first insulating film;
    forming a plurality of magnetic resistor elements such that the magnetic resistor elements come in contact with respective surfaces of the first conductor;
    forming a second insulating film over the first insulating film so as to fill a gap between the magnetic resistor elements adjacent to each other therewith;
    forming wire grooves in the second insulating film; and
    forming, in the wire grooves, predetermined wires each electrically coupled to a predetermined one of the magnetic resistor elements.

11. A method of manufacturing the semiconductor device according to claim 10,
    wherein, in the step of setting the surface of the first portion at the position lower than that of the surface of the second portion, the first insulating film is subjected to a polishing process to set the surface of the first portion at the position lower than that of the surface of the second portion.

12. A method of manufacturing the semiconductor device according to claim 10,
    wherein, in the step of setting the surface of the first portion at the position lower than that of the surface of the second portion, the first portion is subjected to anisotropic etching to set the surface of the first portion at the position lower than that of the surface of the second portion.

13. A method of manufacturing a semiconductor device having a first region and a second region in a main surface of a semiconductor substrate, comprising the steps of:
    forming a first insulating film over the semiconductor substrate so as to cover the first region and the second region therewith;
    setting a surface of a first portion of the first insulating film located in the first region at a position lower than that of a surface of a second portion of the first insulating film located in the second region;
    forming a plurality of first conductor such that each of the first conductor comes in contact with the surface of the first portion of the first insulating film;
    forming a plurality of magnetic resistor elements such that the magnetic resistor elements come in contact with respective surfaces of the first conductor;
    forming a second insulating film over the first insulating film so as to fill a gap between the magnetic resistor elements adjacent to each other therewith;
    forming a silicon oxynitride film over the second insulating film;

forming a third insulating film over the silicon oxynitride film;

forming wire grooves in each of the third insulating film and the silicon oxynitride film; and forming, in the wire grooves, predetermined wires each electrically coupled to a predetermined one of the magnetic resistor elements.

* * * * *